US007544398B1

(12) United States Patent
Chang et al.

(10) Patent No.: US 7,544,398 B1
(45) Date of Patent: Jun. 9, 2009

(54) CONTROLLED NANO-DOPING OF ULTRA THIN FILMS

(75) Inventors: Jane P. Chang, Los Angeles, CA (US); Trinh Tu Van, Portland, OR (US); Tony Chiang, Campbell, CA (US); Chandra Deshpandey, Fremont, CA (US); Karl Lesser, San Jose, CA (US)

(73) Assignee: The Regents of the Univesity of California, Los Angeles, CA (US)

( * ) Notice: Subject to any disclaimer, the term of this patent is extended or adjusted under 35 U.S.C. 154(b) by 0 days.

(21) Appl. No.: 11/411,425

(22) Filed: Apr. 26, 2006

Related U.S. Application Data

(60) Provisional application No. 60/674,800, filed on Apr. 26, 2005, provisional application No. 60/674,754, filed on Apr. 26, 2005.

(51) Int. Cl.
*H05H 1/24* (2006.01)
(52) U.S. Cl. .................... 427/537; 437/539; 117/84; 117/108
(58) Field of Classification Search .............. 427/250, 427/535, 537, 539; 117/84, 103, 108
See application file for complete search history.

(56) References Cited

U.S. PATENT DOCUMENTS

| 6,037,257 | A | 3/2000 | Chiang et al. | 438/687 |
|---|---|---|---|---|
| 6,066,892 | A | 5/2000 | Ding et al. | 257/751 |
| 6,160,315 | A | 12/2000 | Chiang et al. | 257/762 |
| 6,387,805 | B2 | 5/2002 | Ding et al. | 438/687 |
| 6,416,822 | B1 | 7/2002 | Chiang et al. | 427/561 |
| 6,428,859 | B1 | 8/2002 | Chiang et al. | 427/457 |
| 6,447,933 | B1 * | 9/2002 | Wang et al. | 428/635 |
| 6,479,389 | B1 | 11/2002 | Tsai et al. | 438/697 |
| 6,486,560 | B1 | 11/2002 | Lopatin | 257/762 |
| 6,541,353 | B1 * | 4/2003 | Sandhu et al. | 438/478 |
| 7,045,406 | B2 * | 5/2006 | Huotari et al. | 438/198 |
| 7,084,078 | B2 * | 8/2006 | Ahn et al. | 438/785 |
| 7,244,858 | B2 * | 7/2007 | Meiere | 556/58 |
| 7,416,994 | B2 * | 8/2008 | Quick | 438/762 |
| 2007/0218290 | A1 * | 9/2007 | Rajala et al. | 428/411.1 |

FOREIGN PATENT DOCUMENTS

WO    WO 2007/019435 A3 *  2/2007

OTHER PUBLICATIONS

Sharma, Pramod K., et al., "Effect of solvent, host precursor, dopant concentration and crystallite size on the fluorescence properties of Eu(III) doped yttria". Optical Materials 10 (1998) pp. 161-169.*
Paivasaari, Jani, et al., "Atomic layer deposition of rare earth oxides: erbium oxide thin films from B-diketonate and ozone precursors". Journal of Alloys and Compounds 374 (2004) pp. 124-128.*
Putkonen, Matti, et al., "Surface-controlled growth of magnesium oxide thin films by atomic layer epitaxy". Journal of Materials Chemistry, 1999, 9, pp. 2449-2452.*
Hoang, J., et al., "Optical properties of Y2O3 thin films doped with spatially controlled Er3+ by atomic layer deposition". Journal of Applied Physics 101, pp. 123116-1 to 123116-8 (2007).*
Van, Trinh Tu, et al., "Radical-enhanced atomic layer deposition of Y2O3 via a B-diketonate precursor and O radicals". Surface Science 596 (2005) pp. 1-11.*
Andry, et al., "Growth of Er-doped Silicon Using Metalorganics by Plasma-Enhanced Chemical Vapor Deposition," 1996, J. Appl. Phys., vol. 80, p. 551-558.
Aoki, et al., "ZnSe Growth by Radical Assisted MOCVD Using Hollow Cathode Plasma," 2000, Thin Solid Films, vol. 368, pp. 244-248.
Applebee, et al., "Field Screening of Waterborne Petroleum Hydrocarbons by Thickness Shear-Mode Resonator Measurements," Environ Sci. Technol., 2004, vol. 38, pp. 234-239.
Arai, et al., "Aluminum or Phosphorous Co-Doping Effects on the Fluorescence and Structural Properties of Neodynmium-Doped Silica Glass," J. Appl. Phys., 1986, vol. 59, pp. 3430-3436.
Atanassov, et al., "Optical Properties of TiO$_2$, Y$_2$O$_3$ and CeO$_2$ Thin Films Deposited by Electron Beam Evaporation," 1993, Thin Solid Films, vol. 223, p. 288-292.
Bargar, et al., Surface Complexation of Pb (II) at Oxide-Water Interfaces: I. XAFS and Bond-Valence1997, Geochimica Et Cosmochimica Acta, vol. 61, p. 2617-2619.
Bargar, et al., "XAFS and Bond-Valence Determination of the Structures and Compositions of Surface Functional Groups and Pb(ii) and Co(II) Sorption Products on Single-Crystal," 1997, J Colloid & Interface Sci., vol. 185, p. 473-492.
Blauner, et al., "Focused Ion Beam Fabrication of Submicron Gold Structures," 1989, J. Vac. Sci. Technol., vol. B7, p. 609-617.
Bourdon, et al., "Etching of a-C:H Films By An Atomic Oxygen Beam," 1993, J. Vac. Sci. Technol. A11, p. 2530-2535.
Brauers, et al., "Alternative Precursors for III-V MOVPE Criteria for Evaluation," 1991, J. Crystal Growth, vol. 107, p. 281-289.
Bykov, et al., "Mass Spectrometric Study of Gas-Phase Thermal Stability of Yttrium (III) Tris(Dipivaloylmethanate)," 1992, J. Thermal Anal., vol. 38, p. 1477-1486.
Chambers, et al., "Effects of Surface Pretreatments on Interface Structure During Formation of Ultra-Thin Yttrium Silicate Dielectric Films on Silicon," 2001, Appl. Surf. Sci., vol. 181, p. 78-93.
Chang, et al., "Enhancement of Titanium Nitride Barrier Metal Properties by Nitrogen Radical Assisted Metalorganic Chemical Vapor Deposition," 1996, Appl. Phys. Lett., vol. 68, p. 2580-2582.

(Continued)

*Primary Examiner*—Bret Chen
(74) *Attorney, Agent, or Firm*—Ballard Spahr Andrews & Ingersoll, LLP

(57) ABSTRACT

The invention relates to methods for producing doped thin layers on substrates comprising the steps of depositing a dopant precursor on the substrate via an atomic layer deposition technique; and exposing the deposited dopant precursor to radicals. The methods can further comprise depositing a compound adjacent the dopant metal via an atomic layer deposition technique; and exposing the deposited compound to radicals, thereby providing a host. The invention relates to articles comprising approximately atomically thin layers of metals or metal oxides doped with at least one different metal or metal oxide. This abstract is intended as a scanning tool for purposes of searching in the particular art and is not intended to be limiting of the present invention.

25 Claims, 20 Drawing Sheets

OTHER PUBLICATIONS

Chang, et al., "Optical Spectra, Energy Levels, and Crystal-Field Analysis of Tripositive Rare Earth Ions in Y2O3. I Kramers Ions in C2 Sites," 1982, J. Chem. Phys., vol. 76, p. 3877-3899.

Chang, et al., "Kinetic Study of Low Energy Ion-Enhanced Polysilicon Etching Using Cl, Cl2, and Cl Beam Scattering," 1997, J. Vac. Sci. Technol., vol. A15, p. 610-615.

Chiang, et al., "Ion-induced Chemical Vapor Deposition of High Purity Cu Films at Room Temperature Using a Microwave Discharge H Atom Beam Source," 1997, J. Vac. Sci. Technol. A 15(5). p. 2677-2686.

Cho, et al., "Remote Plasma-Assisted Metal Organic Chemical Vapor Deposition of Tantalum Nitride Thin Films With Different Radicals," 1998, Jpn. J. Appl. Phys., Part 1, vol. 37, p. 6502-6505.

Cho, et al., "Origin and Effect of Impurity Incorporation in Plasma-Enhanced ZrO2, 2003," 2003, J. Appl. Phys., vol. 93, p. 9345-9351.

CRC Handbook of Chemistry and Physics, $3^{rd}$ Edition, CRC Press, Boca Raton, FL, 2001, Chap. 12, p. 14-16.

Cvetanovic, "Evaluated Chemical Kinetic Data for the Reactions of Atomic Oxygen $O(^3P)$ with Unsaturated Hydrocarbons,"1987, J. Phys. Chem. Ref. Data, vol. 16, pp. 261-267.

D'Acapito, et al., "Local Environment of Rare-Earth Dopants in Silica-Titania-Alumina Glasses: An Extended X-ray Absorption Fine Structure Study at the K Edges of Er and Yb," Appl. Phys. Lett., 2001, vol. 78, p. 2676-2678.

D'Acapito, "Structure of Er-O Complexes in Crystalline Si," 2004, Physical Review, vol. 69, p. 153310-1-153310-4.

Desurvire, "Erbium-Doped Fiber Amplifiers: Principles and Applications," 1994, John Wiley & Sons, Inc., New York, Chap. 4, p. 291-305.

Dexpert-Ghys, et al., "Laser-Induced Polarized Fluorescence in Cubic Yttrium Sesquioxide Doped With Trivalent Europium," 1979, Phys. Rev. vol. B20, p. 10-20.

Dimoulas, et al., "Direct Heteroepitaxy of Crystalline Y2O3 on Si (001) for High-K Gage Dielectric Applications," 2001, J. Appl. Phys., vol. 90, pp. 4224-4230.

Eaglesham, et al., "Microstructure of Erbium-Implanted Si," 1991, Appl. Phys. Lett., vol. 58, p. 2797-2799.

Elam, et al., "Viscous Flow Reactor with Quartz Crystal Microbalance for Thin Film Growth by Atomic Layer," 2002, Rev. Sci. Instrum., vol. 73, p. 2981-2987.

Fahlman, "Substituent Effects on the Volatility of Metal β-Diketonates," 2000, Adv. Mater. Opt. Electron, vol. 10, p. 223-232.

Faucher, et al., "Refinement of the Y2O3 Structure at 77K," 1980, Acta Cryst., vol. B36, p. 3209-3211.

Folkendt, et al., "Gas-Phase 1H NMR Studies of Keto-Enol Tautomerism of Acetylacetone, Methyl Acetonate, Ethyl Acetoacetate, and Ethyl Acetonate," 1985, J. Phys. Chem., vol. 89, p. 3347-3352.

Forslund, et al., "In Situ Weight Gain Rates on Copper During Outdoor Exposures," 1997, J. Electrochem. Soc., vol. 144, p. 113-120.

Fujimoto, et al., "How Fast Elements Can Effect Slow Dynamics," 2003, Physica D, vol. 180, p. 1-16.

Gamo, et al., "Ion Beam Assisted Deposition of Metal Organic Films Using Focused Ion Beams," 1984, Jpn. J. Appl. Phys., Part 1, vol. 23, p. L923-L295.

Giera, "Standard Molar Enthalpies of Formation of Eight Lanthanide(III) 2,26,6-Tetramethyl-3, 5-Heptanedeione Chelates in the Crystalline and Gaseous State: Mean LN-O Bond Dissociation Enthalpies," 2000, J. Chem. Thermodynamics, vol. 32, p. 821-833.

Gusev, et al., "Ultrathin High-K Metal Oxides on Silicon: Processing, Characterization and Integration Issues," 2001, Microelectron Eng., vol. 59, p. 341-349.

Hanic, et al., "Real Structure of Undoped $Y_2O_3$ Single Crystals," 1984, Acta Cryst., vol. B40, p. 76-82.

Hattori, et al., "Erbium-Doped Silica-Based Waveguide Amplifier Integrated with a 980/1530nm WDM Coupler." 1994, Electron Lett. 30, p. 856-857.

Hatanpää, et al., Properties of [Mg2(thd)4] as a Precursor for Atomic Layer Deposition of MgO Thin Films and Crystal Structures of [Mg2(thd)4] and [Mg(thd)2] 1999, Chem. Mater., vol. 11, p. 1846-1852.

Hill, et al., "Properties of Oxidized Silicon as Determined by Angular-Dependent X-Ray Photoelectron Spectroscopy," 1976, Chem. Phys. Lett., vol. 44, p. 225-231.

Hirata, et al., "Physical Properties of Y2O3: Eu luminescent Films Grown by MOCVD and Laser Ablation," 1997, Applied Surface Science, vol. 113/114, p. 509-514.

Hoekstra, et al., "Nonlinear Refractive Index of Erbium-Doped Y2O3 Integrated-Optical Waveguides," 1993, Optics Letters 18, p. 1718-1720.

Hoekstra, et al., "Sputter-Deposited Erbium-Doped Y2O3: Active Optical Waveguides," 1993, Electronics Letters 29, p. 581-583.

Huignard, et al., "Growth by Laser Ablation of Y2O3 and Tm: Y2O3 Thin Films For Optical Applications," 2000, J. Mater. Chem., vol. 10, p. 549-554.

Joshi, et al., "Metal Chelates of Fluorinated 1,3-Diketones and Related Compounds," 1977, Coord. Chem. Rev. 22, p. 37-122.

Kang, et al., "The Effectiveness of Ta Prepared by Ion-Assisted Deposition As a Diffusion Barrier Between Copper and Silicon," 1997, J. Electrochem. Soc., vol. 144, pp. 1807-1812.

Kasi, et al., "Preoxidation Si Cleaning and Its Impact on Metal Oxide Semiconductor Characteristics," 1992, J. Vac. Sci. Technol. vol. A10, p. 795-801.

Kenyon, et al., "Luminescence From Erbium-Doped Silicon Nanocrystals in Silica: Excitation Mechanisms," 2002, Journal of Applied Physics, vol. 91, p. 367-374.

Kik, et al., "Exciton-Erbium Interactions in Si Nanocrystal-Doped," 2000, J. Appl. Phys., vol. 88, pp. 1992-1998.

Koleshko, et al., "Properties of Rare Earth Oxide Films," 1979, Thin Solid Films, vol. 62, p. 1-4.

Kosola, et al., "Effect of Annealing in Processing of Stronitium Titanate Thin Films by ALD," 2003, Applied Surface Science, vol. 211, p. 102-112.

Kozanecki, et al., "Evidence of Interstitial Locations of Er Atoms Implanted Into Silicon," 1995, Appl. Phys. Lett/67 913, pp. 1847-1849.

Lu, et al., "Luminescence of Erbium-Implanted Dielectric Films," 2003, Thin Solid Films, vol. 425, p. 171-174.

Manchanda, et al., "Yttrium Oxide/Silicon Dioxide: A New Dielectric Structure for VLSI/ULSI Circuits," 1988, IEEE Electron Device Lett., vol. 9, p. 180-182.

Marcus, et al., "Local Structure Around Er in Silica and Sodium Silicate Glasses," 1991, J. Non-Cryst. Solids, vol. 136, p. 260-265.

Mathew, et al., "Sub-100 nm MOSFET Fabrication with Low Temperature Resist Trimming Process," 2004, Thin Solid Films, p. 462-463.

Matsuura, et al., "EXAFS Debye-Waller Factors of La and NI in LaNi5," 2005, J. Alloys & Compounds, vol. 390, p. 31-34.

Maurizio, et al., "Site of Er Ions in Er-Implanted Silica Containing Si Nanoclusters," 2005, Optical Materials, vol. 27, p. 900-903.

Michel, et al., "Impurity Enhancement of the 1.54-µm $Er^{3+}$+Luminescence in Silicon," 1991, J. Appl. Phys., vol. 70, p. 2672-2678.

Miida, et al., "Locally Modulated Structures of Fluorite-Related $Y_2O_3$-$Nb_2O_5$ Solid Solutions," 1997, J. Appl. Cryst., vol. 30, p. 272-279.

Mikhelashvili, et al., "Structural Properties and Electrical Characteristics of Electron-Beam Gun Evaporated Erbium Oxide Films," 2002, Appl. Phys. Lett., vol. 80, pp. 2156-2158.

Mitric, et al., Structure and Microstructure of $Sm_xY_{2-x}O_3$ 1997, Solid State Ionics, vol. 101, p. 495-501.

Miyahista, et al., "Incorporation Kinetics of Rare-Earth Elements in Si During Molecular Beam Epitaxy," 1995. Appl. Phys. Lett., vol. 67, p. 235-237.

Mölsä, et al., "Growth of Yttrium Oxide Thin Films From β-Diketonate Precursor,"1994, Adv. Mater Opt. Electron, vol. 4, p. 389-400.

Moon, et al., "Ultraviolet-Ozone Jet Cleaning Process of Organic Surface Contamination Layers," 1999, J. Vac. Sci. Technol., A17, p. 150-154.

Mountjoy, et al., "A Rare Earth L3-Edge EXAFS and Li-edge XANES Study of Ce, Nd and Eu Phosphate Glasses and Crystals in the Composition Range from Metaphosphate to Ultraphosphate," 2001, J. Non-Cryst. Solids, vol. 279, p. 20-27.

Ngo, et al., "O Atom Etching of Graphite in Low Earth Orbit," 1994, Surface Science, vol. 314, p. L817-L822.

Niinistö, et al., "Advanced Electronic and Optoelectronic Materials by Atomic Layer Deposition: An Overview With Special Emphasis on Recent Progress in Processing of High-K Dielectrics and Other Oxide Materials," 2004, Phys. Stat. Sol. (a) 201, p. 1443-1452.

Nilsen, et al., "Effect of Magnetic Field on the Growth of $\alpha$-$Fe_2O_3$ Thin Films by Atomic Layer Deposition," 2004, Applied Surface Science, vol. 227, p. 40-47.

Niraula, et al., "Growth and Doping Studies of CdTe Epilayers on GaAs Substrates by Low-Pressure Plasma-Radical-Assisted Metalorganic Chemical Vapor Deposition," 1999, J. Crystal Growth, vol. 200, p. 90-95.

Niu, et al., "Chemical, Physical, and Electrical Characterizations of Oxygen Plasma Assisted Chemical Vapor Deposited Yttrium Oxide on Silicon,"2003, Journal of the Electrochemical Society, 150, F102-F109.

Norton, "Capacitance-Voltage Measurements on Ultrathin Gate Dielectric," 2003, Solid-State Electronics, vol. 47, p. 801-805.

Ong, "On The Kinetics of Oxidation Graphite," 1964, Carbon, vol. 2, p. 281-297.

Päiväsaari, et al., "A Comparative Study on Lanthanide Oxide Thin Films Grown by Atomic Layer Deposition," 2005, Thin Solid Films, vol. 472, p. 275-281.

Pal, et al., "Gs2O3, Ga2O3 (Gd2O3 and Ga2O3, as High-K-Gage Dielectrics on SiGe: A Comparative Study," 2001, J. Appl. Phys. vol. 90, p. 4103-4107.

Pavesi, "Will Silicon Be the Photonic Material of Third Millennium", 2003, J. Phys. Condens. Matter, vol. 15, p. R1169-1196.

Pennings, et al., "Low-Loss Bends in Planar Optical Ridge Waveguides," 1988, Electron Lett. vol. 24, p. 998-999.

Phillips, et al., "Spectroscopic and Lasing Properties of Er3+:Yb3+-doped Fluoride Phosphate Glasses," 2001, Appl. Phys., vol. B72, p. 399-405.

Polman, et al., "Broadband Sensitizers for Erbium-Doped Planar Optical Amplifiers: Review," 2004, J. Opt. Soc. Am., vol. B21, p. 871-892.

Polman, et al., "Erbium Implanted Thin Film Photonic Materials," 1997, Appl. Phys. Rev. 82, p. 1-39.

Puthenkovilakam, et al., "Valence Band Structure and Band Alignment at the ZrO2/Si Interface," 2004, Appl. Phys. Lett. 84, p. 1353-1355.

Puthenkovilakam, et al., "An Accurate Determination of Barrier Heights at the HfO2/Si Interfaces," 2004, J. Appl. Phys. vol. 96, p. 2701-2707.

Putkonen, et al., "Low Temperature ALE Deposition of Y2O3 Thin Films from $\beta$-Diketonate Precursors," 2001, Chem. Vap. Deposition 7, p. 44-50.

Puurunen, "Growth Per Cycle in Atomic Layer: Deposition: A Theoretical Model," 2003, Chem. Vap. Deposition 9, p. 249-257.

Rahtu, et al., "In Situ Quartz Crystal Microbalance and Quadrupole Mass Spectrometry Studies of Atomic Layer Deposition of Aluminum Oxide from Trimethylaluminum Water," 2001, Langmuir, vol. 17, p. 6505-6509.

Ran, et al., "Room-Temperature 1.54mm Electroluminescence From Er-Doped Silicon-Rich Oxide Films Deposited on n+-Si by Magnetron Sputtering," 2001, J. Appl. Phys. vol. 90, p. 11, p. 5835-5387.

Robertson, "Band Structures and Offsets of High K Dielectrics on Si," 2002, Appl. Surf. Sci. vol. 190, p. 2-10.

Roberts, et al., "The Photoluminescence of Erbium-Doped Silicon Monoxide," 1996, Optical Materials, vol. 6, p. 99-102.

Rocklein, et al., "Temperature-induced Apparent Mass Changes Observed During Quartz Crystal Microbalance Measurements of Atomic Layer Deposition," 2003, Analytical Chemistry, vol. 75, p. 4975-4982.

Rogers, et al., "Erbium-doped Silicon Films Grown by Plasma-Enhanced Chemical-Vapor Deposition," 1995, J. Appl. Phys., vol. 78, p. 6241-6248.

Saiki, et al., "Structural Change of C-Rare Earth Sesquioxides Yb2O3 and Er2O3 as a Function of Temperature," Ceramic Association of Japan, vol. 93, p. 649-654.

Santos, et al., "Thermochemistry of 2,2,6,6-Tetramethyl-3,5-Heptanedione Chelates of Lanthanide Group Elements," 1999, Polydedron, vol. 18, p. 969-977.

Santos, et al., "Thermochemical Studies of 2,2,6,6-Tetramethyl-3,5-Heptanedione Chelates of Scandium Group Elements," 1997, J. Chem Thermodynamics, vol. 29, p. 661-668.

Sauerbrey, "Verwendung Von Schwingquarzen Wägung Dünner Schichten und zur Mikrowägung,"1959, Z. Phys., vol. 155, p. 206-222.

Seim, et al. "Growth of LaCoO3 Thin Films from—Diketonate Precursors," 1997, Applied Surface Science, vol. 112, p. 243-250.

Singh, et al., "Structural and Electrical Characterization of Erbium Oxide Films Grown on Si(100) by Low-Pressure Metalorganic," 2003, Appl. Phys. Lett., vol. 83, p. 2889-2891.

Stern, Theory of EXAFS, X-ray Absorption: Principles, Applications, and Techniques of EXAFS, SEXAFS, and XANES, edited by D.C. Koningsterger and R. Prins, Wiley, 1988, p. 3-51.

Stewart, et al., "Focused Ion Beam Induced Deposition of Tungsten on Vertical Sidewalls," 1991, J. Vac. Sci. Technol. B9, p. 2670-2674.

Tanner, et al., "Assignment of Electronic Transitions and Electron-Phonon Coupling of Er3+ Doped Into Y2O3," 2004, J. Phys. Chem A 108, p. 11521-11525.

Tao, et al., "Focused Ion Beam Induced Deposition of Platinum for Repair Processes," 1991, J. Vac. Sci. Technol. B9, p. 162-164.

Torres, et al., "Interaction of Chlorine Radicals with Polyethylene and Hydrocarbon Thin Films Under Vacuum Conditions-A Comparison with Atomic Oxygen Reactivity." 2003, Surface Science, vol. 543, p. 75-86.

Torres, et al., "Radical Reactions with Organic Thin Films: Chemical Interaction of Atomic Oxygen with an X-ray Modified Self-Assembled Monolayer," 2002, J. Phys. Chem. vol. 106, p. 6265-6272.

Tsutsumi, "Dielectric Properties of $Y_2O_3$ Thin Films Prepared by Vacuum Evaoporation," 1970, J. Appl. Phys., vol. 9, p. 735-739.

Turgambaeva, et al., 1999, Journal De Physique IV—Proceedings, Barcelone, Spain, Pr8-65, edited by A. Figueras EDP Sciences, France, Pr8-65-Pr8-72.

Ulrich, et al., "Bonding and Structure of Ultrathin Yttrium Oxide Films for Si Field Effect Transistor Gate Dielectric Application," 2003, J. Vac. Sci. Technol. B21, 1792-1797.

Van, et al., "Surface Reaction Kinetics of Metal $\beta$-Diketonate Precursors with O Radicals in Radical-Enhanced Atomic Layer Deposition of Metal Oxides," 2005, J. Appl. Phys., vol. 246, p. 250-261.

Van, et al., "Controlled Erbium Incorporation and Photoluminescence of Er-Doped Y2O3," 2005, Surf. Sci. In. Press, vol. 596, p. 1-11.

Van, et al., "Radical Enhanced Atomic Layer Deposition of Y2O3 Via a $\beta$-Diketonate Precursor and O Radicals," 2005, Applied Physics Letters, vol. 87, pp. 011907-1-011907-3.

Vig, "UV/Ozone Cleaning of Surfaces," 1985, J. Vac. Sci. Technol. A-3, p. 1027-1034.

Wagner, et al., 1979, Handbook of X-Ray Photoelectron Spectroscopy (Perkin-Elmer, Eden Prairie, MN) p. 98-99.

Wajid, "Improving the Accuracy of a Quartz Crystal Microbalance with Automatic Determination of Acoustic Impedance Ratio," 1991, Rev. Sci. Instrum., vol. 62, p. 2026-2033.

Weerden, et al., Proceedings ECIO'97, 169, Opt. Soc. America, Washington, DC, (1997), 169-172.

Wei, et al., "Gases Absorption on Single-Walled Carbon Nanotubes Measured by Piezoelectric Quartz Crystal Microbalance," 2003, Mater. chem. Phys., vol. 81, p. 126-133.

Wilk, et al., "High-K-Gate Dielectrics: Current Status and Materials Properties Considerations," 2001, J. Appl. Phys. vol. 89, Issue 10, p. 5243-5263.

Zhang, et al., "Reactive and Inelastic Scattering Dynamics of Hyperthermal Oxygen Atoms on a Saturated Hydrocarbon Surface," 2002, J. Chem. Phys., vol. 117, No. 13, p. 6239-6251.

Zhang, et al., "Yttrium Oxide Films Prepared by Pulsed Laser Deposition," 1998, J. Appl. Phys., vol. 83, p. 3842-3848.

Van, et al., "Radical-Enhanced Atomic Layer Deposition of Pure & Er-Dolped $Y_2O_3$ Thin Films," University of California Department of Chemical Engineering, 2004, AIChE Annual Meeting, Austin, Texas.

Van, et al., "Real-time Kinetic Studies of β-Diketonate Precursors in Atomic Layer Deposition of Metal Oxides," 2004, Surface Science, University of California Department of Chemical Engineering.

Van et al., "Er coordination in $Y_2O_3$ thin films studied by extended x-ray absorption fine sturcture," Journal of Applied Physics, 100, 023115 (2006).

Van et al., "Nanostructure and temperature-dependent photoluminescence of Er-doped $Y_2O_3$ thin films for micro-optoelectronic integrated circuits," Journal of Applied Physics 100, 073512 (2006).

* cited by examiner (a)

(b)

$M$ = Er, Y (c)

(a)

(b)

(a)

(b)

(a)

(b)

(a)

(b)

CONTROLLED NANO-DOPING OF ULTRA THIN FILMS

CROSS REFERENCE TO RELATED APPLICATIONS

This application claims the benefit of U.S. Application No. 60/674,754, filed Apr. 26, 2005 and U.S. Application No. 60/674,800, filed Apr. 26, 2005, which are both hereby incorporated herein by reference in their entireties.

ACKNOWLEDGEMENT

This invention was made with government support under Grants Nos. DMII-0317449, CTS-9985511, and CTS-0317449 awarded by the National Science Foundation and a Young Investigator Award awarded by the Office of Naval Research. The government can have certain rights in the invention.

BACKGROUND

Methods are known whereby copper and small amounts of an alloying metal, such as magnesium or aluminum, are co-sputtered onto a substrate having oxide on at least a portion of its surface (See, e.g., U.S. Pat. No. 6,037,257 and U.S. Pat. No. 6,160,315). Either the wafer is held at an elevated temperature during deposition or the sputtered film is annealed without the wafer being exposed to atmosphere. Due to the high temperature, the alloying metal diffuses to the surface. If a surface is exposed to a low partial pressure of oxygen or contacts silicon dioxide, the magnesium or aluminum forms a thin stable oxide. The alloying metal oxide encapsulates the copper layer to provide a barrier against copper migration, to form an adhesion layer over silicon dioxide, and to act as a seed layer for the later growth of copper, for example by electroplating.

Likewise, U.S. Pat. No. 6,066,892 and U.S. Pat. No. 6,387,805 describe methods whereby a Cu-Mg or Cu-Al alloy is sputter deposited and used as a superior wetting or seed layer prior to the deposition of a substantially pure copper layer.

U.S. Pat. No. 6,479,389 describes variants of the above methods whereby sputtering or physical vapor deposition (PVD) of a copper alloy film is then followed by chemical vapor deposition (CVD) or electrochemical deposition (ECD) of a pure copper film. In another variant, CVD or ECD deposition of a pure copper film is then followed by the sputter deposition of a copper alloy film. For both embodiments, a separate thermal treatment is used to improve the copper alloy formation and to enhance the corrosion resistance and electromigration resistance of the resulting copper alloy.

Such conventional methods have significant drawbacks in that sputtering is a non-conformal process so that varying thicknesses of the alloying element containing copper are deposited inside high aspect ratio (ratio of feature height to feature width) trenches and vias. This can make it very difficult to uniformly introduce a dopant and can lead to uneven distributions of the alloying element within patterned features. Although the composition of the alloying element can be well controlled in the sputter target source material, once sputtering takes place, the concentration of the alloying element becomes difficult to control inside high aspect ratio features since sputtering is a line of sight process and the various constituents of the target source material can have differential sputter rates. Too high a concentration can lead to high film resistivities, whereas too low a concentration can prevent the beneficial aspects of the alloying element. In addition, the conventional processes typically require substantial thermal budget, which is not preferred when used in conjunction with low dielectric constant (i.e., low-k materials) especially when the dielectric constant is <3.0 due to the temperature stability constraints of these low-k materials.

In U.S. Pat. No. 6,486,560, Lopatin describes a method for reducing electromigration in copper by forming an interim layer of calcium-doped copper seed layer in a chemical solution. This method requires the treatment of a pre-deposited Cu seed layer in a chemical solution to form a Cu-Ca-X layer on the Cu seed layer wherein X is a contaminant. A thermal anneal and/or plasma treatment is subsequently required to reduce the contaminant levels and to form the desired Cu-Ca alloy on the surface of the Cu. Although a conformal doped film can be formed using this methodology, the same chemical bath used to introduce the Ca alloying element can also introduce contaminants detrimental to copper interconnects. The typical contaminants incorporated in the chemically treated film include carbon (C), sulphur (S), and oxygen (O) arising from the chemical solution. These contaminants can cause an increase in film resistivity and also lead to poor adhesion.

Accordingly, methods for thin film deposition that can deposit conformal films with controlled, uniform doping levels within high aspect ratio features at low deposition temperatures without the simultaneous introduction of unwanted contaminants are desirable. It is also desirable to be able to dope in controlled amounts at an atomistic scale. Therefore, despite conventional deposition techniques, there remains a need for methods and compositions that overcome the deficiencies of conventional deposition processes.

SUMMARY

Disclosed are articles comprising approximately atomically thin layers comprising one or more of Cu, Al, W, Ti, Ta, Mg, Mn, Ca, Cd, Hg, Ni, Sr, or Zn doped with at least one different metal comprising Cu, Al, W, Ti, Ta, Mg, Mn, Ca, Cd, Hg, Ni, Sr, or Zn. Also disclosed are articles comprising an approximately atomically thin layer comprising at least one of $Y_2O_3$, $SiO_2$, or $Al_2O_3$ doped with at least one metal oxide comprising $Er_2O_3$, $PrO_3$, $SmO_3$, $EuO_3$, $TbO_3$, or $DyO_3$. For example, disclosed is an article comprising an approximately atomically thin layer of $Y_2O_3$ doped with $Er_2O_3$.

Also disclosed are methods comprising the steps of depositing a dopant precursor comprising $M^DL$ on a substrate via an atomic layer deposition technique; and exposing the deposited dopant precursor to reductive radicals, thereby providing a dopant metal by removing substantially all L and reducing substantially all $M^D$ to $M^D(0)$, wherein $M^D$ is a dopant metal ion, and wherein L comprises at least one anionic ligand with a total valence sufficient to render $M^DL$ neutral. Also disclosed are methods further comprising the steps of depositing a compound comprising ML via an atomic layer deposition technique; and exposing the deposited compound to reductive radicals, thereby providing a host metal by removing substantially all L and reducing substantially all M to M(0), wherein M is a host metal ion, and wherein L comprises one or more anionic ligands with a total valence sufficient to render ML neutral.

Also disclosed are methods comprising the steps of depositing a dopant precursor comprising the structure:

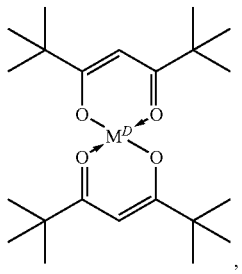

wherein MD is $Mg^{2+}$, $Ca^{2+}$, $Cd^{2+}$, or $Zn^{2+}$, on a substrate via an atomic layer deposition technique; and exposing the deposited dopant precursor to hydrogen radicals produced by plasma ionization and dissociation of hydrogen gas, thereby providing a dopant metal by removing substantially all ligands and reducing substantially all $M^D$ to $M^D(0)$; depositing a compound comprising CuL via an atomic layer deposition technique, wherein L comprises two anionic ligands, which can be the same or different; and exposing the deposited compound to hydrogen radicals produced by plasma ionization and dissociation of hydrogen gas, thereby providing copper metal by removing substantially all L and reducing substantially all Cu to Cu(0).

Also disclosed are methods comprising the steps of depositing a compound comprising ML onto a substrate via an atomic layer deposition technique, wherein L comprises at least one anionic ligand; exposing the deposited compound to reductive radicals, thereby providing reduced metal by removing substantially all L and reducing substantially all M to M(0); and electrodepositing M(0) onto the deposited reduced metal.

Also disclosed are methods comprising the steps of depositing a dopant precursor comprising $M^DL$ on a substrate via an atomic layer deposition technique; and exposing the deposited dopant precursor to oxidative radicals, thereby providing a dopant metal oxide by removing substantially all L and producing an oxide of $M^D$, wherein $M^D$ is a dopant metal ion, and wherein L comprises at least one anionic ligand with a total valence sufficient to render $M^DL$ neutral. Also disclosed are methods further comprising the steps of depositing a compound comprising ML via an atomic layer deposition technique; and exposing the deposited compound to oxidative radicals, thereby providing a host metal oxide by removing substantially all L and producing an oxide of M, wherein L comprises at least one anionic organic ligand with a total valence sufficient to render ML neutral.

Also disclosed are methods comprising the steps of depositing a dopant precursor comprising the structure:

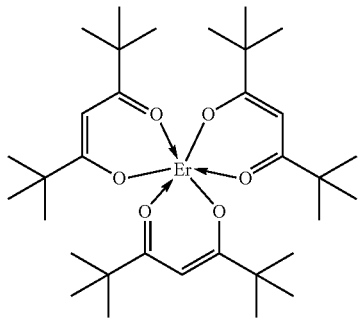

on a substrate via an atomic layer deposition technique; and exposing the deposited dopant precursor to oxygen radicals or $NH_3$ radicals produced by plasma ionization and dissociation of oxygen gas or ammonia gas, thereby providing a dopant metal oxide by removing substantially all ligand from the Er and producing $Er_2O_3$; depositing a compound comprising the structure $YL^AL^BL^C$ via an atomic layer deposition technique, wherein $L^A$, $L^B$, and $L^C$ independently comprise anionic ligands with a total valence sufficient to render the compound neutral; and exposing the deposited compound to oxygen or $NH_3$ radicals produced by plasma ionization and dissociation of oxygen or ammonia gas, thereby providing a host metal oxide by removing substantially all ligand from the Y and producing $Y_2O_3$.

Also disclosed are the products produced by the disclosed methods.

Additional advantages can be set forth in part in the description which follows, and in part can be obvious from the description, or can be learned by practice. Other advantages can be realized and attained by means of the elements and combinations particularly pointed out in the appended claims. It is to be understood that both the foregoing general description and the following detailed description are exemplary and explanatory only and are not restrictive of the invention, as claimed.

BRIEF DESCRIPTION OF THE FIGURES

The accompanying figures, which are incorporated in and constitute a part of this specification, illustrate several embodiments and together with the description serve to explain the principles of the invention.

for Y(TIMHD)$_3$ and Er(TIMHD)$_3$ at $t_o > t_o^c$ decreased with increasing temperature and reached the ratios for pure Y$_2$O$_3$ and Er$_2$O$_3$ at 533 K and 603 K, respectively.

Figure 12:
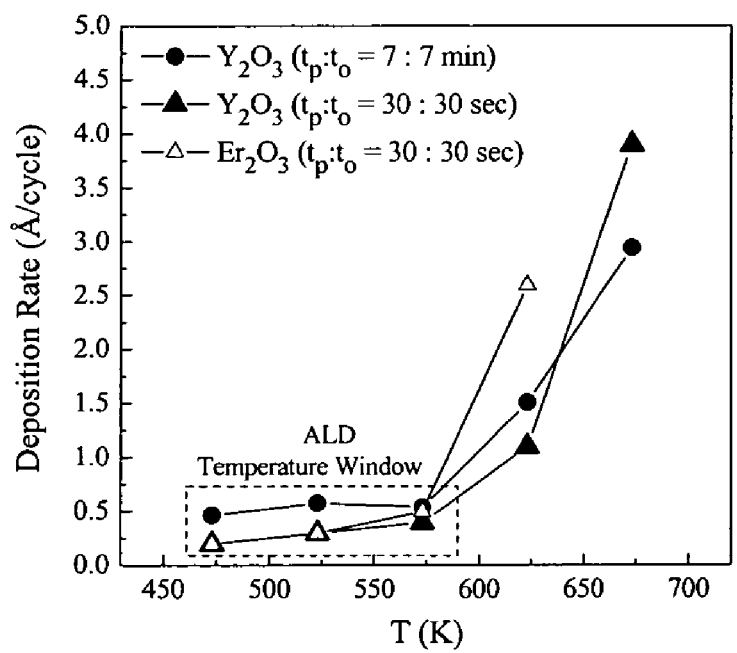

FIG. 12 shows the deposition rate of Y$_2$O$_3$ and ErO$_3$ as a function of substrate temperature for long precursor exposure times (to and to =7 and 7.75 minutes) and short precursor exposure times ($t_p = t_o = 30$ seconds), determined by XPS analysis. For Y$_2$O$_3$, a saturative deposition rate of ~0.5 Å/cycle and ~0.3 Å/cycle were achieved in the ALD temperature window of 473 K to 623 K using long versus short reactant pulse times.

Figure 13:
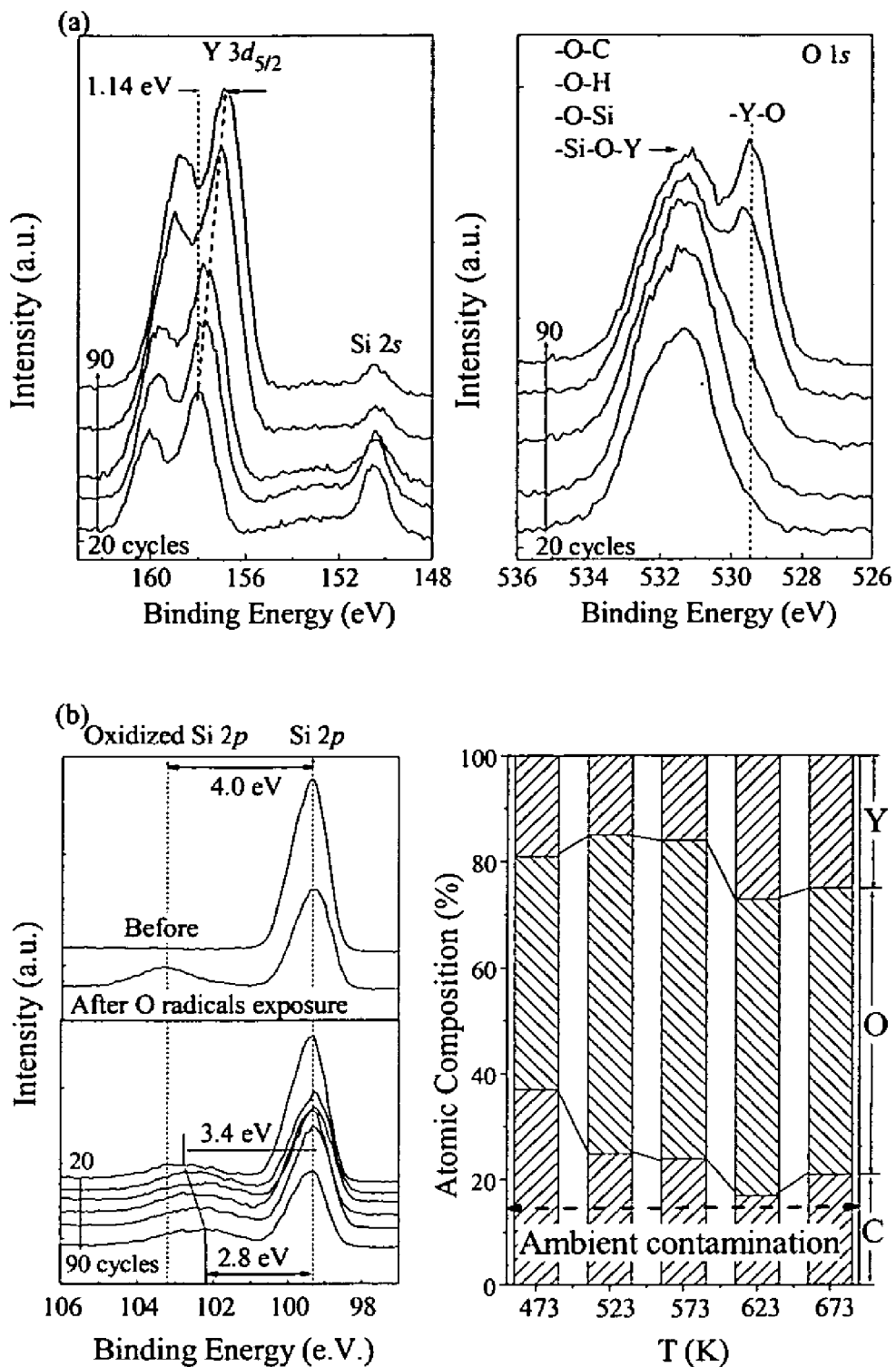

FIG. 13 shows (a) The Y 3d and O 1s XPS spectra of the Y$_2$O$_3$ thin films deposited after 20 to 90 deposition cycles. (b) The Si 2p XPS spectra (left) indicated an interfacial layer formation. The compositional analysis of Y$_2$O$_3$ thin films (right), indicates an ambient contamination level of 13 at. % C and 15 at. % O due to the ex-situ measurement.

Figure 14:
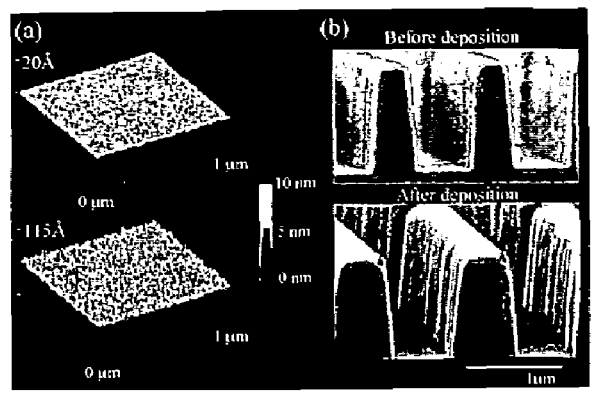

FIG. 14 shows (a) The AFM surface images of a 20-Å and 115-Å Y$_2$O$_3$ films showed a RMS roughness of 2.0 Å and 5.1 Å, respectively. (b) The cross-sectional SEM images of an 800-Å Y$_2$O$_3$ film deposited on a 0.5 μm TaN-coated Si trench with an aspect ratio of 2, before and after the deposition.

Figure 15:
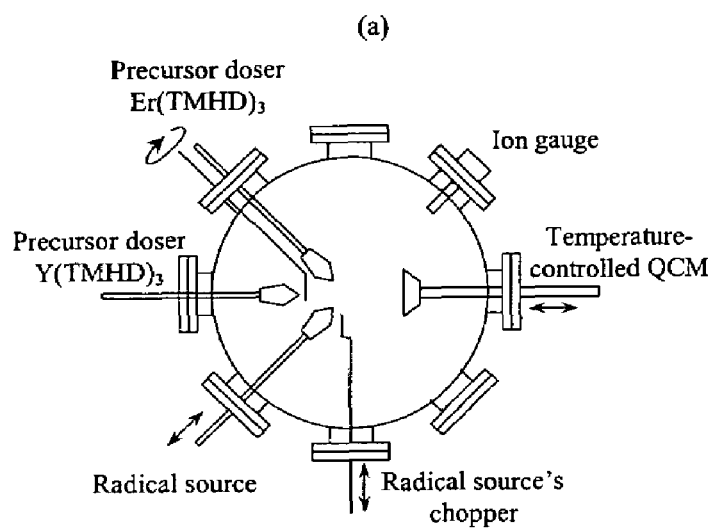
Figure 15:
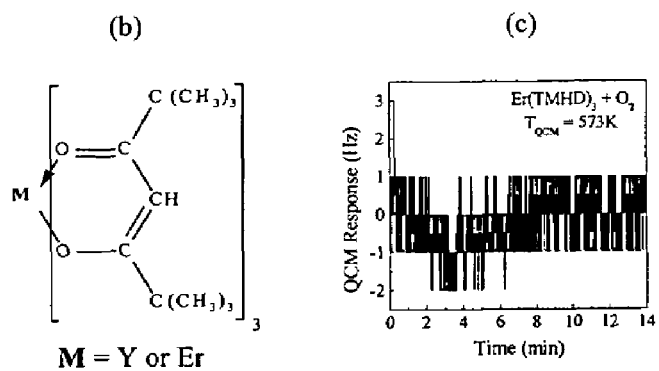

FIG. 15 shows (a) Top-view schematic of the UHV multi-beam reactor; (b) molecular structure of a trivalent metal β-diketonate precursor (M=Y, Er); (c) QCM response while introducing Er(TMHD)$_3$ and O$_2$ simultaneously into the chamber at 573 K fluctuated ±1 Hz around the zero baseline due to noises, indicating that β-diketonate precursors are stable in O$_2$ background.

Figure 16:
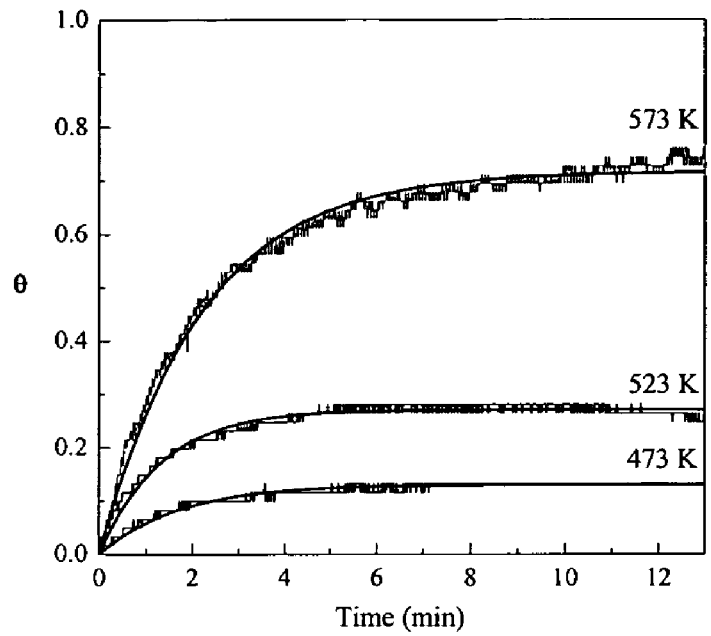
Figure 16:
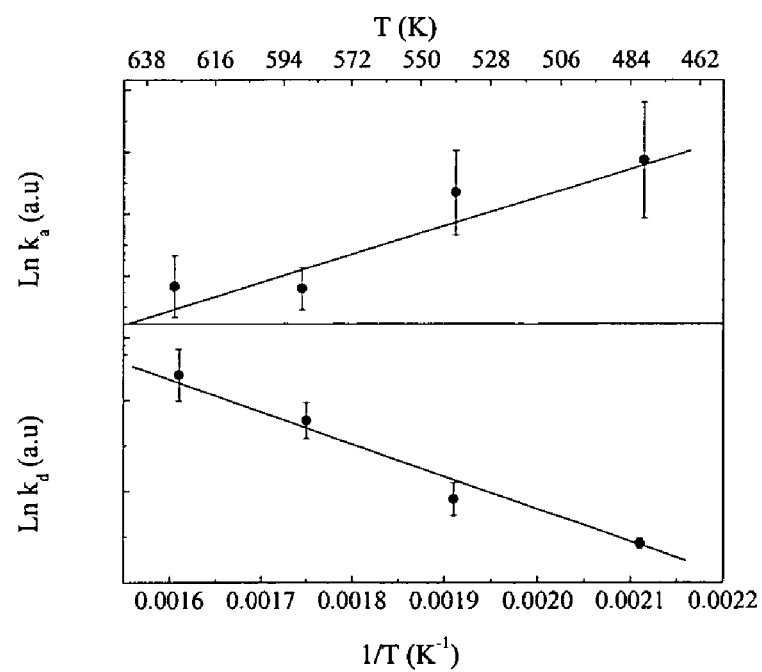

FIG. 16 shows (a) Er(TMHD)$_3$ adsorption isotherms at 473K, 523K, and 573K. The adsorption isotherms were fitted to the Langmuir adsorption model, assuming Er(TMHD)$_3$ adsorbed with the β-diketonate ligands intact. (b) Arrhenius plots of the adsorption and desorption rate coefficients, $k_a$ and $k_d$, extracted from (a). The adsorption and desorption activation energies, $E_a$ and $E_d$, are −0.24±0.09 eV and 0.29+0.03 eV, respectively.

Figure 17:
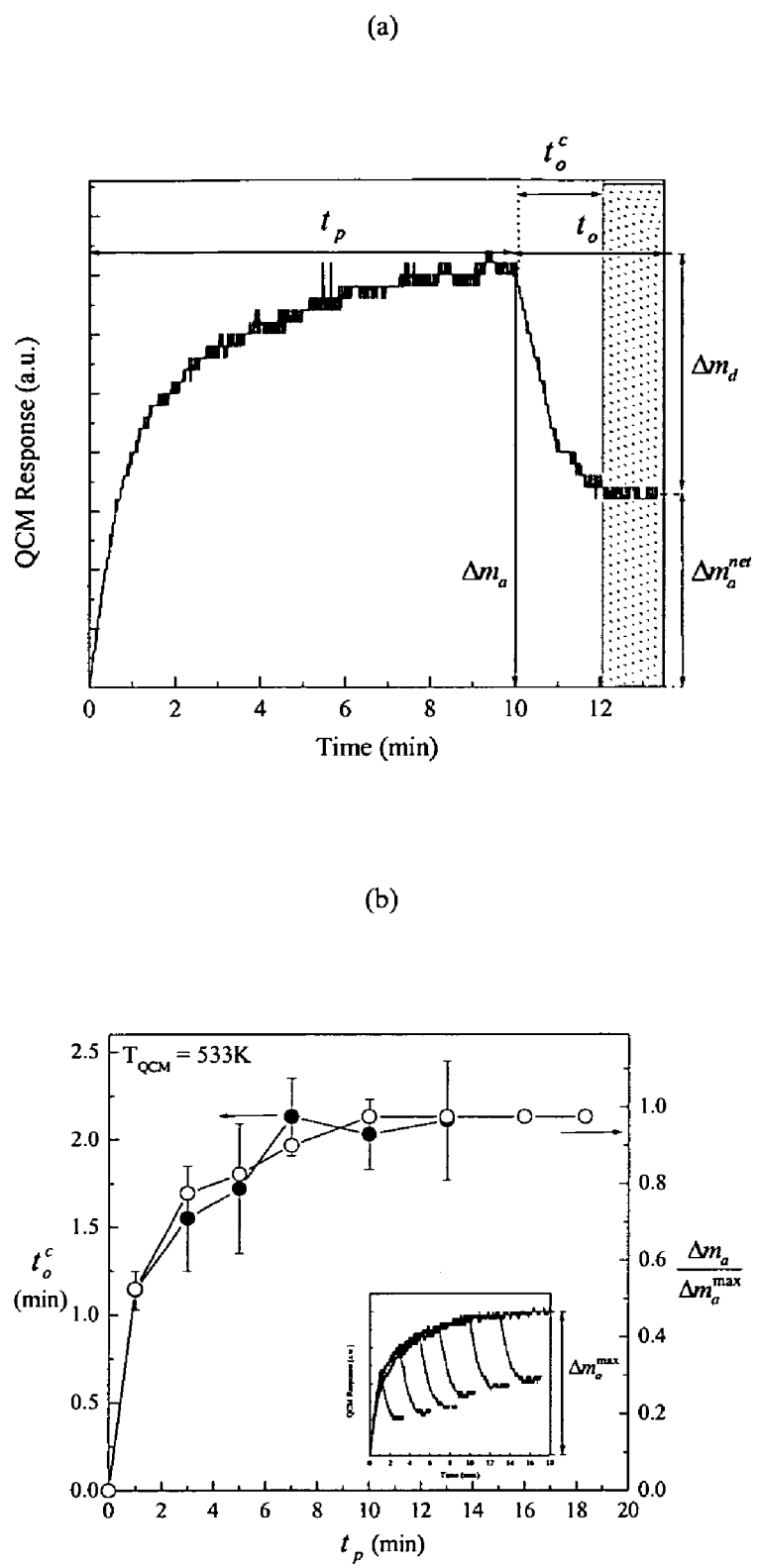

FIG. 17 shows (a) QCM response for one ALD cycle: $t_p$ and $t_o$ denote the precursor and O radical pulse times, respectively. The corresponding mass changes are $\Delta m_a$ and $\Delta m_d$. $\Delta m_{net}$ is the net mass deposited per cycle. $t_o^c$ is the shortest to required to reach the state where no change in mass can be detected. (b) Interdependencies of $t_o^c$ and fractional adsorbed mass $$\frac{\Delta m_a}{\Delta m_a^{max}}$$

on $t_p$: $t_o^c$ was found to scale with $$\frac{\Delta m_a}{\Delta m_a^{max}}.$$

Figure 18:
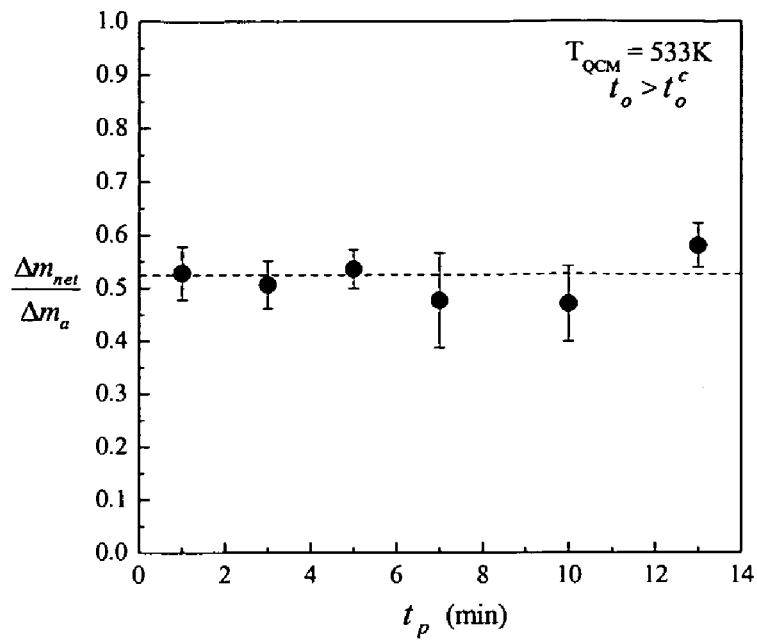
Figure 18:
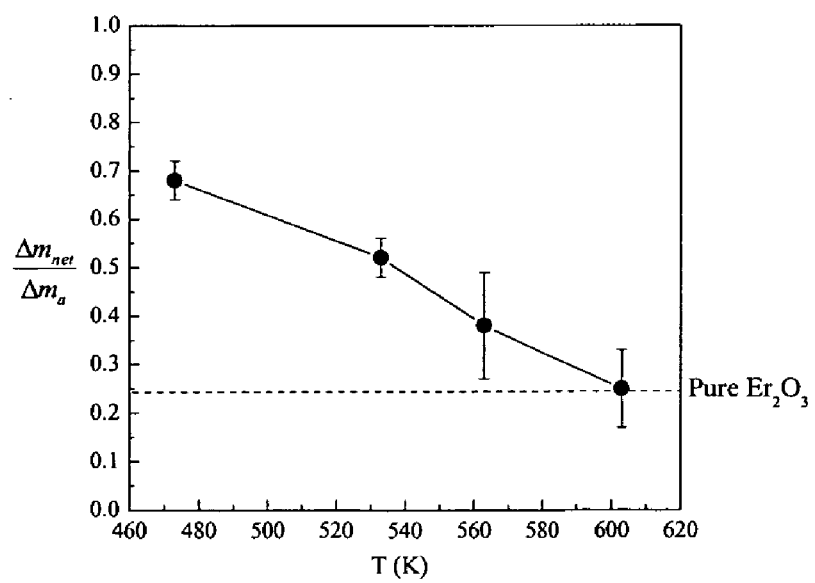

FIG. 18 shows (a) Surface mass change ratio $$\frac{\Delta m_{net}}{\Delta m_a}$$

after $t_p$ and $t_o$ pulses at 533 K:

$$\frac{\Delta m_{net}}{\Delta m_a}$$

remained constant at 0.52, independence of $t_p$. (b)

$$\frac{\Delta m_{net}}{\Delta m_a}$$

decreased with increasing temperature and reached 0.27 for deposition of pure Er$_2$O$_3$.

Figure 19:
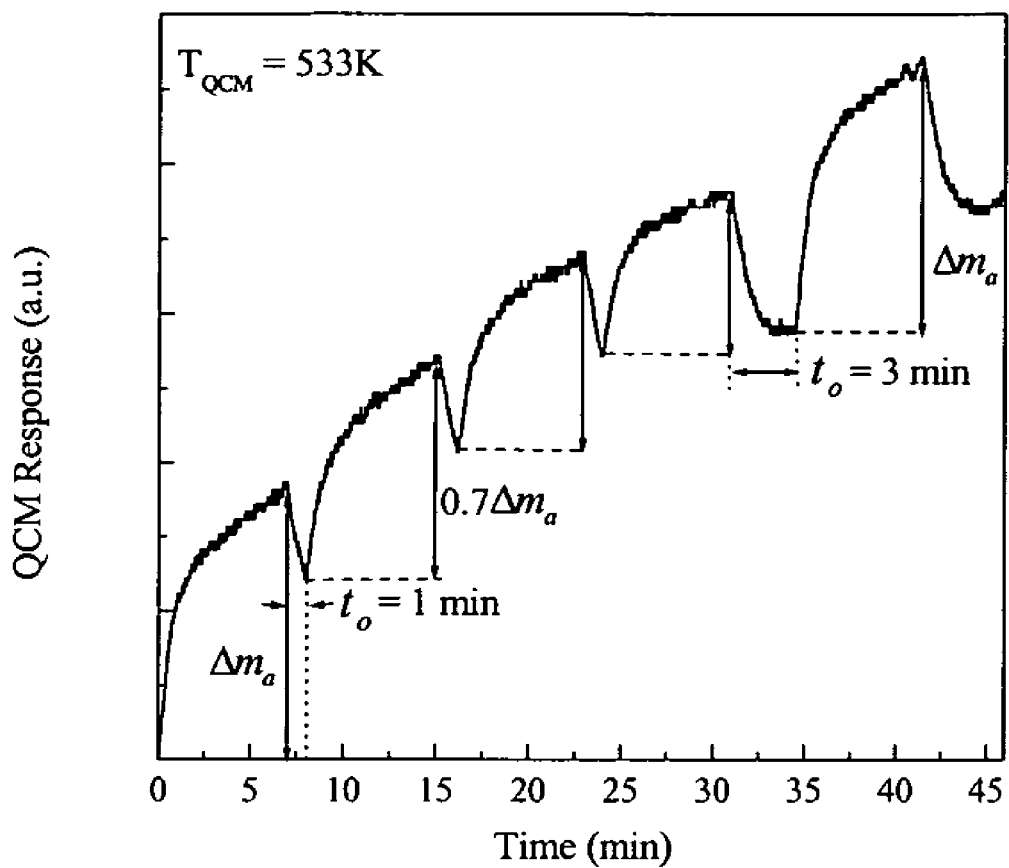

FIG. 19 shows (a) Effect of $t_o$ on subsequent adsorption $\Delta m_{a2}$ at 533K: as $t_o$ varied from 30 seconds to 120 seconds, $\Delta m_{a2}$ increased correspondingly, indicating O radicals create reactive sites for adsorption. In addition, the required $t_o^a$ in the next cycle decreased as $t_o$ in the preceding cycle approached $t_o^c$. (b) $\Delta m_{a2}$ normalized to $\Delta m_{a1}$ scaled linearly with $t_o$ and reached $\Delta m_{a1}$ ($\Delta m_{a1}/\Delta m_{a2}=1$) when $t_o = t_o^c$.

Figure 20:
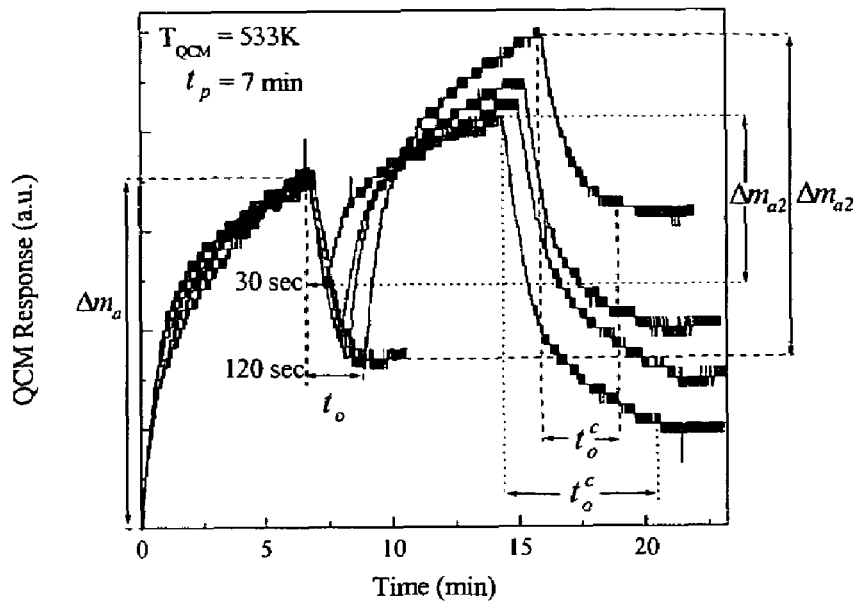
Figure 20:
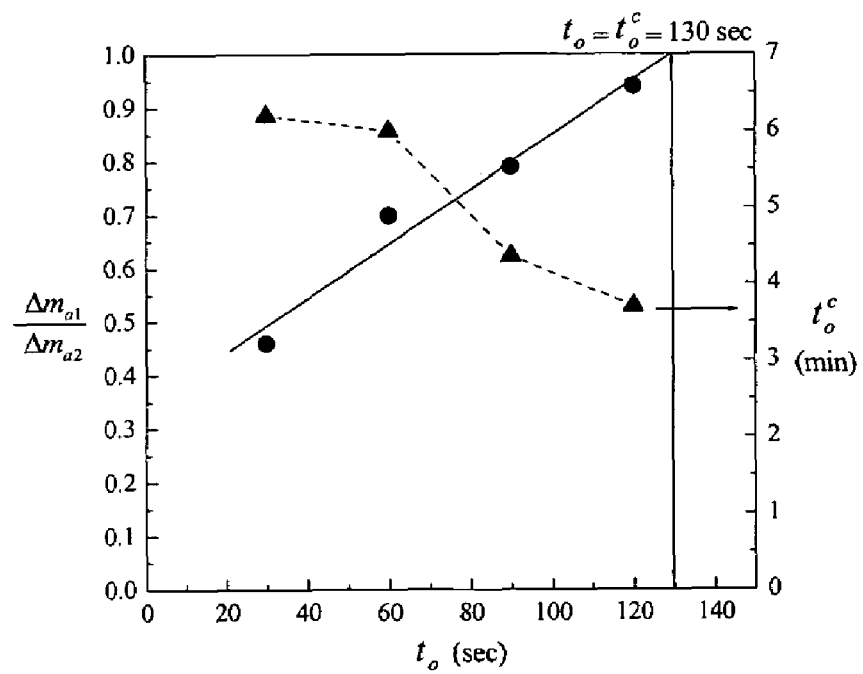

FIG. 20 shows QCM response during Er$_2$O$_2$ deposition at 533K: when $t_o < t_o^c$, only 0.7 $\Delta m_a$ was obtained; 1$\Delta m_a$ was again achieved when $t_o > t_o^c$.

Figure 21:
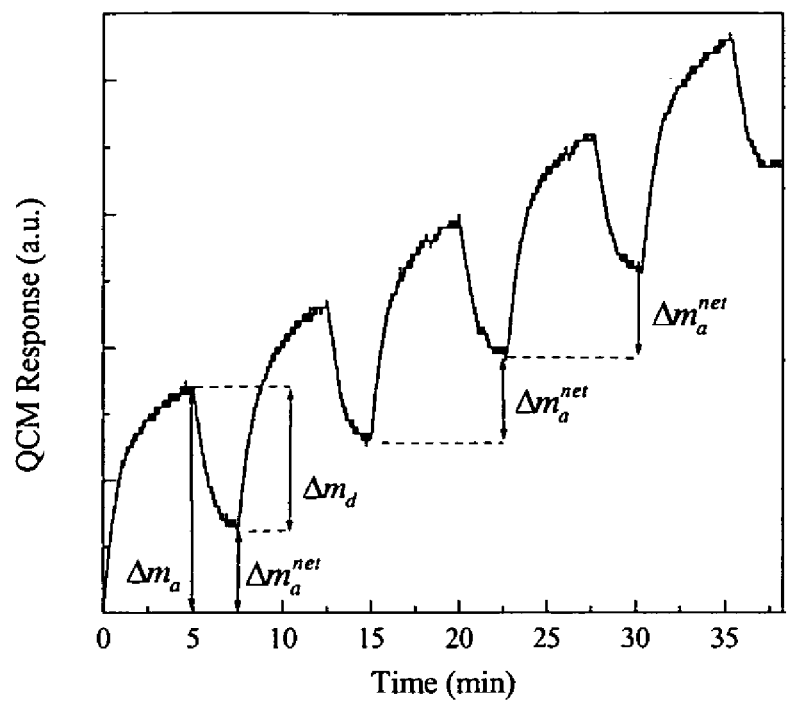
Figure 21:
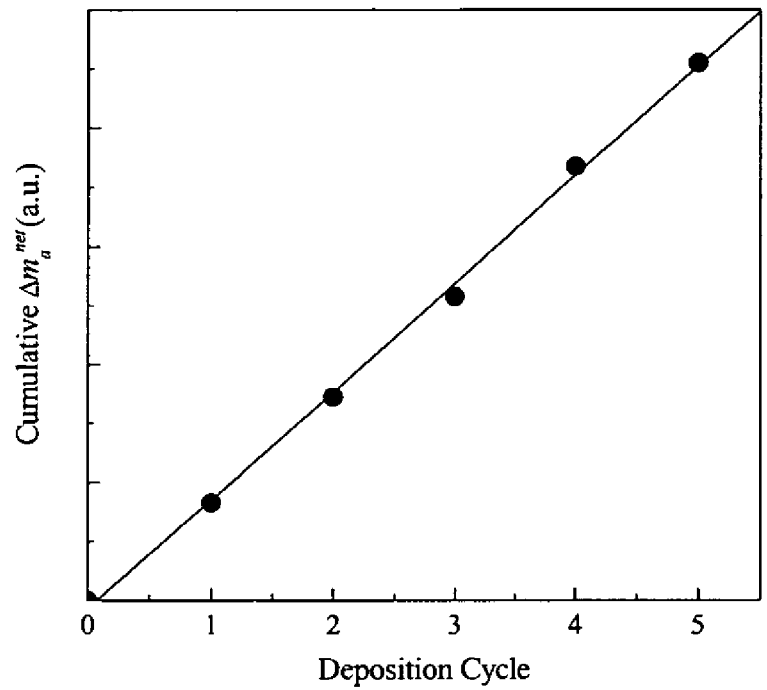

FIG. 21 shows (a) In-situ QCM response to ALD film growth of Er$_2$O$_2$ at 533 K: $t_p$ and $t_o$ are 5 minutes and 2½ minutes, respectively. (b) Cumulative $\Delta m_{net}$ depended linearly on the number of deposition cycles.

Figure 22:
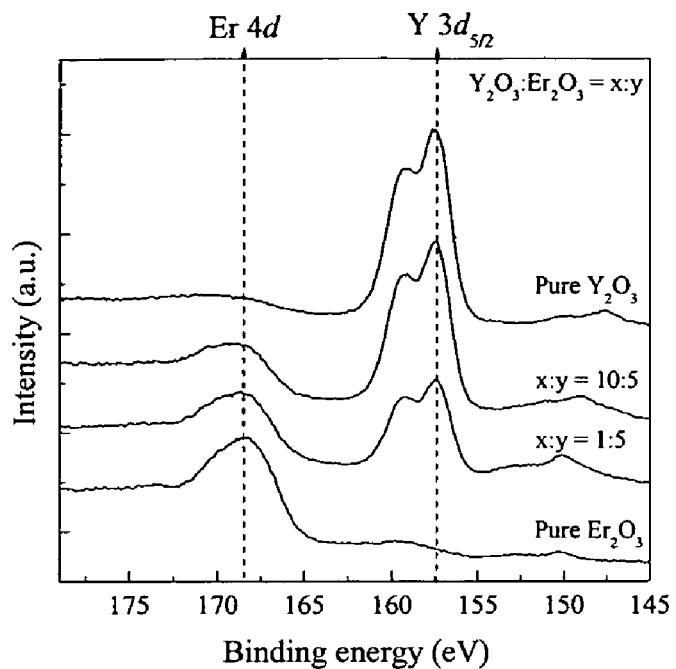

FIG. 22 shows XPS Y 3d and Er 4d spectra of Er-doped Y$_2$O$_3$ thin films. The ratio x:y represents the ratio of Y$_2$O$_3$: Er$_2$O$_3$ deposition cycles. The XPS spectra for pure Y$_2$O$_3$ and Er$_2$O$_3$ were also shown for comparison.

Figure 23:
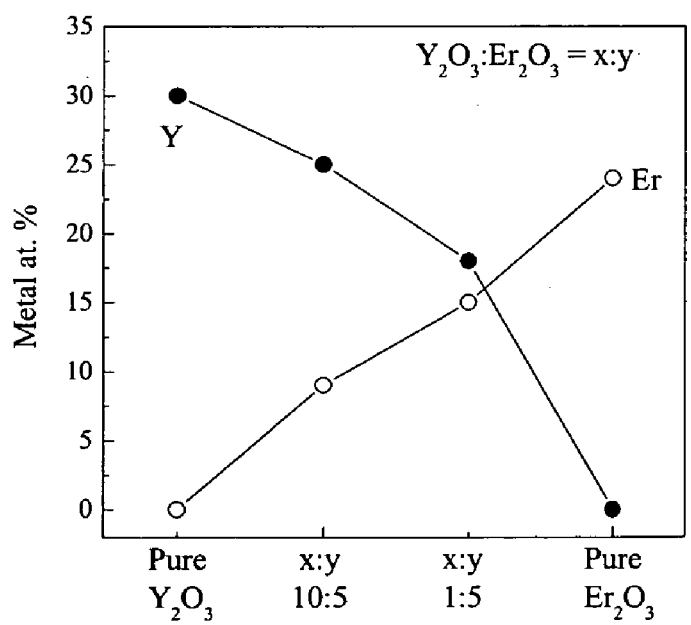

FIG. 23 shows the atomic percentage (at. %) of Y and Er measured in Er-doped Y$_2$O$_3$ thin films deposited at various x:y ratio. The composition was determined by ex-situ XPS thus an ambient contamination of ~13 at. % C and 15 at. % O was included in these calculations.

Figure 24:
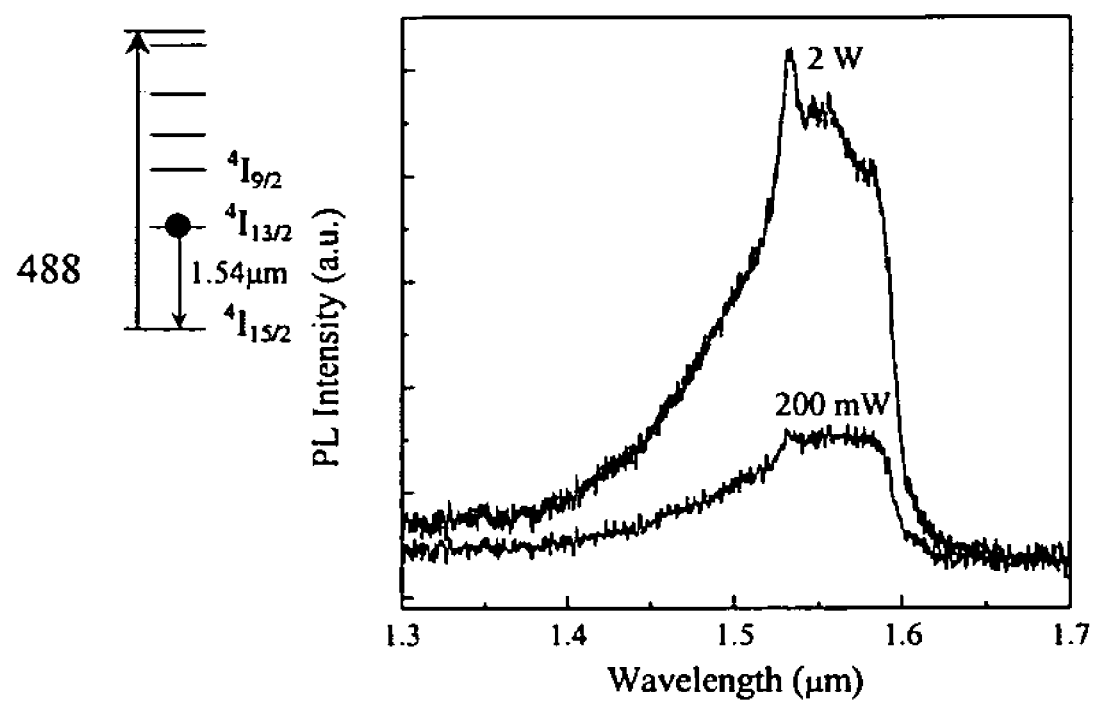

FIG. 24 shows room-temperature PL spectra of an as-deposited 320-Å Er-doped Y$_2$O$_3$ film containing 9 at. % Er. The sample was deposited at 350° C. by alternating 10 cycles of Y$_2$O$_3$ and 5 cycles of Er$_2$O$_3$.

DETAILED DESCRIPTION

Before the present compounds, compositions, articles, devices, and/or methods are disclosed and described, it is to be understood that they are not limited to specific synthetic methods unless otherwise specified, or to particular reagents unless otherwise specified, as such may, of course, vary. It is also to be understood that the terminology used herein is for the purpose of describing particular embodiments only and is not intended to be limiting.

A. DEFINITIONS

Although any methods and materials similar or equivalent to those described herein can be used in the practice or testing of the present invention, example methods and materials are now described.

Throughout this application, various publications are referenced. The disclosures of these publications in their entireties are hereby incorporated by reference into this application in order to more fully describe the state of the art to which this pertains. The references disclosed are also individually and specifically incorporated by reference herein for the material contained in them that is discussed in the sentence in which the reference is relied upon. Nothing herein is to be construed as an admission that the present invention is not entitled to antedate such publication by virtue of prior invention. Further, the dates of publication provided herein can be different from the actual publication dates, which can need to be independently confirmed.

As used in the specification and the appended claims, the singular forms "a," "an" and "the" include plural referents unless the context clearly dictates otherwise. Thus, for example, reference to "a compound," "a substrate," or "a metal" includes mixtures of two or more such compounds, substrates, or metals, and the like.

Ranges can be expressed herein as from "about" one particular value, and/or to "about" another particular value. When such a range is expressed, another embodiment includes from the one particular value and/or to the other particular value. Similarly, when values are expressed as approximations, by use of the antecedent "about," it can be understood that the particular value forms another embodiment. It can be further understood that the endpoints of each of the ranges are significant both in relation to the other endpoint, and independently of the other endpoint. It is also understood that there are a number of values disclosed herein, and that each value is also herein disclosed as "about" that particular value in addition to the value itself. For example, if the value "10" is disclosed, then "about 10" is also disclosed. It is also understood that when a value is disclosed that "less than or equal to" the value, "greater than or equal to the value" and possible ranges between values are also disclosed, as appropriately understood by the skilled artisan. For example, if the value "10" is disclosed the "less than or equal to 10" as well as "greater than or equal to 10" is also disclosed. It is also understood that throughout the application, data is provided in a number of different formats and that this data represents endpoints and starting points, and ranges for any combination of the data points. For example, if a particular data point "10" and a particular data point 15 are disclosed, it is understood that greater than, greater than or equal to, less than, less than or equal to, and equal to 10 and 15 are considered disclosed as well as between 10 and 15. It is also understood that each unit between two particular units are also disclosed. For example, if 10 and 15 are disclosed, then 11, 12, 13, and 14 are also disclosed.

A residue of a chemical species, as used in the specification and concluding claims, refers to the moiety that is the resulting product of the chemical species in a particular reaction scheme or subsequent formulation or chemical product, regardless of whether the moiety is actually obtained from the chemical species. Thus, an ethylene glycol residue in a polyester refers to one or more —OCH$_2$CH$_2$O— units in the polyester, regardless of whether ethylene glycol was used to prepare the polyester. Similarly, a sebacic acid residue in a polyester refers to one or more —CO(CH$_2$)$_8$CO— moieties in the polyester, regardless of whether the residue is obtained by reacting sebacic acid or an ester thereof to obtain the polyester.

As used herein, the terms "optional" or "optionally" means that the subsequently described event or circumstance can or can not occur, and that the description includes instances where said event or circumstance occurs and instances where it does not.

As used herein, the term "alkyl" refers to a hydrocarbon group that can be conceptually formed from an alkane, alkene, or alkyne by removing hydrogen from the structure of a cyclic or non-cyclic hydrocarbon compound having straight or branched carbon chains, and replacing the hydrogen atom with another atom or organic or inorganic substituent group. In some aspects of the invention, the alkyl groups are "$C_1$ to $C_6$ alkyl" such as methyl, ethyl, propyl, isopropyl, n-butyl, iso-butyl, sec-butyl, tert-butyl, amyl, tert-amyl, and hexyl groups, their alkenyl analogues, their alkynyl analogues, and the like. Many embodiments of the invention comprise "$C_1$ to $C_4$ alkyl" groups (alternatively termed "lower alkyl" groups) that include methyl, ethyl, propyl, iso-propyl n-butyl, iso-butyl, sec-butyl, and t-butyl groups, their alkenyl analogues, their alkynyl analogues, or the like. Some of the preferred alkyl groups of the invention have three or more carbon atoms preferably 3 to 16 carbon atoms, 4 to 14 carbon atoms, or 6 to 12 carbon atoms. The alkyl group can be unsubstituted or substituted. A hydrocarbon residue, for example an alkyl group, when described as "substituted," contains or is substituted with one or more independently selected heteroatoms such as O, S, N, P, or the halogens (fluorine, chlorine, bromine, and iodine), or one or more substituent groups containing heteroatoms (OH, NH$_2$, NO$_2$, SO$_3$H, and the like) over and above the carbon and hydrogen atoms of the substituent residue. Substituted hydrocarbon residues can also contain carbonyl groups, amino groups, hydroxyl groups and the like, or contain heteroatoms inserted into the "backbone" of the hydrocarbon residue. In one aspect, an "alkyl" group can be fluorine substituted. In a further aspect, an "alkyl" group can be perfluorinated.

Disclosed are the components to be used to prepare the compositions as well as the compositions themselves to be used within the methods disclosed herein. These and other materials are disclosed herein, and it is understood that when combinations, subsets, interactions, groups, etc. of these materials are disclosed that while specific reference of each various individual and collective combinations and permutation of these compounds can not be explicitly disclosed, each is specifically contemplated and described herein. For example, if a particular compound is disclosed and discussed and a number of modifications that can be made to a number of molecules including the compounds are discussed, specifically contemplated is each and every combination and permutation of the compound and the modifications that are possible unless specifically indicated to the contrary. Thus, if a class of molecules A, B, and C are disclosed as well as a class of molecules D, E, and F and an example of a combination molecule, A-D is disclosed, then even if each is not individually recited each is individually and collectively contemplated meaning combinations, A-E, A-F, B-D, B-E, B-F, C-D, C-E, and C-F are considered disclosed. Likewise, any subset or combination of these is also disclosed. Thus, for example, the sub-group of A-E, B-F, and C-E would be considered disclosed. This concept applies to all aspects of this application including, but not limited to, steps in methods of making and using the compositions. Thus, if there are a variety of additional steps that can be performed it is understood that each of these additional steps can be performed with any specific embodiment or combination of embodiments of the methods.

It is understood that the compositions disclosed herein have certain functions. Disclosed herein are certain structural requirements for performing the disclosed functions, and it is understood that there are a variety of structures that can perform the same function that are related to the disclosed structures, and that these structures will typically achieve the same result.

B. ATOMIC LAYER DEPOSITION

Atomic layer deposition (ALD) can be used to nano-engineer ultra thin film (UTF) stacks previously unattainable by conventional deposition techniques. This ability to deposit essentially alternating sub-monolayers to monolayers of discrete films of varying type, composition, stoichiometry, etc. allows one to tailor nano-laminates with mechanical, electrical, magnetic, and other materials properties unattainable by homogeneous single films alone. Since the deposition can be controlled down to atomic scale accuracy, ALD can be used as a highly uniform, controlled "doping" layer capable of lining varying substrate topographies, including high aspect ratio trenches and vias in micro- and nano-electronics, micromechanical structures (MEMs), optoelectronic device structures, etc.

C. ION- AND RADICAL-INDUCED THIN FILM DEPOSITION

Ion-induced chemical vapor deposition of a variety of metals [J. Melngailis, "Focused ion beam induced deposition-a review," Proc. SPEE, 1465, 36 (1991); K. Gamo, N. Takakura, N. Samoto, R. Shimizu, and S, Namba, "Ion beam assisted deposition of metal organic films using focused ion beams," Jpn. J. Appl. Phys. Part 1, 23, L923 (1984); P. G. Blauner, J. S. Ro, Y. Butt, and J. Melngailis, "Focused ion beam fabrication of submicron gold structures," J. Vac. Sci. Technol. B 7, 609 (1989)] can have been demonstrated using both broad and focused ion beams. It can have been demonstrated that ion induced surface reaction can localize the deposition down to dimensions of order 0.1 mm. Current applications of ion-induced deposition consist of mask [D. K. Stewart, J. A. Morgan, and B. Ward, "Focused ion beam induced deposition of tungsten on vertical sidewalls," J. Vac. Sci. Technol. B 9, 2670 (1991)] and integrated circuit repair where direct writing of patterned thin films is possible. [T. Tao, W. Wilkinson, and J. Melngailis, "Focused ion beam induced deposition of platinum for repair processes," J. Vac. Sci. Technol. B 9, 162 (1991)] The ion-induced decomposition process is analogous to sputtering whereby an incident ion striking the solid loses its energy through a series of elastic and inelastic collisions. The elastic collisions generate displaced lattice atoms, some of which cross the surface and impart enough energy for dissociation of the adsorbate. Since organometallic precursors can be used, high concentrations ~20-30 at. % of carbon impurities are typically found in the deposited films, resulting in high metal resistivities comparing to that of a pure bulk metal. The above-mentioned simple atomistic model can be modified to take into account the impurity incorporation/removal which can be important in obtaining high conductivity, high density metallic films. The ability to eliminate or control the level of impurities in the deposited material would greatly enhance the viability and applicability of ion-induced deposition processes. High purity Cu films with resistivities of 5 µΩ-cm were achieved at room temperature with ion bombardment, and Ta is shown to have low resistivity and high packing density under medium ion energy bombardment. [B. S. Kang, S. M. Lee, J. S. Kwak, D. S. Yoon, H. K. Baik, "The effectiveness of Ta prepared by ion-assisted deposition as a diffusion barrier between copper and silicon," J. Electrochem. Soc. 144, 1807 (1997)]

Radical enhanced surface reactions have also been explored as means to facilitate the deposition of thin films through the reduced activation energy barrier. Hydrogen radical can have been shown to enable the epitaxial growth of ZnSe film on silicon with increased deposition rate, [T. Aoki, T. Ikeda, D. Korzec, and Y. Hatanaka, "ZnSe growth by radical assisted MOCVD using hollow cathode plasma," Thin Solid Films, 368, 244 (2000)] assist the deposition of CdTe, [M. Niraula, T. Aoki, Y. Nakanishi, and Y. Hatanaka, "Growth and doping studies of CdTe epilayers on GaAs substrates by low-pressure plasma-radical-assisted metalorganic chemical vapor deposition," J. Crystal Growth, 200, 90 (1999)] and remove hydrocarbon fragments and to avoid carbon incorporation during As [A. Brauers, "Alternative precursors for III-V MOVPE criteria for evaluation," J. Crystal Growth, 107, (1-4), 281-9 (1991)] and Cu [T. Chiang, H. H. Sawin, and C. V. Thompson, "Ion-induced chemical vapor deposition of high purity Cu films at room temperature using a microwave discharge H atom beam source," J. Vac. Sci. Technol. A 15(5), 2677 (1997)] deposition. Hydrogen and nitrogen can be involved in the deposition TaN and TiN. [K. N. Cho, C. H. Han, K. B. Noh, J. E. Oh, S. H. Paek, C. S. Park, S. I. Lee, M. Y. Lee, and J. G. Lee, "Remote plasma-assisted metal organic chemical vapor deposition of tantalum nitride thin films with different radicals," Jpn. J. Appl. Phys. Part 1, 37, 6502 (1998); Y. H. Chang, J. S. Chun, J. E. Oh, S. J. Won, S. E. Paek, et. al., "Enhancement of titanium nitride barrier metal properties by nitrogen radical assisted metalorganic chemical vapor deposition," Appl. Phys. Lett. 68, 2580 (1996)] With radical enhanced surface reaction, lower temperature deposition is typically achieved, and the film microstructure can be shown to be significantly altered, primarily due to the elimination of carbon.

In contrast to conventional ion- and radical-induced thin film deposition, the methods of the invention can, in one aspect, employ atomic layer deposition techniques with radical enhancement to provide, for example, approximately atomically thin doped layers.

D. CONDUCTIVE DOPED THIN LAYERS

Without wishing to be bound by theory, it is believed that the methods of the invention can provide, and that the articles of the invention can comprise, approximately atomically thin layers in which a dopant metal is distributed within a host metal. In one aspect, a dopant metal precursor can be deposited on a substrate, ligands can be removed and a dopant metal can be provided by exposure to radicals, and a host metal can be deposited adjacent to the dopant metal. That is, host metal moieties can be positioned between dopant metals within spaces formerly occupied by ligand moieties In one aspect, the invention relates to an article comprising an approximately atomically thin layer comprising one or more of Cu, Al, W, Ti, Ta, Mg, Mn, Ca, Cd, Hg, Ni, Sr, or Zn doped with at least one different metal comprising Cu, Al, W, Ti, Ta, Mg, Mn, Ca, Cd, Hg, Ni, Sr, or Zn. That is, in one aspect, the layer comprises a host metal and a dopant metal.

In a further aspect, the layer comprises Cu doped with at least one of Mg, Ca, Cd, or Zn or a mixture thereof. In a further aspect, the dopant is present in the layer in a concentration of from about 0.01% to about 10%, for example from about 1% to about 10% or from about 1% to about 5%, based upon the mass of the layer. In a yet further aspect, the article can have a substantially uniform concentration of dopant dispersed within the layer. In a still further aspect, the dopant atoms are spaced apart an average of from about 0.3 nm to about 3 nm within the layer.

The articles of the invention can be conductive. For example, an article can have a conductivity of from about 0 to about 5 g$\Omega$-cm, from about 1 to about 2 $\mu\Omega$-cm, from about 2 to about 3 $\mu\Omega$-cm, greater than about 0 $\mu\Omega$-cm, less than about 2 $\mu\Omega$-cm, greater than about 2 $\mu\Omega$-cm, or about 2 $\mu\Omega$-cm.

In one aspect, the conductive doped thin layers are produced by the methods of the invention.

1. Host Metal

In one aspect, the host metal, which can also be referred to as a host, can be at least one of copper, aluminum, tungsten, titanium, tantalum, magnesium, manganese, calcium, cadmium, mercury, nickel, strontium, or zinc or a mixture thereof. It is understood that any of the exemplary host metals can be optionally absent from the invention. It is also understood that the host metal can be provided from a host metal precursor, for example ML, and can be present as a zero-valent metal.

2. Dopant Metal

In one aspect, the dopant metal, which can also be referred to as the dopant, can be at least one of copper, aluminum, tungsten, titanium, tantalum, magnesium, manganese, calcium, cadmium, mercury, nickel, strontium, or zinc or a mixture thereof. It is understood that any of the exemplary dopant metals can be optionally absent from the invention. It is also understood that the dopant metal can be provided from a dopant precursor, for example $M^D L$, and can be present as a zero-valent metal. In one aspect, the doped layer can have a film resistivity of less than about 2 $\mu\Omega$-cm.

E. METHODS FOR PRODUCING CONDUCTIVE DOPED THIN LAYERS

In one aspect, the invention relates to a method for producing a conductive doped thin layer on a substrate comprising the steps of depositing a dopant precursor comprising $M^D L$ on the substrate via an atomic layer deposition technique; and exposing the deposited dopant precursor to reductive radicals, thereby providing a dopant metal by removing substantially all L and reducing substantially all $M^D$ to $M^D(0)$, wherein $M^D$ is a dopant metal ion, and wherein L comprises at least one anionic ligands with a total valence sufficient to render $M^D L$ neutral. In a further aspect, $M^D$ is a divalent metal ion and L comprises two anionic ligands, $L^A$ and $L^B$, which can be the same or different. For example, $M^D$ can be at least one of $Mg^{2+}$, $Mn^{2+}$, $Ca^{2+}$, $Cd^{2+}$, $Hg^{2+}$, $Ni^{2+}$, $Sr^{2+}$, or $Zn^{2+}$ or a mixture thereof. In a further aspect, the method can further comprise the step of providing an undoped host metal layer on the substrate before performing the depositing step. In such an aspect, the dopant precursor can be deposited on the substrate including an undoped host metal layer. The undoped host metal layer can be provided by, for example, atomic layer deposition.

In one aspect, the dopant metal ion can provides at least one of enhanced chemical, optical, electrical, or physical properties, such as electromigration enhancement and optical gain/efficiency.

In one aspect, the atomic layer deposition technique comprises at least one of ion induced atomic layer deposition, modulated ion induced atomic layer deposition, thermal atomic layer deposition, radical enhanced atomic layer deposition, or plasma enhanced atomic layer deposition.

1. Deposition Temperature

The depositing step can be performed at any convenient temperature suitable under atomic layer deposition conditions. In one aspect, the depositing step can be performed at a temperature of from about 200° C. to about 500° C., for example, from about 200° C. to about 400° C., from about 300° C. to about 500° C., or from about 300° C. to about 400° C. In a further aspect, the depositing step is performed at a temperature of less than about 350° C.

2. Post-Treatment

In one aspect, the methods can optionally further comprise a post-treatment step, including, for example, at least one of annealing, plasma treatment, irradiation, thermal treatment, e-beam treatment, UV treatment, or microwave treatment. Without wishing to be bound by theory, it is believed that a post-treatment step can facilitate bonding and/or realignment of the crystal structure within the layer and thereby improve the properties of the layer. In one aspect, the post-treatment step, for example, an annealing step, is performed at a temperature of at least about 400° C., at least about 450° C., at least about 500° C., or at least about 550° C.

3. Reductive Radicals

In one aspect, any radical species capable of removing substantially all ligands from a precursor and reducing substantially all metal ion to metal can be used in connection with the methods of the invention. In a further aspect, the reductive radicals are hydrogen radicals produced by plasma ionization and dissociation of hydrogen gas.

4. Dopant Precursor

In one aspect, any species comprising a dopant metal ion with ligands with a total valence sufficient to render the species neutral that can be used in connection with atomic layer deposition techniques can be used in the methods of the invention. For example, the dopant precursor can be at least one of cadmium chloride, cadmium fluoride, cadmium iodide, cadmium bromide, cadmium acetylacetonate, cadmium acetate dihydrate, or dimethylcadmium or a mixture thereof. In a further example, the dopant precursor comprises at least one of bis(2,2,6,6-tetramethyl-3,5-heptanedionato) calcium, calcium acetylacetonate, or calcium hexafluoroacetylacetonate or a mixture thereof. In a yet further example, the dopant precursor comprises at least one of bis(cyclopentadienyl)magnesium, bis(ethylcyclopentadienyl)magnesium, magnesium acetylacetonate, magnesium hexafluoroacetylacetonate, or bis(2,2,6,6-tetramethyl-3,5-heptanedionato)magnesium or a mixture thereof. In a still further example, the dopant precursor comprises at least one of zinc chloride, zinc fluoride, zinc iodide, zinc bromide, diethylzinc, dimethylzinc, bis(2,2,6,6-tetramethyl-3,5-heptanedionato)zinc, zinc acetylacetonate, or zinc hexafluoroacetylacetonate or a mixture thereof.

In one aspect, the ligand(s) can be selected so as to provide steric bulk to the precursor. That is, the ligand(s) effectively provide separation of the individual metal ions of the precursor molecules after the precursor is deposited on a substrate. After exposure to radicals, the ligands are substantially removed, thereby converting the metal ions to metals or metal oxides and defining space between metals or metal oxides. The size and substitution of the ligand(s) can determine the amount and distribution of the space. In one aspect, the ligand(s) can be selected to have one or more bulky groups, for example, t-butyl groups. Further species can be subsequently deposited within the space between metals or metal oxides.

In one aspect, the dopant precursor can have a structure comprising $M^D L^A L^B$, and $L^A$ and $L^B$ can independently comprise 2,2,6,6-tetramethyl-3,5-heptanedionato, n-butylcyclopentadienyl, cyclopentadienyl, i-propylcyclopentadienyl, trimethylsilylamido, N,N-bis(trimethylsilyl)amide, or hexafluoroacetylacetonate.

In one aspect, a dopant precursor, $M^DL^AL^B$, comprises the structure:

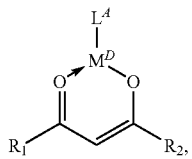

wherein $R_1$ and $R_2$ independently comprise alkyl moieties. $R_1$ and $R_2$ can independently comprise methyl, trifluoromethyl, ethyl, propyl, isopropyl, n-butyl, iso-butyl, sec-butyl, tert-butyl, amyl, tert-amyl, or hexyl groups or alkenyl or alkynyl analogues thereof or fluorinated analogues thereof.

In a further aspect, $M^DL^AL^B$ comprises the structure:

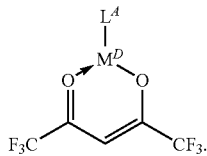

In a yet further aspect, $M^DL^AL^B$ comprises the structure:

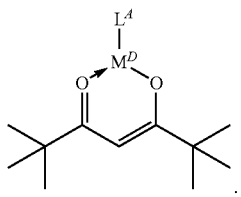

In a still further aspect, $M^DL^AL^B$ comprises the structure:

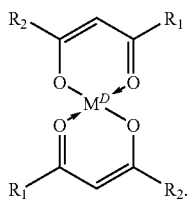

wherein $R_1$ and $R_2$ independently comprise methyl, trifluoromethyl, ethyl, propyl, isopropyl, n-butyl, iso-butyl, sec-butyl, tert-butyl, amyl, tert-amyl, or hexyl groups or alkenyl or alkynyl analogues thereof or fluorinated analogues thereof.

In a further aspect, $M^DL^AL^B$ comprises the structure:

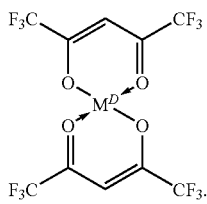

In a further aspect, $M^DL^AL^B$ comprises the structure:

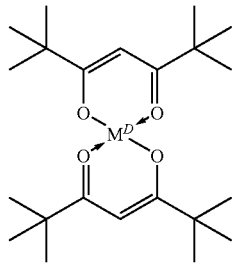

In one aspect, the methods can further comprise the step of removing residual $M^DL$ after the depositing step and before the exposing step. Such removal can be performed by, for example, evacuation.

5. Depositing Host Metal

In one aspect, a host metal can be substantially introduced into the layer subsequent to deposition of the dopant. For example, the method can further comprise the steps of depositing a compound comprising ML via an atomic layer deposition technique; and exposing the deposited compound to reductive radicals, thereby providing a host metal by removing substantially all L and reducing substantially all M to M(0), wherein M is a host metal ion, and wherein L comprises one or more anionic ligands with a total valence sufficient to render ML neutral. In one aspect, M is a divalent metal ion and L comprises two anionic ligands, $L^A$ and $L^B$, which can be the same or different. In certain aspects, a metal ion, M, can be, for example, at least one of $Cu^{2+}$, $Al^{3+}$, $Mg^{2+}$, $Mn^{2+}$, $Ca^{2+}$, $Cd^{2+}$, $Hg^{2+}$, $Ni^{2+}$, $Sr^{2+}$, $W^{2+}$, $Ti^{2+}$, $Ta^{2+}$, or $Zn^{2+}$. In certain aspects, M(0) can be at least one of Cu, Al, W, Ti, or Ta. In a further aspect, M(0) can have an electromigration resistance of at least about two times greater, of at least about five times greater, of at least about ten times greater, or of at least about fifteen times greater than that of Al(0).

In one aspect, the host precursor can be deposited adjacent the dopant. That is, the host precursor can be deposited within the space between dopant moieties provided after exposure to radicals. By "depositing adjacent" it is meant that the deposited compound is introduced into the same layer as the dopant, thereby providing a doped thin layer. In one aspect, the deposited compound can be introduced into spaces existing in the layer between dopant metal atoms that are created during treatment of the deposited dopant precursor with reductive, which remove substantially all ligands from the metal ion.

6. Host Metal Precursor

In one aspect, any species comprising a host metal ion with ligands with a total valence sufficient to render the species neutral that can be used in connection with atomic layer deposition techniques can be used in the methods of the invention. In one aspect, $ML^AL^B$ comprises the structure:

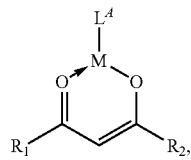

wherein $R_1$ and $R_2$ independently comprise alkyl moieties. $R_1$ and $R_2$ can independently comprise methyl, trifluoromethyl, ethyl, propyl, isopropyl, n-butyl, iso-butyl, sec-butyl, tert-butyl, amyl, tert-amyl, or hexyl groups or alkenyl or alkynyl analogues thereof or fluorinated analogues thereof.

In one aspect, the host metal precursor can have a structure comprising $ML^AL^B$, and $L^A$ and $L^B$ can independently comprise 2,2,6,6-tetramethyl-3,5-heptanedionato, n-butylcyclopentadienyl, cyclopentadienyl, i-propylcyclopentadienyl, trimethylsilylamido, N,N-bis(trimethylsilyl)amide, or hexafluoroacetylacetonate.

In a further aspect, $ML^AL^B$ comprises the structure:

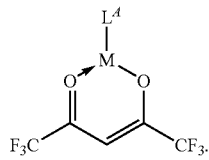

In a further aspect, $ML^AL^B$ comprises the structure:

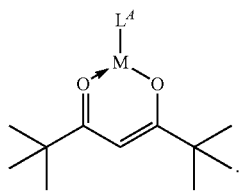

In a yet further aspect, $ML^AL^B$ comprises the structure:

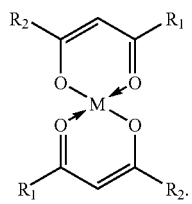

wherein $R_1$ and $R_2$ independently comprise methyl, trifluoromethyl, ethyl, propyl, isopropyl, n-butyl, iso-butyl, sec-butyl, tert-butyl, amyl, tert-amyl, or hexyl groups or alkenyl or alkynyl analogues thereof or fluorinated analogues thereof.

In a further aspect, $ML^AL^B$ comprises the structure:

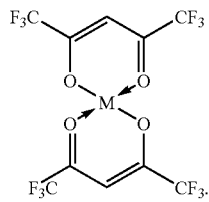

In a still further aspect, $ML^AL^B$ comprises the structure:

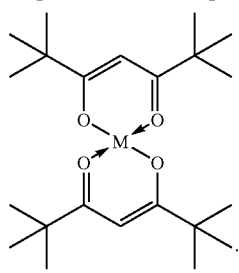

7. Producing a Conductive Thin Doped Copper Layer

In one aspect, the invention relates to a method for producing a conductive thin doped copper layer on a substrate comprising the steps of depositing a dopant precursor comprising the structure:

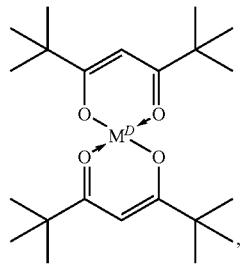

wherein $M^D$ is $Mg^{2+}$, $Ca^{2+}$, $Cd^{2+}$, or $Zn^{2+}$, on a substrate via an atomic layer deposition technique; and exposing the deposited dopant precursor to hydrogen radicals produced by plasma ionization and dissociation of hydrogen gas, thereby providing a dopant metal by removing substantially all ligands and reducing substantially all $M^D$ to $M^D(0)$; depositing a compound comprising CuL via an atomic layer deposition technique, wherein L comprises two anionic ligands, which can be the same or different; and exposing the deposited compound to hydrogen radicals produced by plasma ionization and dissociation of hydrogen gas, thereby providing copper metal by removing substantially all L and reducing substantially all Cu to Cu(0). In one aspect, the compound can be deposited adjacent the dopant. In a further aspect, CuL comprises the structure:

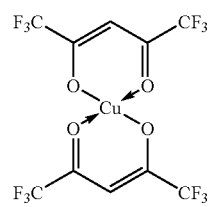

In a further aspect, the method can further comprise the step of providing an undoped copper layer on the substrate before performing step (a).

F. INSULATING DOPED THIN LAYERS

Without wishing to be bound by theory, it is believed that the methods of the invention can provide, and that the articles of the invention can comprise, approximately atomically thin layers in which a dopant metal oxide is distributed within a host metal oxide. In one aspect, a dopant metal oxide precursor can be deposited on a substrate, ligands can be removed and a dopant metal can be provided by exposure to radicals, and a host metal oxide can be deposited adjacent to the dopant metal oxide. That is, host metal oxide moieties can be positioned between dopant metal oxides within spaces formerly occupied by ligand moieties In one aspect, the invention relates to an article comprising an approximately atomically thin layer of $Y_2O_3$ doped with $Er_2O_3$. In a further aspect, the $Er_2O_3$ is present in the layer in a concentration of from about 0.01% to about 20%, for example, from about 1% to about 20%, from about 1% to about 10%, from about 5% to about 10%, from about 1% to about 5%, or from about 0.01% to about 10%. In a further aspect, the $Er_2O_3$ is present in the layer in a concentration of less than about 20%, of less than about 10%, of less than about 5%, of less than about 2%, of less than about 1%, of less than about 0.5%, or of less than about 0.1%.

In one aspect, the article can have a substantially uniform concentration of $Er_2O_3$ dispersed within the layer. In a further aspect, the $Er^{3+}$ ions are spaced apart an average of about 0.3 nm to about 3 nm within the layer.

The article can have a refractive index of from about 1.5 to about 2.5 at a wavelength of about 1.5 µm. The article can also have a gain of, for example, from about 2 to about 10 dB/cm, for example from about 2 to about 5 dB/cm.

1. Host Metal Oxide

In one aspect, the host metal oxide can be at least one of an oxide of yttrium, silicon, or aluminum or a mixture thereof. For example, the host metal oxide can be $Y_2O_3$, $Al_2O_3$, or $SiO_2$. It is understood that any of the exemplary host metal oxides can be optionally absent from the invention. In one aspect, the host metal oxide can be provided from a host metal oxide precursor, for example ML, and can have the general structure $M_2O_3$ or $MO_2$. For example, the oxide of M can be $Y_2O_3$.

2. Dopant Metal Oxide

In one aspect, the dopant metal oxide, which can also be referred to as the dopant, can be at least one of an oxide of erbium, praseodymium, samarium, europium, terbium, or dysprosium or a mixture thereof. It is understood that any of the exemplary dopant metal oxides can be optionally absent from the invention. In one aspect, the dopant metal oxide can be provided from a dopant metal oxide precursor, for example $M^DL$, and can have the general structure $M^DO_x$. For example, the oxide of MD can be $Er_2O_3$.

G. METHODS FOR PRODUCING INSULATING DOPED THIN LAYERS

In one aspect, the invention relates to a method for producing an insulating doped thin layer on a substrate comprising the steps of depositing a dopant precursor comprising $M^DL$ on the surface via an atomic layer deposition technique; and exposing the deposited dopant precursor to oxidative radicals, thereby providing a dopant metal oxide by removing substantially all L and producing an oxide of $M^D$, wherein $M^D$ is a dopant metal ion, and wherein L comprises at least one anionic ligand with a total valence sufficient to render $M^DL$ neutral. In a further aspect, $M^D$ is a trivalent metal and L comprises three anionic ligands, $L^A$, $L^B$, and $L^C$, which can be the same or different. For example, a dopant metal ion can be at least one of $Er^{3+}$, $Pr^{3+}$, $Sm^{3+}$, $Eu^{3+}$, $Tb^{3+}$, or $DY^{3+}$. In a further aspect, the method can further comprise the step of providing an undoped host metal oxide layer on the substrate before performing the depositing step. In such an aspect, the dopant precursor can be deposited on the substrate including an undoped host metal oxide layer. The undoped host metal oxide layer can be provided by, for example, atomic layer deposition.

1. Deposition Temperature

The depositing step can be performed at any convenient temperature suitable under atomic layer deposition conditions. In one aspect, the depositing step can be performed at a temperature of from about 200° C. to about 500° C., for example, from about 200° C. to about 400° C., from about 300° C. to about 500° C., or from about 300° C. to about 400° C. In a further aspect, the depositing step is performed at a temperature of less than about 350° C.

2. Post-Treatment

In one aspect, the methods can optionally further comprise a post-treatment step, including, for example, at least one of annealing, plasma treatment, irradiation, thermal treatment, e-beam treatment, UV treatment, or microwave treatment. Without wishing to be bound by theory, it is believed that a post-treatment step can facilitate bonding and/or realignment of the crystal structure within the layer and thereby improve the properties of the layer. In one aspect, the post-treatment step, for example, an annealing step, is performed at a temperature of at least about 400° C., at least about 450° C., at least about 500° C., or at least about 550° C.

3. Oxidizing Radicals

In one aspect, any oxidizing species capable of removing substantially all ligands from a precursor and oxidizing substantially all metal ion can be used in connection with the methods of the invention. In a further aspect, oxidizing radicals are oxygen radicals or $NH_3$ radicals produced by plasma ionization and dissociation of oxygen gas or ammonia gas.

In a further aspect, the oxidizing radicals can be $NH_3$ radicals. In such an aspect, the metal ion of the precursor can be converted to a corresponding metal nitride, rather than to a metal oxide. It is understood that the term "metal oxide" can include metal nitrides when non-oxygen-containing oxidizing radical are employed in connection with the methods and compositions of the invention. By analogy, the term "metal oxide" can also include other metal compounds that are products of reaction of the metal ion with non-oxygen-containing oxidizing radicals. For example, the precursor can be converted to an oxynitride derivative by treatment with a source of mixed or sequential oxygen and nitrogen radicals. That is, in a further aspect, the precursor can be treated with oxygen radicals and nitrogen radicals produced from, for example, both oxygen and ammonia or nitrogen or from nitrogen-oxygen compounds (e.g., NO,-based compositions).

4. Dopant Precursor

In one aspect, any species comprising a dopant metal ion with ligands with a total valence sufficient to render the species neutral that can be used in connection with atomic layer deposition techniques can be used in the methods of the invention. In one aspect, the dopant precursor comprises at least one of tris(2,2,6,6-tetramethyl-3,5-heptanedionato)erbium, erbium tris(acetylacetonate), or erbium tris(hexafluoroacetylacetonate) or a mixture thereof.

In one aspect, the ligand(s) can be selected so as to provide steric bulk to the precursor. That is, the ligand(s) effectively provide separation of the individual metal ions of the precursor molecules after the precursor is deposited on a substrate. After exposure to radicals, the ligands are substantially removed, thereby converting the metal ions to metals or metal oxides and defining space between metals or metal oxides. The size and substitution of the ligand(s) can determine the amount and distribution of the space. In one aspect, the ligand (s) can be selected to have one or more bulky groups, for example, t-butyl groups. Further species can be subsequently deposited within the space between metals or metal oxides.

In one aspect, a dopant precursor, $M^DL^AL^BL^C$, comprises the structure:

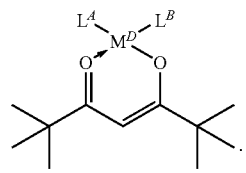

In a further aspect, $M^DL^AL^BL^C$ comprises the structure:

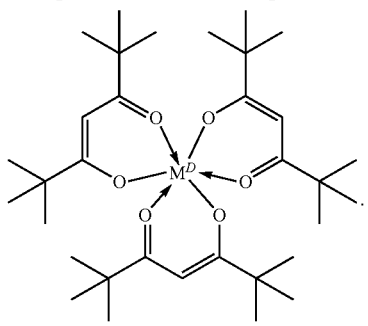

In one aspect, the methods can further comprise the step of removing residual $M^DL$ after the depositing step and before the exposing step. Such removal can be performed by, for example, evacuation.

5. Depositing Host Metal Oxide

In one aspect, a host metal oxide can be substantially introduced into the layer subsequent to deposition of the dopant. For example, the method can further comprise the steps of depositing a compound comprising ML adjacent the dopant metal oxide via an atomic layer deposition technique; and exposing the deposited compound to oxidative radicals, thereby providing a host metal oxide by removing substantially all L and producing an oxide of M, wherein L comprises at least one anionic organic ligand with a total valence sufficient to render ML neutral. In a further aspect, M is a trivalent metal and L comprises three anionic ligands, $L^A$, $L^B$, and $L^C$, which can be the same or different. For example, M can be at least one of Y, Si, or Al or a mixture thereof, for example, $Y^{3+}$. In a further aspect, the oxide of M can be at least one of $M_2O_3$ or $MO_2$ or a mixture thereof, for example, at least one of $Y_2O_3$, $Al_2O_3$, or $SiO_2$ or a mixture thereof.

In one aspect, the host precursor can be deposited adjacent the dopant. That is, the host precursor can be deposited within the space between dopant moieties provided after exposure to radicals. By "depositing adjacent" it is meant that the deposited compound is introduced into the same layer as the dopant, thereby providing a doped thin layer. In one aspect, the deposited compound can be introduced into spaces existing in the layer between dopant metal atoms that are created during treatment of the deposited dopant precursor with reductive, which remove substantially all ligands from the metal ion.

6: Host Metal Oxide Precursor

In one aspect, any species comprising a host metal ion with ligands with a total valence sufficient to render the species neutral that can be used in connection with atomic layer deposition techniques can be used in the methods of the invention. In one aspect, the host metal oxide precursor, $ML^A L^B L^C$, comprises the structure:

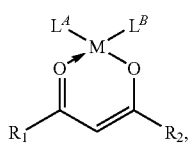

wherein $R_1$ and $R_2$ independently comprise alkyl moieties. $R_1$ and $R_2$ can independently comprise methyl, trifluoromethyl, ethyl, propyl, isopropyl, n-butyl, iso-butyl, sec-butyl, tert-butyl, amyl, tert-amyl, or hexyl groups or alkenyl or alkynyl analogues thereof or fluorinated analogues thereof.

In one aspect, $L^A$, $L^B$, and $L^C$ can independently comprise 2,2,6,6-tetramethyl-3,5-heptanedionato, n-butylcyclopentadienyl, cyclopentadienyl, i-propylcyclopentadienyl, trimethylsilylamido, N,N-bis(trimethylsilyl)amide, or hexafluoroacetylacetonate.

In a further aspect, $ML^A L^B L^C$ comprises the structure:

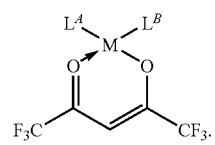

In a further aspect, $ML^A L^B L^C$ comprises the structure:

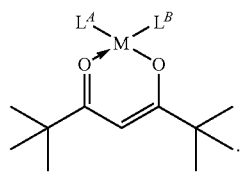

In a further aspect, $ML^A L^B L^C$ comprises the structure:

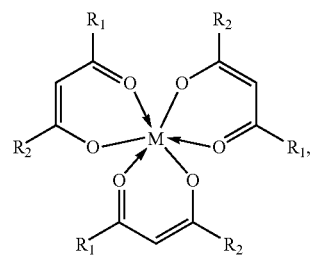

wherein $R_1$ and $R_2$ independently comprise alkyl moieties. In a further aspect, $R_1$ and $R_2$ can independently comprise methyl, trifluoromethyl, ethyl, propyl, isopropyl, n-butyl, iso-butyl, sec-butyl, tert-butyl, amyl, tert-amyl, or hexyl groups or alkenyl or alkynyl analogues thereof or fluorinated analogues thereof.

In a further aspect, $ML^A L^B L^C$ comprises the structure:

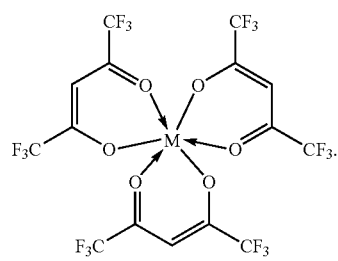

In a further aspect, ML$^A$L$^B$L$^C$ comprises the structure:

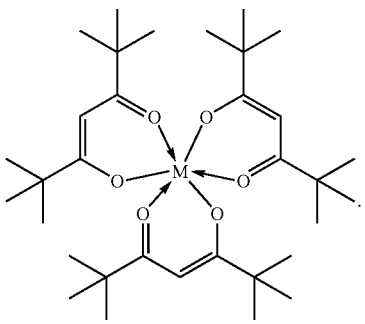

7. Producing an Insulating Er-Doped Thin Y Layer

In one aspect, the invention relates to producing an insulating Er-doped thin yttrium oxide layer. That is, in one aspect, the methods of the invention can be used to provide an insulating $Y_2O_3$ layer doped with $Er_2O_3$. In one aspect, the methods comprise the steps of depositing a dopant precursor comprising the structure:

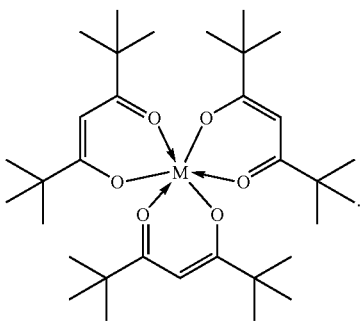

on a substrate via an atomic layer deposition technique; and exposing the deposited dopant precursor to oxygen radicals or $NH_3$ radicals produced by plasma ionization and dissociation of oxygen gas or ammonia gas, thereby providing a dopant metal oxide by removing substantially all ligand from the Er and producing $Er_2O_3$; depositing a compound comprising the structure YL$^A$L$^B$L$^C$ via an atomic layer deposition technique, wherein L$^A$, L$^B$, and L$^C$ independently comprise anionic ligands with a total valence sufficient to render the compound neutral; and exposing the deposited compound to oxygen or $NH_3$ radicals produced by plasma ionization and dissociation of oxygen or ammonia gas, thereby providing a host metal oxide by removing substantially all ligand from the Y and producing $Y_2O_3$. In one aspect, the compound can be deposited adjacent the dopant.

In a further aspect, YL$^A$L$^B$L$^C$ comprises the structure:

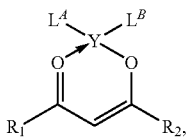

wherein $R_1$ and $R_2$ independently comprise alkyl moieties. In a further aspect, $R_1$ and $R_2$ can independently comprise methyl, trifluoromethyl, ethyl, propyl, isopropyl, n-butyl, iso-butyl, sec-butyl, tert-butyl, amyl, tert-amyl, or hexyl groups or alkenyl or alkynyl analogues thereof or fluorinated analogues thereof.

In a further aspect, L$^A$, L$^B$, and L$^C$ can independently comprise 2,2,6,6-tetramethyl-3,5-heptanedionato, n-butylcyclopentadienyl, cyclopentadienyl, i-propylcyclopentadienyl, trimethylsilylamido, N,N-bis(trimethylsilyl)amide, or hexafluoroacetylacetonate.

In a further aspect, YL$^A$L$^B$L$^C$ comprises the structure:

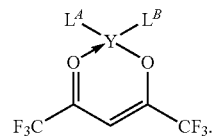

In a further aspect, YL$^A$L$^B$L$^C$ comprises the structure:

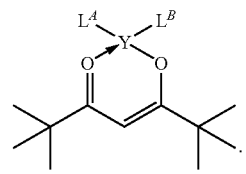

In a further aspect, YL$^A$L$^B$L$^C$ comprises the structure:

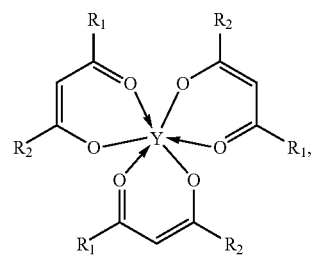

wherein $R_1$ and $R_2$ independently comprise alkyl moieties. In a further aspect, $R_1$ and $R_2$ can independently comprise methyl, trifluoromethyl, ethyl, propyl, isopropyl, n-butyl, iso-butyl, sec-butyl, tert-butyl, amyl, tert-amyl, or hexyl groups or alkenyl or alkynyl analogues thereof or fluorinated analogues thereof.

In a further aspect, YL$^A$L$^B$L$^C$ comprises the structure:

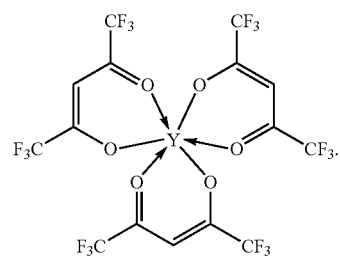

In a further aspect, YL$^A$L$^B$L$^C$ comprises the structure:

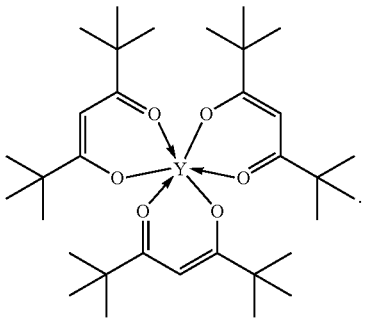

H. APPLICATIONS

1. Copper Interconnects

The semiconductor industry is moving away from traditional aluminum based conductors to using copper as the conductor for backend metallization. One reason is that copper can have higher electromigration resistance (>10×) than aluminum, aside from lower film resistivity. Electromigration concerns become increasingly important as feature sizes continue to shrink for better device performance. Smaller feature size dimensions (e.g., of trenches and vias) lead to increasing current densities and hence faster device failure due to electromigration (diffusion of metal atoms and ions via electron momentum transfer) which can lead to voids (opens) and hillocks (shorts) in the conductive lines. One way of further improving electromigration resistance is by doping copper with alloying elements such as Ca, Mg, Zn, and Cd to decrease grain boundary diffusion Typically, Mg can have added benefits in that it can prevent copper oxidation. This can help in subsequent electrochemical deposition (ECD) fill with copper. A copper seed layer can serve to conduct the plating current and also act as a nucleation layer. Copper oxide is typically a poor conductor and poor nucleation layer. Typically, a de-plate step is used to remove the copper oxide prior to ECD fill. However, this can consume some of the critical seed layer thickness. Therefore, it can be advantageous to prevent the formation of copper oxide.

Atomic layer deposition (ALD) techniques can be used to introduce a doped Cu layer at the interfaces or in alternating stacks of doped Cu/un-doped Cu/doped Cu. The doped thickness vs. the un-doped thickness can be adjusted to vary the film stack properties. Generally, the doped film thickness can be less than or equal to about 50 Å. One can use, for example, a Modulated Ion Induced ALD (MII-ALD) technique as described elsewhere (see, e.g., U.S. Pat. Nos. 6,428,859 and 6,416,822) to deposit a uniform layer of the alloying element or dopant at low substrate temperatures and with atomic layer thickness control.

Typical alloying or dopant material precursor sources are listed as follows and can generally be grouped as halides or organometallics. Some cadmium containing halide precursors are cadmium chloride, cadmium fluoride, cadmium iodide, and cadmium bromide. Some cadmium containing organometallics are cadmium acetylacetonate, cadmium acetate dihydrate, and dimethylcadmium. Some calcium containing organometallics are Ca(TMHD)$_2$ or Bis(2,2,6,6-tetramethyl-3,5-heptanedionato)calcium, calcium acetylacetonate and its hydrates, and calcium hexafluoroacetylacetonate and its hydrates. Some magnesium containing organometallic precursors are Bis(cyclopentadienyl)magnesium, Bis(ethylcyclopentadienyl)magnesium, magnesium acetylacetonate, magnesium hexafluoroacetylacetonate, and Mg(TMHD)$_2$ or Bis(2,2,6,6-tetramethyl-3,5-heptanedionato)magnesium. Some zinc containing halide precursors are zinc chloride, zinc fluoride, zinc iodide, and zinc bromide. Some zinc containing organometallics are Diethylzinc, Dimethylzinc, Zn(TMHD)$_2$ or Bis(2,2,6,6-tetramethyl-3,5-heptanedionato)zinc, zinc acetylacetonate and its hydrates, and zinc hexafluoroacetylacetonate and its hydrates.

Deposition temperatures for these alloying elements or dopants will generally be less than or equal to approximately 350° C. in order to be compatible with low-k dielectrics. An anneal (generally at less than or equal to approximately 400° C.) can be performed to enhance alloy formation post deposition. The anneal can be performed in a furnace, via RTP, or on a heated pedestal in vacuo. A reducing environment such as a hydrogen-containing environment can also be used during the anneal by flowing hydrogen gas in conjunction with an inert gas such as argon. Using a Modulated Ion Induced ALD (MII-ALD) technique, one can achieve low deposition temperatures (less than or equal to approximately 350° C., depending on the precursor).

J. In a further aspect, the invention relates to a method comprising the steps of depositing a compound comprising ML onto a substrate via an atomic layer deposition technique, wherein L comprises at least one anionic ligand; exposing the deposited compound to reductive radicals, thereby providing reduced metal by removing substantially all L and reducing substantially all M to M(0); and electrodepositing M(0) onto the deposited reduced metal. In a still further aspect, M is copper.

2. Optoelectronics

Down-scaling of device dimensions from meters long optical fibers to micrometer scale devices of an optoelectronic integrated circuit (OEIC) poses challenges in material selection and material processing, since the composition and structure of the host optical core material affects the solubility and efficiency of the luminescent centers, such as Er$^{3+}$. The ability to control the deposition and doping of materials at an atomic scale can further enable the advancement in future optoelectronics.

Figure 1:
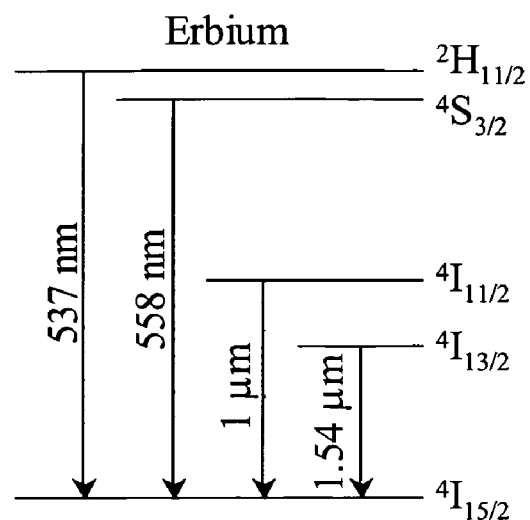
FIG. 1 shows an energy diagram of erbium ion.

In the area of optoelectronics, rare earth doping can have been introduced in wide band gap semiconductors to yield photo and electroluminescence. For example, Er$^{3+}$ is widely used as the photoluminescent center in the fabrication of optical devices such as planar optical waveguides and amplifiers. In an optical amplifier, erbium ions can be incorporated in the core of an optical waveguide. Using an external laser, the Er is excited into one of its higher lying energy levels. A sufficient pump power will lead to population inversion between the first excited state and the ground state, and a 1.54 μm signal traveling through the Er doped waveguide will induce stimulated emission from the first excited state to the ground state, resulting in signal amplification. Er is an excellent candidate since the 4f shell of Er$^{3+}$ emits light at 1.54 μm (FIG. 1), which matches closely to the minimum losses of silica based fibers used in optical telecommunications. [E. Desurvire, *Erbium-Doped Fiber Amplifiers: Principles and Applications*, John Wiley & Sons (1994); P. G. Kik and A. Polman, "Erbium-doped optical-waveguide amplifiers on silicon," Mat. Res. Soc. Bull. 23, 48 (1998)].

Moving from optical fiber to optoelectronic integrated circuit (OEIC) fabrication, the Er concentration can have to be increased to achieve the same amount of optical gain. When Er is incorporated in a solid, however, the surrounding material perturbs its 4f wave functions and causes either weakly allowed radiative transitions or Stark-splitting of the different levels. It is therefore critical to control the surrounding environment of the doped Er to optimize the device performance. Moreover, since the light guiding ability in these optical devices relies on total internal reflection, the index contrast between the core and cladding layers dominates the minimum bending radius of a waveguide. A small bend radius can be used to improve OEIC miniaturization and integration. $SiO_2$ can have traditionally been used as the host materials, with its composition continuously tuned for optimum Er solubility. However, ceramic materials with a high refractive index, such as $Al_2O_3$ and $Y_2O_3$ have attracted attention latterly, since their higher refractive index allows higher integration densities and their crystal structures are similar to that of $Er_2O_3$ and have a high Er solubility.

For Er incorporation in optical waveguides, the common conventional technologies include physical vapor deposition (PVD)[G. Z. Ran, Y. Chen, W. C. Qin, et. al. "Room-temperature 1.54 mm electroluminescence from Er-doped silicon-rich silicon oxide films deposited on n+-Si by magnetron sputtering," J. Appl. Phys. 90 (11), 5835 (2001)] molecular beam epitaxy[K. Miyahista, Y. Shiraki, et. al. "Incorporation kinetics of rare-earth elements in Si during molecular beam epitaxy," Appl. Phys. Lett. 67 (2), 235 (1995)] ion implantation[A. Kozanecki, R. J. Wilson, B. J. Sealy, et. al. "Evidence of interstitial locations of Er atoms implanted into silicon," Appl. Phys. Lett/67 913), 1847 (1995)] and metalorganic vapor deposition (MOCVD)[P. S. Andry, W. J. Varhue, F. Ladipo, et. al. "Growth of Er-doped silicon using metalorganics by plasma-enhanced chemical vapor deposition," J. Appl. Phys. 80 (1), 1996] PVD involves the physical sputtering or evaporation of a metal target, and deposits Er onto the substrate material. PVD makes the control of the composition and concentration gradient difficult and often results in the clustering of deposited materials and rough surfaces due to the energetic ion bombardment. Ion implantation can have been shown to be relatively effective in generating a relatively homogeneous Er distribution. However, ion implantation is too slow and too costly. MOCVD can be a viable alternative; however, the process typically incorporates carbon impurities that compromise the performance of these deposited films. Since the composition of the waveguide affects the Er solubility, the homogeneity of the Er incorporation could be altered negatively and thereby reduce the desired luminescence.

In one aspect, the methods of the invention employ a radical enhanced ALD (RE-ALD) technique. RE-ALD can enable atomic layer controlled manipulation of metal oxide thin films and metal doping levels, which can allow a versatile range of device fabrication at nanometer scales. The atomic layer controlled deposition can allow precision in controlling the location of the $Er^{3+}$ in the metal oxide cores.

By using a RE-ALD technique, one can achieve distinct advantages in depositing Er-doped waveguide materials in comparison to conventional techniques:

Er concentration and solubility can be important parameters for amplification. $SiO_2$ can have traditionally been used as the host materials, with its composition continuously tuned for optimum Er solubility. RE-ALD can be used to deposit metal oxides films with a higher refractive index, such as $Y_2O_3$, to yield a high index contrast, thereby accommodating higher integration densities. Note that the Er solubility in these metal oxides is typically high since they have a similar structure to that of $Er_2O_3$.

To optimize the amplification, higher Er concentration can be needed. However, as the Er concentration increases or Er ions aggregate, interaction between Er ions can have an important gain limit. This is attributed to a cooperative upconversion process where an excited Er ion de-excites by transferring its energy to a neighboring excited ion, promoting it into the $4I_{9/2}$ level. This lowers the amount of excited Er and increases the pump power needed to obtain a certain degree of inversion. RE-ALD will allow homogeneous distribution of Er in the host materials since a uniform doping layer can be deposited with atomic layer thickness accuracy.

To overcome the relatively small absorption cross section of the Er energy levels, Yb can be co-doped with Er as a sensitizer since $Yb^{3+}$ can have a large absorption cross section around 0.98 μm, and can transfer its energy non-radiatively to the $4I_{3/2}$ metastable state of $Er^{3+}$ to emit blue-green light[J. F. Philipps, T. Topfer, H. Ebendorff-Heidepriem, D. Ehrt, R. Sauerbrey, "Spectroscopic and lasing properties of $Er^{3+}$: $Yb^{3+}$-doped fluoride phosphate glasses," Appl. Phys. B 72, 399 (2001)] RE-ALD can be easily used to introduce co-dopants in the host metal oxide materials with high control, precision, and atomic scale accuracy.

The purity of the RE-ALD film is typically very good. Impurities such as —OH have their signature stretch vibration in resonance with the transition from the first excited state to the ground state of Er, and therefore limits the lifetime of the $Er^{3+}$ luminescence. RE-ALD can allow the elimination of these —OH quenching sites of Er and prevent reductions in pumping efficiency.

Figure 2:
FIG. 2 shows (a) A channel waveguide, (b) a diffused waveguide, and (c) a strip loaded waveguide structures.

To form a waveguide via prior art, ion implantation can be used to form a channel waveguide, and a diffusion process can be used to form a diffused waveguide, as shown in FIG. 2a and 1b, respectively. RE-ALD can be used to form a high quality Er-doped thin film in a strip loaded waveguide structure, as shown in FIG. 2c. This can be achieved by depositing a thin Er layer sandwiched in between metal oxide films in a strip loaded waveguide structure.

TABLE 1 below lists some of the organometallic precursors which can be used in Radical Enhanced Atomic Layer Deposition of doped optoelectronic films.

TABLE 1

Organometallic precursor sources.

Erbium

Tris(2,2,6,6-tetramethyl-3,5-heptanedionato)erbium (III), 99% (99.9%-Er) [Er(TMHD)3]

Tris(n-butylcyclopentadienyl)erbium (99.9%-Er)
Tris(cyclopentadienyl)erbium (99.9%-Er)
Tris(i-propylcyclopentadienyl)erbium (99.9%-Er)
Tris(bis trimethyl silyl amido)erbium (III), (99.9%-Er)

Silicon dioxide

Tetraethoxysilane, min. 98%
Tetramethoxysilane, 98%
Tetrabutoxysilane, min. 97%
Tris(tert-butoxyl)silanol. 99%, ($^t$BuO)$_3$SiOH Yttrium oxide Tris[N,N-bis(trimethylsilyl)amide]yttrium (III), min. 98%
Tris(2,2,6,6-tetramethyl-3,5-heptanedionato)yttrium (III), 98+% (99.9%-Y)
[Y(TMHD)3]

Tris(2,2,6,6-tetramethyl-3,5-heptanedionato)yttrium (III) triglyme adduct (99.9%-Y)
Yttrium (III) hexafluoroacetylacetonate (99.9%-Y)

In an application for optoelectronic amplifier, the $Y_2O_3$ can have superior qualities to conventionally used $SiO_2$ as a host material for optically active $Er^{3+}$ doping. Using the $Y_2O_3$, higher Er concentration ($1.3 \times 10^{20}$ $cm^{-3}$) and higher gain of 1.4 dB/cm at a lower pump power of 12 mW can be achieved compared to $4 \times 10^{19}$ $cm^{-3}$ and 0.6 dB/cm at 264 mW when p-doped $SiO_2$ was used. [H. J. van Weerden, T. H. Hoekstra, P. V. Lambeck, and Th. J. A. Popma, Proceedings ECIO '97, 169, Opt. Soc. America, Washington, D.C., (1997); K. Hattori, T. Kitagawa, M. Oguma, Y. Ohmori, and M. Horiguchi, Electron Lett. 30, 856 (1994)] The higher index of refraction (1.7-1.9) of $Y_2O_3$ compared to that of $SiO_2$ (1.46) enabled the higher degree of integration[G. Atanassov, R. Thielsch, and D. Popov, Thin Solid Films 223, 228 (1985); M. Putkonen, T. Sajavaara, L. S. Johansson, and L. Niinistö, Chem. Vapor Depos. 7, 44 (2001)] In addition, the use of $Y_2O_3$ is advantageous, because it can have the same crystal structure as $Er_2O_3$ with nearly the same lattice constant, and the ionic radius of $Y^{3+}$ is very similar to that of $Er^{3+}$. [A. Polman, J. Appl. Phys. 82, 1 (1997)]

3. Microelectronics $Y_2O_3$ is a strong candidate for high dielectric constant (k) materials to replace $SiO_2$ in complementary metal oxide semiconductor (CMOS) gate dielectric and dynamic random access memory (DRAM). This is, in part, due to its high stability on Si, large bandgap (~6 eV), high breakdown field (~4 MV/cm), and a low leakage current density as well as a reasonably high dielectric constant of 9-14. [J. Robertson, Appl. Surf Sci. 190, 2 (2002); A. Dimoulas, A. Travlos, G. Vellianitis, N. Boukos, and K. Argyropoulos, J. Appl. Phys. 90, 4224 (2001); S. Pal, S. K. Ray, B. R. Chakraborty, S. K. Lahiri, and D. N. Bose, J. Appl. Phys. 90, 4103 (2001); E. P. Gusev, E. Cartier, D. A. Buchanan, M. Gribelyuk, M. Copel, H. O, Schmidt, and C. D'Emic, microelectron. eng. 59, 341 (2001); T. Tsutsumi, Jpn. J. Appl. Phys. 9, 735 (1970)].

I. EXAMPLES

The following examples are put forth so as to provide those of ordinary skill in the art with a complete disclosure and description of how the compounds, compositions, articles, devices and/or methods claimed herein are made and evaluated, and are intended to be purely exemplary and are not intended to limit the disclosure. Efforts have been made to ensure accuracy with respect to numbers (e.g., amounts, temperature, etc.), but some errors and deviations should be accounted for. Unless indicated otherwise, parts are parts by weight, temperature is in ° C. or is at ambient temperature, and pressure is at or near atmospheric.

1. Structural Investigation of Er Coordination In $Y_2O_3$ Thin Films by X-Ray Absorption fine Structure In part, the great interest in rare earth erbium for optical applications derives from its intra 4f optical transition at 1.54 µm, enabling light amplification within the minimum loss window of silica-based optical fibers. [E. Desurvire, in Erbium-doped Fiber Amplifiers: Principles and Applications (John Wiley & Sons, Inc., New York, 1994).; D. J. Eaglesham, J. Michel, E. A. Fitzgerald, D.C. Jacobson, and J. M. Poate, Appl. Phys. Lett. 58, 2797 (1991).] In miniaturizing the Er-doped fiber amplifiers employed successfully in long distance communication (~20 m in length) into small, compact planar optical amplifiers for integrated local photonic network, one problem encountered in using the conventional $SiO_2$ as the host material is its low solubility for Er ($<1 \times 10^{18}/cm^3$). [D. J. Eaglesham, J. Michel, E. A. Fitzgerald, D.C. Jacobson, and J. M. Poate, Appl. Phys. Lett. 58, 2797 (1991).] One potential host material in replacing $SiO_2$ is $Y_2O_3$. Its high refractive index of 1.7-1.9 allows for a more compact geometry with waveguide bending radius in the micron range, in comparison to the centimeter range obtained with $SiO_2$. [E. C. M. Pennings, G. H. Manhoudt, and M. K. Smit, Electron. Lett. 24, 998 (1988).] Its relatively large bandgap (~5.6 eV) also effectively suppresses thermal quenching of Er luminescence going from cryogenic to room temperature. [S. Zhang and R. Xiao, J. Appl. Phys. 83, 3842 (1998).] Further, $Y_2O_3$ and $Er_2O_3$ have identical crystal structures with very similar lattice constants (10.60 and 10.55 Å, respectively), which in principle would allow for a much higher Er concentration to be incorporated in $Y_2O_3$, compared to that of $SiO_2$. [M. Mitric, A. Kremenovic, R. Dimitrijevic, and D. Rodic, Solid State Ionics 101, 495 (1997); A. Saiki, N. Ishizawa, N. Mizutani, and M. Kato, J. Ceramic Assoc. of Japan 93, 649 (1985).] Er has been successfully incorporated in $Y_2O_3$ with concentration as high as $10^{21}/cm^3$, using radical-enhanced atomic layer deposition (ALD). Room-temperature photoluminescence at 1.54 µm was also demonstrated for fairly thin Er-doped $Y_2O_3$ films (~500 Å) deposited at 350° C. [T. T. Van and J. P. Chang, J. Appl. Phys. 87, 011907 (2005)] No high temperature annealing above 700° C. was needed to optically activate the Er ions, a post-processing step typically required for all Er-implanted thin films. [A. Polman, J. Appl. Phys. 83, 3842 (1998).]

In optimizing the performance of these miniaturized optical amplifiers, it can be necessary to incorporate a high concentration of Er in order to obtain a reasonable gain value. Yet, when the Er concentration exceeds a certain critical value, non-radiative processes can compete with the light amplification process, thereby reducing the photoluminescence (PL) yield. For the Er:$Y_2O_3$ system, the PL yield was quenched by at least one order of magnitude when the Er doping level exceeded 8 at. %, determined by X-ray photoelectron spectroscopy (XPS). This PL quenching, also commonly referred to as concentration quenching, has been investigated for various rare earths incorporated in $SiO_2$. [E. Desurvire, in Erbium-doped Fiber Amplifiers: Principles and Applications (John Wiley & Sons, Inc., New York, 1994).; K. Arai, H. Namikawa, K. Kumata, and T. Honda, J. Appl. Phys. 59, 3430 (1986).] Without wishing to be bound by theory, it is believed that this is due to two main processes: immiscibility and ion-ion interaction. In the first case, the rare earth forms cluster, or precipitate, and thereby losing their lasing properties. In the second case, the rare earth can still be optically active but the Er inter-ionic distance is reduced at high concentration and so they can interact, providing additional channels for non-radiative decay. [E. Desurvire, in Erbium-doped Fiber Amplifiers: Principles and Applications (John Wiley & Sons, Inc., New York, 1994).] For example, in the cooperative energy upconversion, an excited Er can transfers its energy to a neighboring excited Er, promoting the acceptor to a higher energy state while demoting itself back to the ground state. In this process, at least one excitation unit is lost non-radiatively and, consequently, a much higher pump power can be required to obtain the same population inversion, which could have otherwise been achieved without cooperative upconversion. An excited Er can also transfer its energy to a nearby non-excited Er. In this case, the acceptor is promoted to the excited state while the donor demotes itself back to the ground state. The acceptor in turn can become a donor and transfer its energy to another neighboring Er that is in the ground state. This resonant energy transfer results in a random spatial migration of the excitation energy within the host. Though this process can have no detrimental effect in itself, it can be halted by quenching centers, such as impurities or defects, present in the host material. Since these ion-ion coupling processes compete with the light amplification process, they can set an upper limit on the Er concentration and ultimately the device dimension.

This example investigated which PL quenching process, Er immiscibility and/or ion-ion interaction, dominates in these Er-doped $Y_2O_3$ thin films. This requires a detailed understanding of the Er valence state, its local environment, and its proximity to one another. In this aspect, X-ray Absorption Fine Structure (XAFS) spectroscopy can be the ideal technique for investigating such classic problem, though much has been focused on Er incorporated in glasses and Si. In general, these studies indicate that the optically active Er can be optimally in the trivalent state, having highest photoluminescence efficiency when coordinating with approximately six O atoms, as in crystalline $Er_2O_3$. [F. d'Acapito, S. Mobilio, L. Santos, and Rui M. Almeida, Appl. Phys. Lett. 78, 2676 (2001).; M. A. Marcus and A. Polman, J. Non-Cryst. Solids 136, 260 (1991).; J. Michel, J. L. Benton, R. F. Ferrante, D.C. Jacobson, D. J. Eaglesham, E. A. Fitzgerald, Y. H. Xie, J. M. Poate, and L. C. Kimerling, J. Appl. Phys. 70, 2672 (1991).] Though $Y_2O_3$ has been demonstrated as an excellent laser host material for advanced optical applications, very few studies apply XAFS spectroscopy to investigate the rare earth coordination in $Y_2O_3$. [J. Dexpert-Ghys and M. Faucher, Phys. Rev. B 20, 10 (1979).; N.C. Chang, J. B. Gruber, R. P. Leavitt, and C. A. Morrison, J. Chem. Phys. 76, 3877 (1982).] The valence state and coordination symmetry of Er in $Y_2O_3$ thin films was determined with X-ray absorption near-edge spectroscopy (XANES), while extended X-ray absorption fine structure (EXAFS) provides information on the bond length, chemical identity, and coordination number for the first two coordination shells.

a. Experimental Setup

Figure 3:
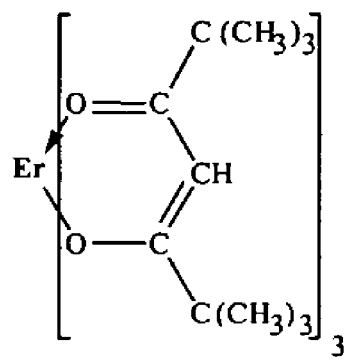
FIG. 3 shows (a) Structure of $Er(TMHD)_3$: trivalent Er chelating with three bulky β-diketonate ligands. (b) Bixbyite structure of $M_2O_3$ (M=Y or Er), viewing from the (100) plane. (c) Local cluster model showing two different symmetry sites, $C_2$ and $C_{3i}$, available for $Er^{3+}$ in $Er_2O_3$.
Figure 3:
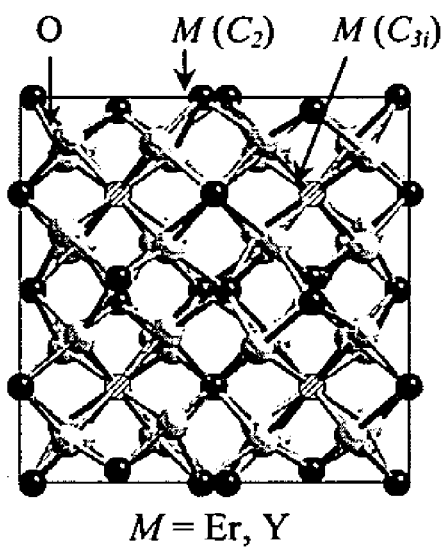
Figure 3:
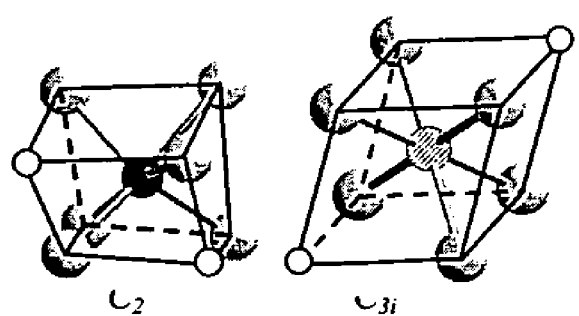

Experimental technique and processing conditions have been described in detail elsewhere and only a brief summary is provided here. [T. T. Van and J. P. Chang, J. Appl. Phys. 87, 011907 (2005); T. T. Van and J. P. Chang, Surf. Sci. In Press (2005).] Polycrystalline pure and Er-doped $Y_2O_3$ thin films of 500 A thick were deposited on Si(100) substrates at 350° C. by radical-enhanced ALD, using metal β-diketonates, Y(TMHD)$_3$ and Er(TMHD)$_3$, as the metal precursors and O radicals as oxidant. Er(TMHD)$_3$ was specifically chosen because, in this precursor form, the Er ion is already in the optically active trivalent state, having octahedral coordination with O (FIG. 3a). In addition, steric hindrance by the bulky β-diketonate ligands allows for control of the Er interionic distance, hence reducing ion-ion interaction. Incorporation of Er in $Y_2O_3$ was achieved by first depositing x cycles of $Y_2O_3$ alternating with y cycles of $Er_2O_3$. By adjusting the x:y ratio, the Er doping level was varied from 6 to 14 atomic percent, determined by X-ray photoelectron spectroscopy (XPS) and was further confirmed by Rutherford backscattering spectroscopy (RBS) analysis. X-ray diffraction patterns of the thin films revealed the preferential growth in the (111) direction with a grain size of about 21 nm, estimated from the Scherrer formula by using the full width at half maximum (FWHM) of the (222) diffraction peak.

Fluorescence-yield Er $L_{III}$-edge XAFS data for the $Er_2O_3$ and Er-doped $Y_2O_3$ thin films was acquired at the Stanford Synchrotron Radiation Laboratory (SSRL) on beam line 11-2, using a double-crystal Si (hkl) monochromator and a Ge detector cooled at 77 K. Background scattering from the incident beam was filtered with Mo, placed right before the detector. One main problem encountered in the data collection was Bragg diffraction from the Si substrate. Since a multi-channel energy-dispersive detector was used, this was eliminated by simply discarding the channels in which Bragg diffraction presented with high enough intensity that can cause spike in the raw spectra. The EXAFS for $Er_2O_3$ and $Y_2O_3$ powders were also collected as standard reference in transmission mode.

The EXAFS data reduction was performed with the SixPack program, using standard background subtraction procedure with 4-knot spline function. [Developed by S. Webb, Stanford Synchrotron Radiation Laboratory (SSRL), Stanford, Calif.] In modeling the EXAFS, theoretical backscattering amplitudes and phase shifts up to 5-A radial distance from the center absorbing Er were first calculated using the IFEFFIT 1.2.7 program. [Developed by M. Newville, Consortium for Advanced Radiation Sources (CARS), University of Chicago, Ill.] Results from the calculations were used directly to fit unsmoothed EXAFS spectra obtained after the data reduction. Specifically, the fitting was done by first calculating a theoretical EXAF spectrum using the following equation: [E. A. Stern, Theory of EXAFS, X-ray Absorption: Principles, Applications, and Techniques of EXAFS, SEXAFS, and XANES, edited by D.C. Koningsterger and R. Prins (Wiley, 1988), p. 3-51]

$$\chi(k) = S_o^2 \sum_{i=1}^{n} \frac{N_i F_i(k, R_i)}{k R_i^2} \exp\left(\frac{-2R_i}{\lambda(k, R_i)}\right) \exp(-2\sigma_i^2 k_i^2) \sin[2kR_i + \phi_i(k, R_i) + \phi_o(k)]$$

with an assumed set of structural parameters, which were then allowed to vary until the best fit was achieved. In the above equation, the absorption coefficient written in terms of wave number k is a function of the amplitude reduction factor $S_o^2$ determined empirically from the model compound $Er_2O_3$, the mean free path of elastically-scattered photoelectron, the coordination number $N_i$ of atoms type i, each at a distance $R_i$ from the center absorbing atom with a Debye-Waller factor $\sigma_i$ to account for variation in $R_i$ due to disorder and thermal motion. The backscattering amplitude and phase shift from atom i is $F_i$ and $\phi_i$, respectively. In this study, only single collinear scatterings were considered and the fitting was done in k space over the same k range from 3 to 10 Å$^{-1}$ to facilitate comparison. In addition, the first and second coordination shells were used simultaneously in the fit, with the best fits derived iteratively, judging visually and from the residual factor R. Structural parameters extracted from these best fits are summarized in Table 2. The derived bond lengths are accurate to ±0.01 and ±0.03 A for the first and second coordination shells, respectively.

Table 2 lists structural parameters obtained from EXAFS fittings of $Er_2O_3$ and Er-doped $Y_2O_3$ thin films. Results from fitting of $Y_2O_3$ and $Er_2O_3$ powders are also shown to demonstrate the capability of SixPack and IFEFFIT. Since the bond resolution of EXAFS is ~0.04 Å, $R_{Y-Y1}$ and $R_{Y-Y2}$ were set to $R_{Er-Er1}$ and $R_{Er-Er2}$ in the fitting of Er-doped $Y_2O_3$ thin films.

| | ICSD | | $Y_2O_3$ | $Er_2O_3$ | $Er_2O_3$ | Er-doped (6 at. %) | Er-doped (14 at. %) |
|---|---|---|---|---|---|---|---|
| Parameter | $Y_2O_3$ | $Er_2O_3$ | powder | powder | thin film | $Y_2O_3$ | $Y_2O_3$ |
| $R_{Er-O}(\pm 0.01)$ | 2.277 | 2.256 | 2.26 | 2.25 | 2.24 | 2.24 | 2.25 |
| | 2.335 | 2.334 | 2.33 | 2.33 | 2.32 | 2.32 | 2.33 |
| $\sigma_O^2(\pm 0.001)$ | — | — | 0.007 | 0.007 | 0.0062 | 0.0058 | 0.0056 |
| $R_{Er-Er1}(0.02)$ | — | 3.496 | — | 3.50 | 3.50 | 3.48 | 3.51 ± 0.02 |
| $\sigma_{Er1}^2(\pm 0.004)$ | — | — | — | 0.0047 | 0.004 | 0.006 | 0.004 |
| $R_{Y-Y1}(\pm 0.006)$ | 3.518 | — | 3.525 | — | — | — | — |
| $\sigma_{Y1}^2(\pm 0.005)$ | — | — | 0.0058 | — | — | — | — |
| $R_{Er-Er2}(\pm 0.03)$ | — | 3.985 | — | 3.97 | 3.96 | 3.96 | 3.99 |
| $\sigma_{Er2}^2(\pm 0.004)$ | — | — | — | 0.007 | 0.006 | 0.006 | 0.007 |
| $R_{Y-Y2}(\pm 0.008)$ | 4.000 | — | 4.002 | — | — | — | — |
| $\sigma_{Y2}^2(\pm 0.0007)$ | — | — | 0.0068 | — | — | — | — |
| $F_{occ}(\pm 0.32)$ | 1 | 1 | 0.72 | 0.72 | 0.72 | 0.72 | 0.77 |

EXAFS Results b. Structures and EXAJFS of Bulk $Y_2O_3$ and $ER_2O_3$

The crystal structures of $Er_2O_3$ and $Y_2O_3$ have been studied extensively using various techniques, including X-ray powder diffraction, neutron powder diffraction, and electron diffraction. [P. A. Tanner, X. Zhou, and F. Liu, J. Phys. Chem. A 108, 11521 (2004); M. Faucher and J. Pannetier, Acta Cryst. B 36, 3209 (1980); F. Hanic, M. Hartmanova, G. G. Knab, A. A. Urusovskaya, and K. S. Bagdasarov, Acta Cryst. B 40, 76 (1984).; R. Miida, F. Sato, M. Tanaka, H. Naito, and H. Arashi, J. Appl. Cryst. 30, 272 (1997).; Inorganic Crystal Structrue Database (ICSD), Version 1.3.3, National Institute of Standards & Technology (NIST) and Fachinformationszentrum Karlsruhe (FIZ), 2004] Both oxides were found to crystallize in a C-type (bixbyite) structure, belonging to space group $Ia3-T_h^7$, $Z=16$. An illustrative unit cell for this structure is shown in FIG. 3b, viewing from the (100) plane. It consists of 32 metal ions, each coordinated with six O. The complexity of this bixbyite structure derives from the two nonequivalent symmetry sites available for the metal ions. Specifically, 24 of the 32 metal ions reside in the $C_2$ symmetry site where the two missing O lie on the face diagonal, resulting in two slightly different metal-oxygen bonds. The remaining 8 metal ions are in the $C_{3i}$ ($S_6$) symmetry site with the two missing O lie on the body diagonal, yielding six equivalent metal-oxygen bonds. FIG. 3c shows a local cluster of $Er_2O_3$, illustrating these two symmetry sites for $Er^{3+}$. The Er—O bond lengths for the $C_2$ site are 2.246 and 2.334 Å, whereas that for the $C_{3i}$ sites is 2.263 Å. Since EXAFS only reveals the average local structure of $Er^{3+}$ with a bond length resolution of ~0.04 A, these differences in the cationic site symmetry ($C_2$:.$C_{3i}$=3:1) and the Er—O bond length are manifested as a split oxygen shell, with an average coordination of 4.5 O at 2.256 Å and 1.5 O at 2.334 Å. Consequently, the second shell is also a split shell, consisting of 6 $Er^{3+}$ at 3.496 Å and 6 $Er^{3+}$ at 3.985 Å, yielding a total coordination number of 12. Due to their very similar ionic radii ($Y^{3+}$=0.90 and $Er^{3+}$=0.89 Å for CN=6), the Y—O bond lengths are very similar to those of Er—O and the values are quoted in Table 2. [CRC Handbook of Chemistry and Physics, 3rd edition, edited by David R. Lide (CRC Press, Boca Raton, Fla., 2001), Chap. 12, p. 14-16.]

Figure 4:
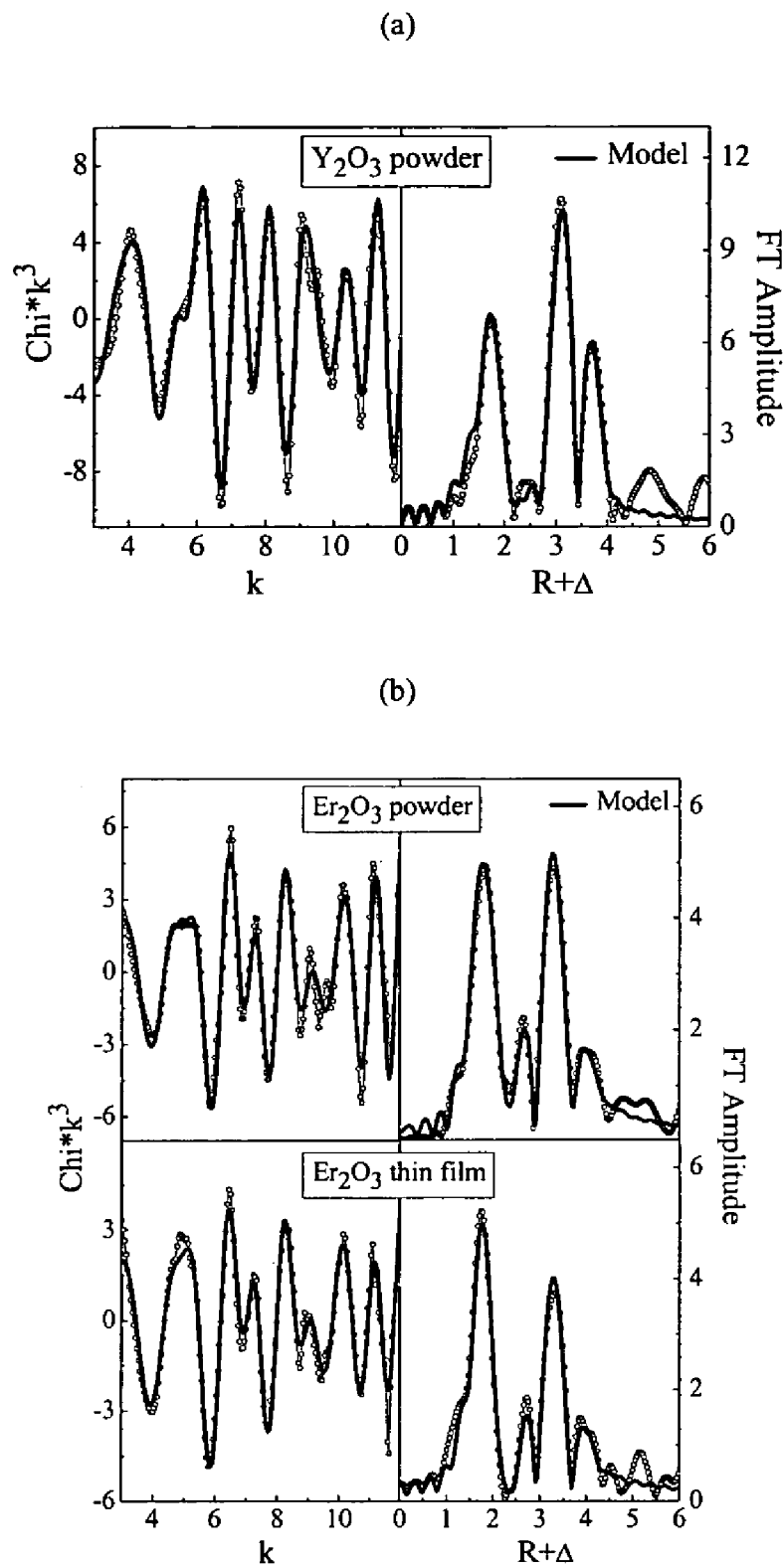
FIG. 4 shows EXAFS and FT spectra of (a) $Y_2O_3$ powder, (b) $Er_2O_3$ powder (top) and thin film (bottom), serving as model compounds for structural analysis.

To verify the capability of FEFF calculations and also to establish a structural reference required for determination of the chemical identity, coordination numbers, and bond lengths in the Er-doped $Y_2O_3$ thin films, EXAFS analysis was performed on the $Y_2O_3$ and $Er_2O_3$ powder. Their $k^3$-weighted EXAFS and the corresponding Fourier transform (FT) spectra, uncorrected for phase shift, are shown in FIG. 4, a & b (top), respectively. Starting with the known structure of $Er_2O_3$ model compound, the backscattering amplitudes and the phase shifts were calculated up to 5-Å radial distance from the absorbing Er center and the results are then used to fit the data up to the second shell (~4.0 A). Specifically, the following single scattering paths were defined:

$1^{st}$ shell: Er-$O_j$ path described by a bond length $R_{Er-Oj}$ with a Debye-Waller factor $\sigma_O^2$.

$2^{nd}$ shell: Er-$Er_k$ path at a bond length of $R_{Er-Erk}$ with a Debye-Waller factor $\sigma_{Erk}^2$.

In this case, two single scattering paths (I 1 and 2) at 2.26 and 2.33 Å were used to describe the first split O shell. Interactions contributed from the second shell were also described by two scattering paths at $R_{Er-Er1}$=3.50 Å and $R_{Er-Er2}$=3.99 Å, each with a Debye-Waller factor of $\sigma_{Er1}^2$ and $\sigma_{Er2}^2$. The structural parameters were then allowed to refine by letting R's, $\sigma_O^2$ and $\sigma_{Erk}^2$ adjust until a best fit with low residual R was obtained. As shown in FIG. 4b, top left (solid line), a fairly good fit of the oscillation frequency was obtained with this model. However, the oscillation amplitudes were underestimated slightly at k>9 Å$^{-1}$. This comes from the fact that contributions from higher order shells at $R_i$>4.0 Å were also present but were not considered in the fit, evidenced in the FT spectrum shown in FIG. 4b (top right). The extracted bond lengths and coordination numbers for the first and second shells are in excellent agreement with the reported values. Specifically, the first split O shell was found to be at distances of 2.249 and 2.327 Å with the Debye-Waller factor $\sigma_O^2$ of 0.0058 Å$^2$, comparable to those reported in literature for the Er—O bond. [M. A. Marcus and A. Polman, J. Non-Cryst. Solids 136, 260 (1991).; C. Maurizio, F. D' Acapito, F. Priolo, G. Franzo, F. lacona, E. Borsella, S. Padovani, and P. Mazzoldi, Optical Materials 27, 900 (2005)] The $Er^{3+}$ second neighbors were situated at 3.502 Å, showing a slightly lower $\sigma_{Er1}^2$ value of 0.0045 $\in^2$, compared to 0.0064 Å$^2$ for the more distance shell at 3.97 Å. From this fitting, the $Er^{3+}$ amplitude reduction factor $S_o^2$ was determined to be 0.91, fairly reasonable for heavy elements. For example, typical $S_o^2$ values for heavy elements, such as Y, La, Nd, and Pb, are 1, 0.935, 0.90, and 1.0, respectively. [M. Matsuura, K. Asada, K. Konno, and M. Sakurai, J. Alloys & Compounds 390, 31 (2005); G. Mountjoy, J. M. Cole, T. Brennan, R. J. Newport, G. A. Saunders, and G. W. Wallidge, J. Non-Cryst. Solids 279, 20 (2001); J. R. Bargar, G. E. Brown Jr., and G. A.

Parks, Geochimica et Cosmochimica Acta 61, 2617 (1997)] The $S_o^2$ value for $Er^{3+}$ in the following analysis was set at 0.91.

Structure parameters obtained from the EXAFS modeling of the $Y_2O_3$ powder are also in excellent agreement with the reported values, further confirming the capability of SixPack and FEFF programs. The best fit to the EXAFS and the corresponding FT spectrum of $Y_2O_3$ powder is shown in FIG. 4a, with the results summarized in Table 2. The oscillation amplitudes at k>8 Å$^{-1}$ was underestimated, again due to contributions from higher order shells that were not taken into account in the fitting.

C. EXAFS Analysis of the $Er_2O_3$ Thin Film

To further justify this fitting methodology for thin film analysis, similar approach used in the modeling of bulk $Er_2O_3$ was taken to examine the local structure of Er in the $Er_2O_3$ thin film. Overall, a high degree of similarity in the Er local structure was observed between the bulk and the thin film, evidenced by their EXAFS and the corresponding FT spectra (FIG. 4b). Comparing the relative FT amplitudes, the $Er_2O_3$ thin film exhibited a 20% amplitude reduction for the second shell, indicating a lower coordination number in contrast to that of bulk $Er_2O_3$. In order to obtain a more quantitative result, a variable $F_{occ}$, denoting the Er occupancy fraction, was introduced in modeling the Er—$Er_k$ scattering path, with $F_{occ}=1$ for fully coordinated Er second shell (12 neighbors). The best fit obtained by considering only the first and second shells is shown in FIG. 4b, bottom (solid line). Similar to bulk $Er_2O_3$, Er in $Er_2O_3$ thin film was found to be fully oxidized, coordinating octahedrally with O at 2.237 and 2.315 Å. The $\sigma_O^2$ value is also comparable to that found for bulk $Er_2O_3$ (0.0065 Å$^2$). The split Er second shell was located at 3.504 and 3.97 Å, also consistent with the bulk values. The Er occupancy fraction $F_{occ}$ for the second shell is 0.72, corresponding to an average coordination number of ~8-9, in contrast to 12 determined for bulk $Er_2O_3$. This low coordination number can be attributed to the effect of steric hindrance by the bulky metal β-diketonate precursors employed in the thin film synthesis. Specifically in radical-enhanced ALD, the Er incorporation is relied on sequential self-limiting surface reactions of $Er(TMHD)_3$ with O radicals, which have been investigated in detail in our previous studies. [T. T. Van and J. P. Chang, Appl. Surf. Sci. 246, 250 (2005)] The process basically starts with self-saturated adsorption of $Er(TMHD)_3$ on surface reactive sites, most likely are surface terminated OH—(Er—OH— bonding). This is followed by an exposure to O radicals where the bulky β-diketonate ligands are removed and reactive sites are regenerated for subsequent precursor adsorption, thus repeating the ALD cycle. During the precursor adsorption step, not all reactive sites on the surface are accessible to precursor adsorption due to steric hindrance of the ligand covering part of the surface (FIG. 3a). Consequently, some Er—OH bonding sites are left buried within the film, resulting in these Er having H instead of Er (Er—O—Er bonding) as a second nearest neighbor. Accordingly, the observed FT amplitude for the second shell is diminished, since H essentially acts as a vacancy and does not contribute to the EXAFS. It is also worth noting that effects due to nanocrystal size were also investigated, and its contribution to the low second shell's coordination was negligible. By counting the total surface Er which can have no Er second neighbor in a 21-nm $Er_2O_3$ crystal, the Er surface:bulk ratio was determined to be 0.03, thus setting an upper limit on the average coordination number for the second shell at ~11.4 instead of 12, fairly insignificant.

d. Er Coordination in $Y_2O_3$ Thin Films

Figure 5:
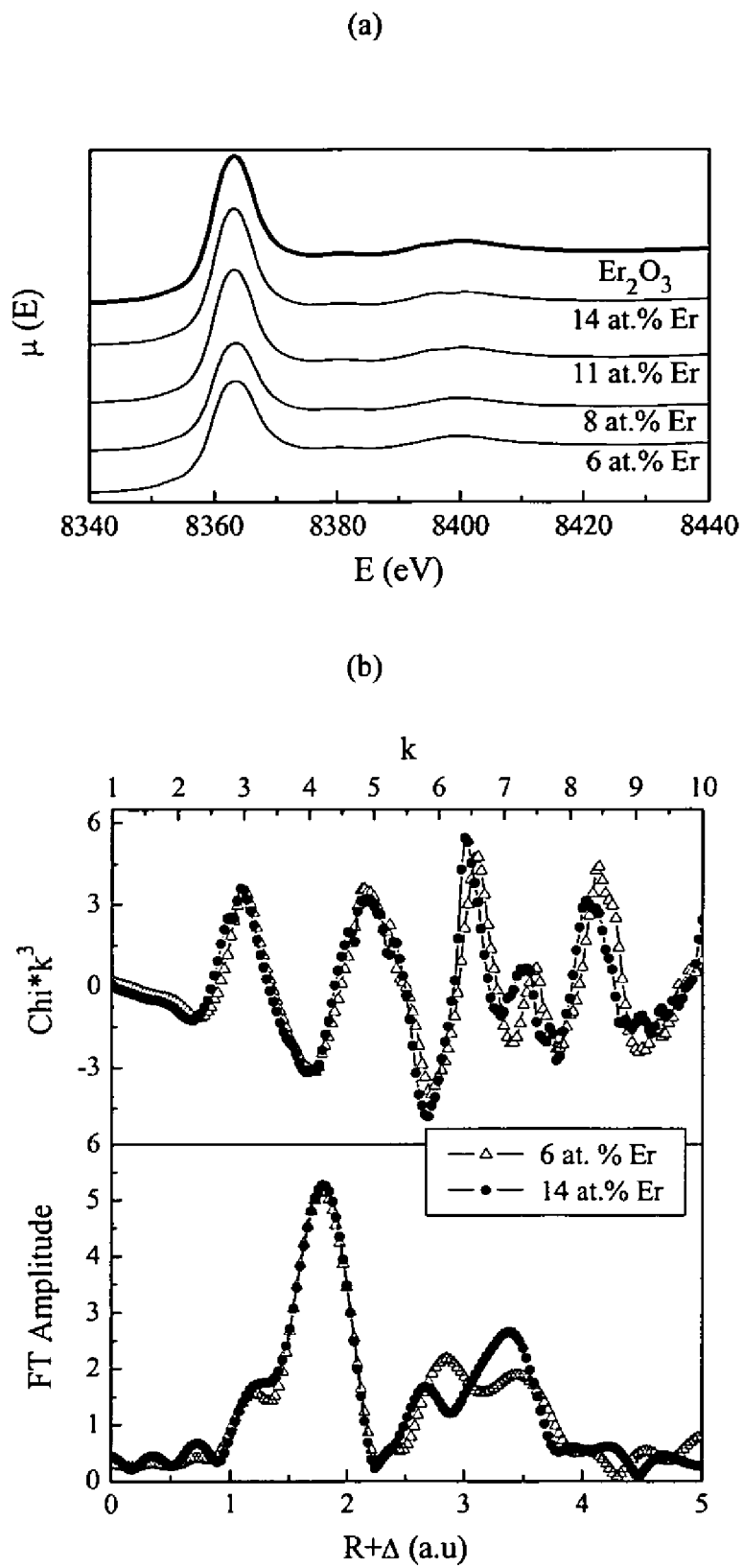
FIG. 5 shows (a) XANES spectra (offset for clarification) of Er-doped $Y_2O_3$ thin films, with Er concentration varying from 6 and 14 at. % Er. The XANES spectrum of $Er_2O_3$ was also shown for comparison. (b) Corresponding EXAFS and FT spectra of the $Y_2O_3$ thin films doped with 6 and 14 at. % Er.

Since Er optimally needs to be in the trivalent state to be optically active, its formal oxidation state was investigated by examining the XANES spectra of the $Y_2O_3$ thin films doped with various Er concentration, ranging from with 6 and 14 at. % Er. PL quenching was observed when the Er doping level exceeded 8 at. %. Shown in FIG. 5a are the XANES spectra for these thin films, extending from the Er $L_{III}$ absorption edge at 8658 eV to 8440 eV. The XANES for the pure $Er_2O_3$ thin film is also shown for comparison. Qualitatively, the curves are almost identical. Judging from the shape and the position of the absorption edge, the XANES clearly indicates that Er in all samples indeed is in the optically active trivalent state with octahedral coordination, as of Er in $Er_2O_3$. A difference in the valence state or small changes in the coordination symmetry, i.e. distorted/non-distorted octahedral vs. tetrahedral, would result in a significant difference in the XANES spectra. These XANES results further confirm that incorporation of optically active $Er^{3+}$ in $Y_2O_3$ at low temperature of 350° C. can be achieved with radical-enhanced ALD. [T. T. Van and J. P. Chang, J. Appl. Phys. 87, 011907 (2005)] Consequently, beautiful room-temperature photoluminescence spectra can be obtained without having to anneal the samples at temperatures above 700° C. to optically activate the Er, which is typically required for Er-implanted thin films.

Shown in FIG. 5b (top) are the k$^3$-weighted EXAFS of the $Y_2O_3$ thin films doped with 6 and 14 at. % Er, representing samples with high and low photoluminescence yield. In general, their EXAFS showed similar oscillation frequency and amplitude up to k of ~6 Å$^{-1}$. Since these oscillations at low k arose mainly from Er interactions with the first nearest neighbors, this indicates that the local chemical environment of Er in these two thin films is similar up to the first coordination shell. This is further substantiated by their corresponding FT spectra, shown in FIG. 5b, bottom. Taking into account a phase shift of −0.45 A, determined empirically from the $Er_2O_3$ model compound (FIG. 4b, top), the radial distance of the first peak indicates that Er can have O for the first nearest neighbor. For k>6 Å$^{-1}$ where the EXAFS also had contribution from the second coordination shell, the oscillation frequency of these two samples are slightly different, indicating a different Er second nearest neighbor environment.

Figure 6:
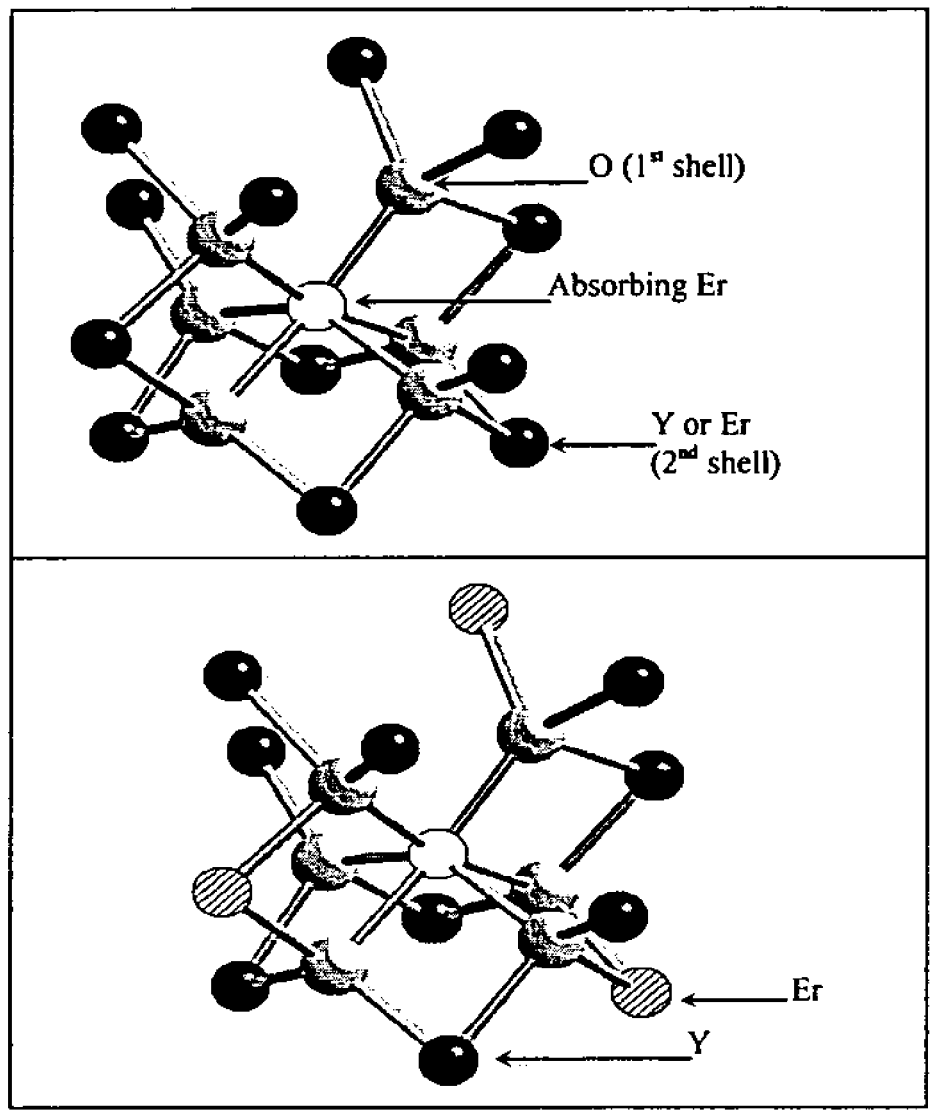
FIG. 6 shows three 4-Å local clusters representing three different $Er^{3+}$ configurations in $Y_2O_3$ thin films: a center absorbing $Er^{3+}$ surrounded by 6 O for the first coordination shell, having all $Er^{3+}$ or all $Y^{3+}$ (top), or a mixture of $Er^{3+}$ and $Y^{3+}$ (bottom) as second nearest neighbors.

To get further insight into the local chemical environment of $Er^{3+}$ incorporated in the $Y_2O_3$ thin films, such as the coordination number and the identity of the second nearest neighbors, three different 4-Å local cluster models were constructed, corresponding to three different possible Er configurations in the thin film. Specifically with the first shell to be O, $Er^{3+}$ in the Er-doped $Y_2O_3$ thin films can have all $Er^{3+}$, all $Y^{3+}$, or a mixture of $Y^{3+}$ and $Er^{3+}$ for the second coordination shell. In the first model where $Er^{3+}$ is the second nearest neighbor, the cluster model consisted of the center absorbing $Er^{3+}$ surrounded by a split O shell at two distances of 2.256 and 2.334 Å. The second Er shell is also split at 3.496 and 3.985 Å. A pictorial view of this cluster is shown in FIG. 6 (top). Alternatively in the second model, a similar cluster was used but with $Y^{3+}$ replacing all $Er^{3+}$ in the second coordination shell.

In the third model where $Er^{3+}$ can have both $Y^{3+}$ and $Er^{3+}$ as second nearest neighbors, the challenge is to simulate an Er-doped $Y_2O_3$ structure for FEFF calculations. When incorporating $Er^{3+}$ in the $Y_2O_3$ lattice, it is expected that $Er^{3+}$ ions substitute for $Y^{3+}$ ions naturally due their very similar ionic size and identical valence state, bonding, and coordination characteristics. In this case, typical problems encountered in doped materials, such as lattice distortion and vacancy formation due to charge compensation, are essentially avoided because of this almost perfect match between $Er^{3+}$ and $Y^{3+}$. Furthermore, $Er^{3+}$ enters both $C_2$ and $C_{3i}$ sites randomly during thin film deposition. Such random placement of the cations in bixbyite structures can have been verified for various rare earths. [N.C. Chang, J. B. Gruber, R. P. Leavitt, and C. A. Morrison, J. Chem. Phys. 76, 3877 (1982).] Consequently, the Er-doped $Y_2O_3$ structure can be simulated by arbitrarily replacing $Y^{3+}$ with $Er^{3+}$ and still being able to reserve the structure, coordination symmetry, and bond distances to within experimental errors. For example, to simulate a crystal structure of Er-doped (10 at. %) $Y_2O_3$ from the known $Y_2O_3$ structure, 8 of the 32 $Y^{3+}$ were randomly replaced with $Er^{3+}$. A 4-Å local cluster isolated from this structure would consist of an absorbing $Er^{3+}$ center surrounded by 6 O for the first coordination shell, and $Y^{3+}$ and $Er^{3+}$ mixed in a ratio of 9:3 as the second nearest neighbors (FIG. 6, bottom). The FEFF results calculated for different clusters with various $Y^{3+}$:$Er^{3+}$ ratios were used directly in the thin film fitting.

Figure 7:
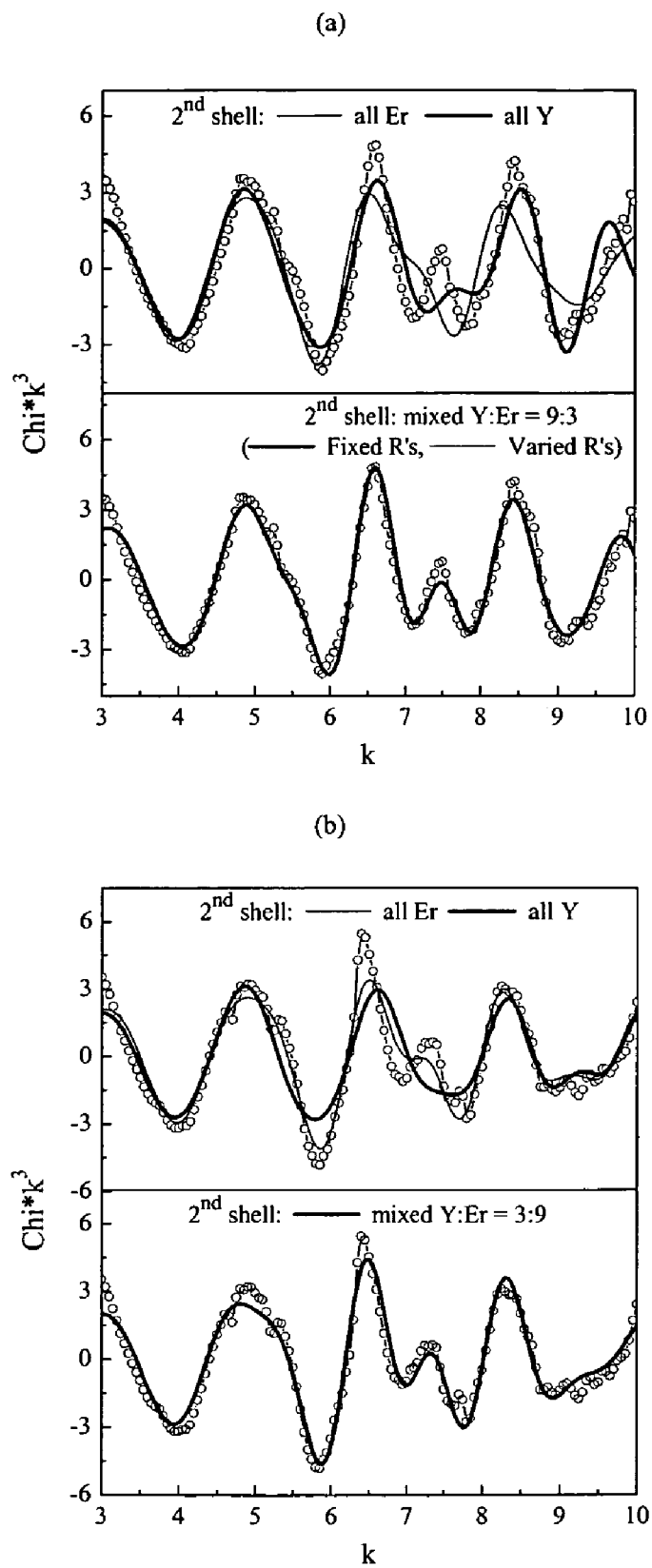
FIG. 7 shows best fits to EXAFS data for the $Y_2O_3$ thin films doped with (a) 6 at. % Er and (b) 14 at. % Er. The first two models assuming the second shell consists of all $Er^{3+}$ or all $Y^{3+}$ failed to describe the EXAFS oscillations at k>6 (top); best fits to EXAFS data were only achieved with the third model, which assumed the second shell to be a mixture of both $Y^{3+}$ and $Er^{3+}$. The mixing ratio was confirmed by XPS compositional analysis.

For each model, the best fit to the EXAFS for the Er-doped (6 at. %) $Y_2O_3$ thin film is shown in FIG. 7a. By first imposing constraints on the bond distances, the best fit of the first model agreed with the EXAFS up to k~6 Å$^{-1}$, again mainly from the first O shell, but failed to describe the oscillations at higher k (FIG. 7a (top), light solid line). This indicates that the second nearest neighbors are not all $Er^{3+}$, in which case the local environment of $Er^{3+}$ in these Er-doped $Y_2O_3$ thin films can be similar to that of $Er^{3+}$ in $Er_2O_3$ up to at least the second shell. Alternatively in the second model where the second coordination shell consisted of all $Y_{3+}$, the best fit to the EXAFS data was improved slightly but still was inadequate to describe the oscillations at k>6 (FIG. 7a (top), heavy solid line). From qualitative comparison of the fits at k>6, the first model obviously underestimated the EXAFS characteristic frequency and amplitude while a high degree of similarity between the second model and the EXAFS data was observed. Therefore, a better model for this thin film would be the third model where the second shell consisted of both $Y^{3+}$ and $Er^{3+}$, with $Y^{3+}$ present in a higher concentration. First, the bond lengths were constrained while o's, $N_i$, and $F_{occ}$ were allowed to vary. In this case, an excellent fit was obtained at both high and low k for an $Y^{3+}$:$Er^{3+}$ ratio of 9:3, yielding a coordination number of 6 for the first O shell and 8-9 for the second shell ($F_{occ}$~0.73) (FIG. 7a, bottom). Such noticeable effect on the fit, derived from just having the second shell mixed with $Y^{3+}$ and $Er^{3+}$, is due to the great sensitivity of the EXAFS amplitude and phase shift to the identity of the backscattering atoms, allowing for the differentiation between $Y^{3+}$ and $Er^{3+}$ that are differed by 29 atomic numbers. The $Y^{3+}$:$Er^{3+}$=9:3 atomic ratio that yielded the best fit was further confirmed by XPS analysis, from which the atomic percent of Y and Er was determined to be 18 and 6, respectively. When the distances $R_i$'s to the first and second shells were allowed to vary, no distinguishable variation in the fit was observed and thus, provided further confidence on the model and the fitting results (FIG. 7a, bottom). These results substantiate that $Er^{3+}$ is indeed in the optically active trivalent state, octahedrally coordinated by six O. More importantly, $Er^{3+}$ is completely miscible in the $Y_2O_3$ matrix, showing no evidence of $Y_2O_3$ and $Er_2O_3$ phase segregation. There is also no indication of Er-Er coordination within 4-Å proximity.

The first and second models failed to describe the EXAFS for the Er-doped (14 at. % Er) $Y_2O_3$ sample. On the contrary to the 6 at. % sample, the local structure of $Er^{3+}$ in the 14 at. % sample showed a closer resemblance to that of $Er^{3+}$ in $Er_2O_3$, evidenced by a better agreement between the first model and the data, in comparison to the second model (FIG. 7b, top). Yet, the best fit can be achieved with the third model when it was assumed that the second shell contained both $Y^{3+}$ and $Er^{3+}$, this time mixed in an atomic ratio of 3:9 and was confirmed by XPS compositional analysis (FIG. 7b bottom).

Figure 8:
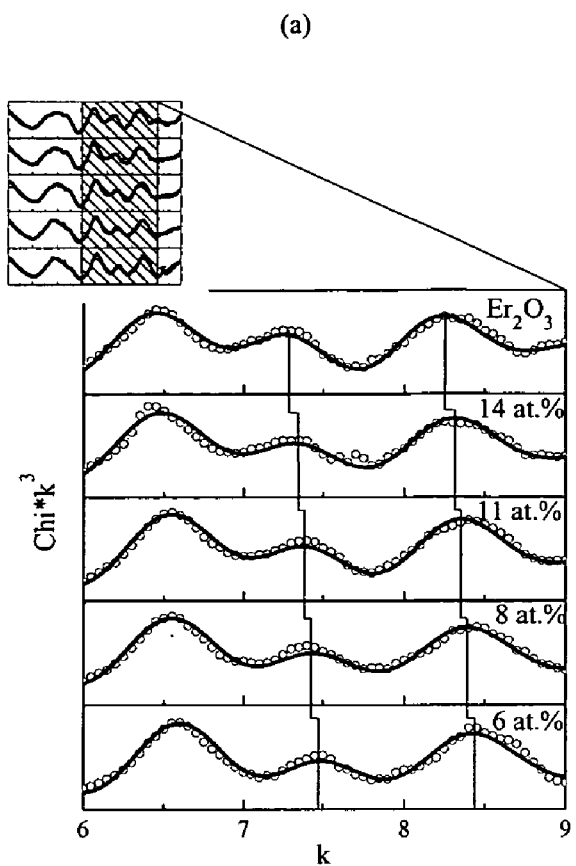
FIG. 8 shows (a) EXAFS spectra and the corresponding best fits (solid lines) for the Er-doped $Y_2O_3$ thin films, with the $Er^{3+}$ concentration varying from 6 to 14 at. %. The EXAFS spectrum and its best fit for the $Er_2O_3$ thin film is also shown for comparison. (b) ρ's and $F_{occ}$ are relatively independent of $Er^{3+}$ concentration, indicating no substantial distortion to the $Er^{3+}$ local environment with increasing $Er^{3+}$ concentration.
Figure 8:
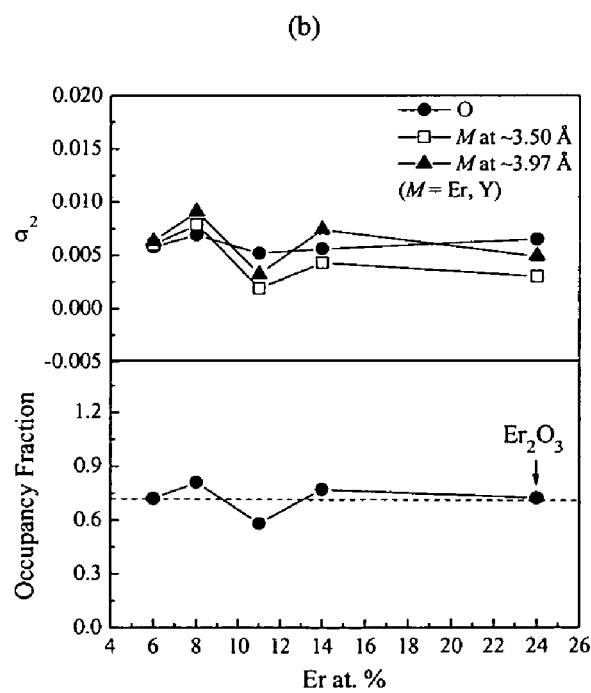

Increasing $Er^{3+}$ concentration implied more $Er^{3+}$ substituting $Y^{3+}$ in the second coordination shell. This replacement of $Y^{3+}$ by $Er^{3+}$ was evidenced in the EXAFS of the Er-doped $Y_2O_3$ thin films, with the Er concentration varying from 6 to 14 at. % (FIG. 8a, inset). Overall, the EXAFS spectra of these thin films are very similar to that of pure $Er_2O_3$, indicating that the average local coordination of $Er^{3+}$ in $Y_2O_3$ is similar to that of $Er^{3+}$ in $Er_2O_3$, independent of $Er^{3+}$ concentration. Substitution of $Y^{3+}$ by $Er^{3+}$ in the second coordination shell was revealed by a more detailed look at these EXAFS at k>6.5. While the oscillation frequency at k<6.5 is roughly identical for all five samples, there is a subtle but systematic difference in the oscillation frequency at k>6.5, resembling more that of pure $Er_2O_3$ with increasing $Er^{3+}$ concentration (FIG. 8a). The $\sigma^2$ values for all $R_i$'s were not strongly affected by changes in the $Er^{3+}$ concentration, indicating no substantial distortion to the local structure as the $Er^{3+}$ concentration increased (FIG. 8b, top). The second shell's occupancy fraction $F_{occ}$ was found to remain relatively constant with the $Er^{3+}$ concentration at 0.72±0.36. This low coordination for the second shell is again attributed to the effect of steric hindrance by the bulky precursor ligands, resulting in Er—OH bonds being buried within the film.

Since there is no indication of Er-Er coordination in both samples doped with 6 and 14 at. % Er, it is concluded that the PL quenching observed in samples with Er concentration exceeding 8 at. % is not due to Er immiscibility in $Y_2O_3$ but likely due to Er ion-ion interaction. When the Er concentration is sufficiently small, the ions are evenly distributed in the $Y_2O_3$ matrix with relatively large inter-ionic distances, preventing any ion-ion interaction. Consequently, the PL yield is relatively high in the absence of these competing processes. As the $Er^{3+}$ concentration increases, there is typically more $Er^{3+}$ available for replacing $Y^{3+}$ in the second shell. Thus, there is more $Er^{3+}$ within a 4-Å proximity of each other that they can interact, resulting in cooperative energy upconversion or energy migration. Effects of these alternative pathways for non-radiative decay are diminution of the PL yield.

Photoluminescence quenching due to ion-ion interaction has been investigated thoroughly for Er-doped $SiO_2$. [E. Desurvire, in Erbium-doped Fiber Amplifiers: Principles and Applications (John Wiley & Sons, Inc., New York, 1994).] The critical inter-ionic distance between two $Er^{3+}$ in $SiO_2$ was determined to be in the range of 4.5-5.9 Å and below which ion-ion interaction became significant. [Emmanuel DeSurvire, Erbium-doped Fiber Amplifiers: Principles and Applications (John Wiley & Sons, Inc, New York, 1994), Chap. 4, p. 291] These findings and the results discussed herein all indicate that, in order to prevent ion-ion interaction, the $Er^{3+}$ inter-ionic distance should be greater than 4 Å; in other words, no $Er^{3+}$ should have another $Er^{3+}$ as a second nearest neighbor. This sets an upper limit on the $Er^{3+}$ concentration in $Y_2O_3$ host at 8 per unit cell, estimated by systematically removing $Er^{3+}$ in the $Er_2O_3$ unit cell such that there is no $Er^{3+}$ second coordination (no direct Er—O—Er bonding). This corresponds to about $6 \times 10^{21}/cm^3$, at least two factors higher than the critical $Er^{3+}$ concentration in $SiO_2$ ($1-2.6 \times 10^{21}/cm^3$). [J. R. Bargar, S, N. Towle, G. E. Brown, Jr., and G. A. Parks, J. Colloid & Interface Sci. 185, 473 (1997)] This lower upper bound for the $Er^{3+}$ concentration in $SiO_2$ system is due to its low solubility for $Er^{3+}$. To screen their electric charge at high concentration, $Er^{3+}$ tends to cluster around the limited non-bridging O in the $SiO_2$ network, and in that way forming precipitate and losing their lasing properties. Thus, in using $SiO_2$ as a host material, it is typically necessary to preserve the $Er^{3+}$ inter-ionic distance to be greater than the critical distance as well as to keep the $Er^{3+}$ concentration below the critical level in order to prevent cluster formation.

E. CONCLUSION

The Er coordination in polycrystalline $Y_2O_3$ thin films was investigated by X-ray absorption fine structure (XAFS) spectroscopy. Incorporation of Er with concentration varying from 6 to 14 at. % was accomplished by radical-enhanced atomic layer deposition at 350° C. From the Er $L_{III}$ edge X-ray absorption near-edge spectroscopy (XANES), Er was found to be in the optically active trivalent state with octahedral coordination. Excellent fits to the extended X-ray absorption fine structure (EXAFS) data were achieved, provided that the first and second coordination shells were modeled as split shells, as in $Er_2O_3$ model compound. Specifically, it was found that $Er^{3+}$ in all samples can have octahedral coordination by O at 2.24±0.01 and 2.32±0.01 Å for the first coordination shell, resembling that of $Er^{3+}$ in $Er_2O_3$. Best fits to the EXAFS were only achieved when the second coordination shell was assumed to consist of both $Y^{3+}$ and $Er^{3+}$, with the mixing ratio confirmed by X-ray photoelectron spectroscopy (XPS) analysis. The results indicate that $Er^{3+}$ is completely miscible in the $Y_2O_3$ matrix, and its average local structure does not depend on its concentration in this matrix. No Er-Er coordination within 4-Å proximity was observed, indicating the photoluminescence quenching observed in samples doped with more than 8 at. % Er is due to Er ion-ion interaction and not Er immiscibility in $Y_2O_3$. As the $Er^{3+}$ doping level increased, there were more $Er^{3+}$ replacing $Er^{3+}$ in the second coordination shell, making possible the effects of cooperative upconversion and energy migration. The presence of such ion-ion interactions set an upper limit on the $Er^{3+}$ concentration in $Y_2O_3$ thin films at $6\times10^{21}/cm^3$.

2. Radical-Enhanced Atomic Layer Deposition of $Y_2O_3$ Via a β-Diketonate Precursor and O Radicals O radicals not only effectively remove β-diketonate ligands but also create reactive sites for precursor adsorption. O radicals were used with a β-diketonate precursor to deposit $Y_2O_3$ thin films by radical-enhanced ALD, and these results are compared to a previous study on $Er_2O_3$. [L. S. Santos, G. P. Petrucelli, and C. Airoldi, Polyhedron 18, 969 (1999).] Both of these metal oxides are considered as potential gate dielectrics in complementary metal oxide semiconductor (CMOS) devices. [M. P. Singh, C. S. Thakur, K. Shalini, N. Bhat, and S. A. Shivshankar, Appl. Phys. Lett. 83, 2889 (2003).; V. Mikhelashvili, G. Eisenstein, and F. Edelmann, Appl. Phys. Lett. 80, 2156 (2002).; D. Norton, Solid-State Electronics 47, 801 (2003).] They are also viable as coating or waveguide materials in optical devices[G. D. Wilk, R. M. Wallace, and J. M. Anthony, J. Appl. Phys. 89, 5243 (2001).; G. Atanassov, R. Thielsch, and D. Popov, Thin Solid Films 223, 288 (1993).; G. A. Hirata, J. McKittrick, M. Avalos-Boria, J. M. Siqueiros, and D. Devlin, Appl. Surf. Sci 113/114, 509 (1997).] Furthermore, the Er-doped $Y_2O_3$ thin film can be a promising material for miniature planar optical amplifiers. Thus the motivation for this work to investigate the radical-enhanced ALD and, ultimately, to combine the deposition of $Y_2O_3$ and $Er_2O_3$ to synthesize Er-doped $Y_2O_3$ thin films. In one aspect, radical-enhanced ALD can be an ideal technique for erbium incorporation, in contrast to the conventional ion implantation technique. The self-limiting mechanism characteristic of ALD processes allows for controlled erbium doping down to an atomic level. In addition, incorporation of a high concentration of erbium within a given film thickness can be achieved by simply repeating the ALD cycle. In contrast to the ion implantation technique, the radical-enhanced ALD also allows for the control of erbium spatial distribution within the film through an appropriate choice of the metal precursor. For example, the distance between the erbium ions can be effectively increased by using precursors with bulky organic ligands. This can be important at high erbium concentrations, since processes such as cooperative upconversion and energy migration become significant and are detrimental to the optical gain performance. [A. Polman, Appl. Phys. Rev. 82, 1 (1997).] Finally, the deposition of Er-doped $Y_2O_3$ thin films can be achieved at temperatures below 500° C. by using a suitable oxidant such as oxygen radical for ligand removal, thus eliminating the high temperature annealing process required to optically activate the erbium ions and reduce the defect concentrations.

a. Experimental Setup

Figure 9:
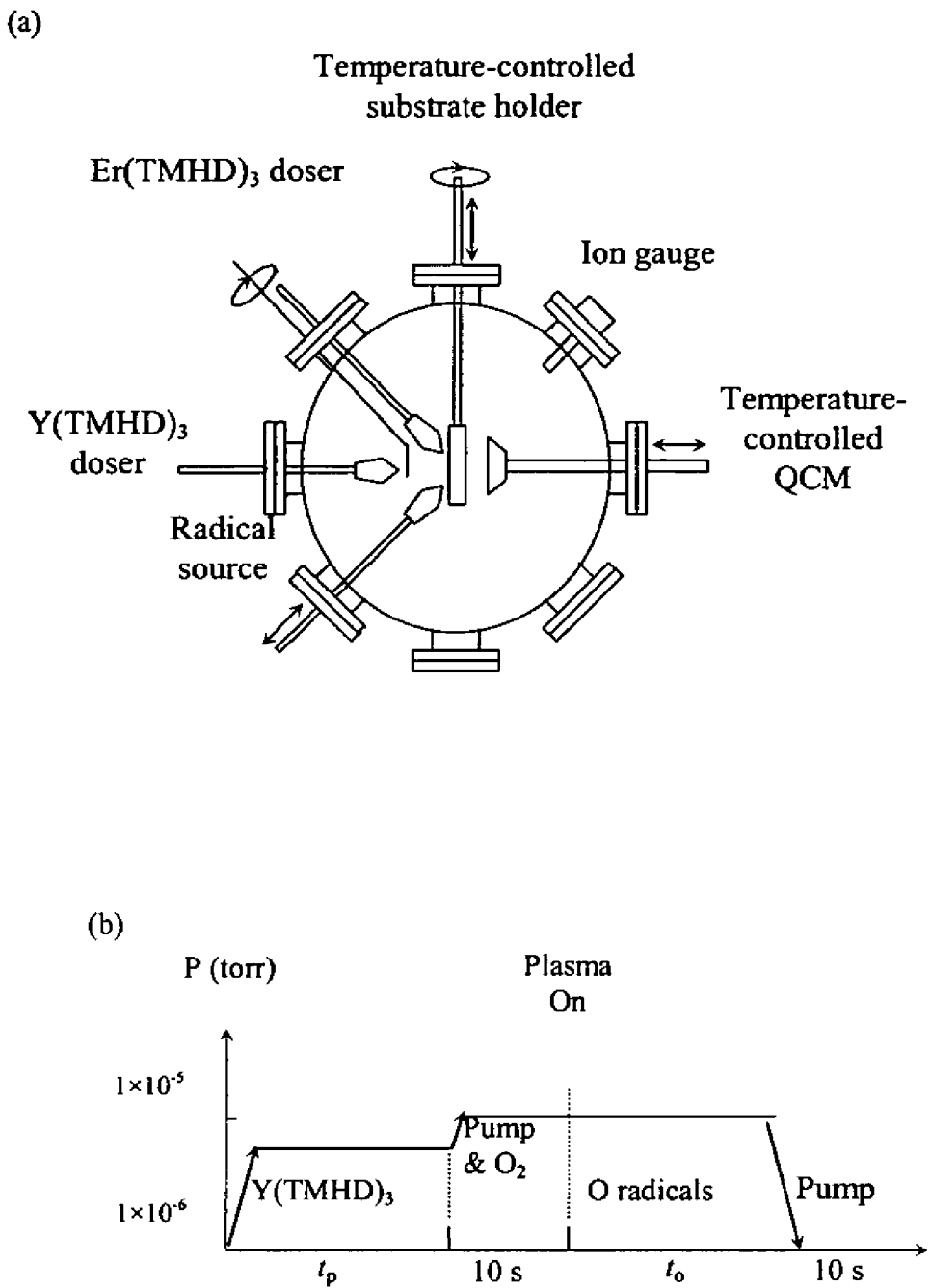
FIG. 9 shows (a) A schematic top-view of the UHV multi-beam reactor. (b) The process sequence and pressure response in the radical enhanced ALD process, where $t_p$ and to denote the precursor and O radicals pulse times, respectively.

The experimental setup and technique used in this work have been described in detail elsewhere and only a brief outline is provided here. [L. S. Santos, G. P. Petrucelli, and C. Airoldi, Polyhedron 18, 969 (1999).] FIG. 9a shows a top-down schematic view of the ultra-high vacuum (UHV) molecular beam reactor used in this work. O radicals were generated by using a coaxial waveguide microwave radical beam source, which was operated at 0.6 sccm $O_2$ flow rate and 20-W microwave power. [J. P. Chang and H. H. Sawin, J. Vac. Sci. Technol. A 15, 610 (1997).] Tris(2,2,6,6-tetramethyl-3,5-heptanedionato)yttrium (III), Y(TMHD)$_3$, and Tris(2,2,6,6-tetramethyl-3,5-heptanedionato)erbium (III), Er(TMHD)$_3$, were chosen as the metal precursors. Sublimed vapors of Y(TMHD)$_3$ and Er(TMHD)$_3$ were delivered independently into the chamber without a carrier gas by using two separate precursor dosers in order to minimize cross contamination. The chamber pressure was increased from a base pressure of $1.0\times10^{-8}$ Torr to $1.0\times10^{-5}$ Torr and maintained constant at this pressure during our study.

The self-limiting mechanism of this ALD process was investigated in-situ using a temperature-controlled BSH-150 quartz crystal microbalance (QCM) from Maxtek, Inc. In this example, an AT-cut 6-MHz $SiO_2$-coated quartz crystal was used as a sample substrate, which was kept about 3 cm away from all the beam sources. The ALD processing sequence for $Y_2O_3$ thin film deposition on Si(100) substrates included a precursor pulse duration of $t_p$, followed by a 10-second pump down period (FIG. 9b). During this pump down period, $O_2$ was introduced into the radical source. $O_2$ does not react with Y(TMHD)$_3$ up to at least 573 K, since there was no change in the QCM measured frequency response. Then, O plasma was generated and remained on for a duration of to. The cycle was completed with another 10-second pump down period.

The film compositions were characterized by ex-situ X-ray Photoelectron Spectroscopy (XPS), using a VG ESCALAB 5 electron spectrometer with Al $K_\alpha$ radiation (1486.6 eV). A survey spectrum with a step size of 1 eV and an electron analyzer pass energy of 50 eV was first recorded to identify the surface elements. High-resolution spectra for detailed analysis were recorded with a 0.1 eV step size and an electron analyzer pass energy of 20 eV. All XPS spectra were referenced to the substrate Si 2p binding energy at 99.3 eV. Since ultra-thin films were deposited, the film thickness can be estimated from the XPS spectra, using the overlayer-substrate model originally developed by Hill et al. [J. M. Hill, D. G. Royce, C. S. Fadley, L. F. Wagner, and F. J. Grunthaner, Chem. Phys. Lett. 44, 225 (1976).] Since XPS analysis was performed ex-situ, the reported atomic compositions of the deposited $Y_2O_3$ films also include 15 at. % of 0 and 13 at. % of C from the ambient contamination. In addition, hydrogen was excluded in these calculations since XPS is incapable of detecting its presence. Surface morphology and step coverage of the deposited $Y_2O_3$ films were examined using a Digital Instruments Nanoscope 3A atomic force microscope (AFM) in a tapping mode and a Hitachi scanning electron microscopy (SEM) S4700, respectively. The SEM images were taken at 1° off the sample surface without the Au coating for charge reduction.

b. Results and Discussion

The following discussion focuses on processing and characterization of $Y_2O_3$ films deposited using $Y(TMHD)_3$ and O radicals. Whenever available, the results are compared to those of $Er_2O_3$ films deposited using a similar chemistry. [L. S. Santos, G. P. Petrucelli, and C. Airoldi, Polyhedron 18, 969 (1999).]

C. QCM Study

Adsorption of $Y(TMHD)_3$ and $Er(TMHD)_3$. The ALD cycle started with a precursor pulse time of $t_p$ and the mass increase due to precursor adsorption was measured by the change in the QCM frequency, $\Delta f$. The adsorption of $Y(TMHD)_3$ and $Er(TMHD)_3$ was investigated in a previous study. [L. S. Santos, G. P. Petrucelli, and C. Airoldi, Polyhedron 18, 969 (1999).] Specifically, it was found that these precursors do not adsorb when exposed to a clean Si-coated QCM surface without a prior O radical exposure. By first exposing the surface to O radicals, adsorption of these precursors was initiated and followed the simple Langmuir isotherm, with the surface coverage increasing initially with time and then gradually saturating. Due to the steric hindrance of the bulky ligands, saturative adsorption was achieved with $t_p>7$ minutes. Following the saturative adsorption, an O radical exposure removed the organic ligands, yielding a submonolayer coverage of the oxide thin film. Specifically, the fractional surface coverage of the adsorbed precursor layer, $\theta$, was determined using the equation originally developed by Sauerbrey [G. Sauerbrey, Z. Phys. 155, 206 (1959).]:

$$\theta = \frac{\Delta f}{\left(8.15 \times 10^7 \frac{Hz \cdot cm^2}{g}\right)} \cdot \frac{N_a}{MW} \cdot \frac{1}{N_{max}}$$

In this case, the mass increase was first calculated from $\Delta f$ and then converted to the number of precursor molecules adsorbed on the surface, using its molecular weight MW and the Avogadro's number $N_a$. The result was then normalized to $N_{max}$, which is the number density of metal atoms on the (100) surface of the metal oxides, or $6.23 \times 10^{14}$ cm$^{-2}$ for both $Y_2O_3$ or $Er_2O_3$, due to the similarities in their crystal structures and lattice constants (space group Ia3). At 473 K, $\theta$ for $Y(TMHD)_3$ at saturation, or $\theta^{sat}$, was found to be about 0.22, compared to 0.13 for $Er(TMHD)_3$. These low $\theta^{sat}$ values indicate a low deposition rate of metal oxide, mainly due to the large size of the β-diketonate ligands, limiting the number density of metal atoms in the saturated precursor layer. Higher $\theta^{sat}$ can be achieved by increasing the substrate temperature, as shown in FIG. 10a where the $\theta^{sat}$ values of $Y(TMHD)_3$ and $Er(TMHD)_3$ are plotted as a function of substrate temperature on the left y-axis. Comparing to $Y(TMHD)_3$, the adsorption of $Er(TMHD)_3$ exhibited a stronger temperature dependence, with $\theta^{sat}$ increased drastically to 0.72 when the temperature increased to 573 K. Taking into account the steric hindrance by the ligands and the fact that adsorption of $Er(TMHD)_3$ still saturated at 573 K, this increase in $\theta_{sat}$ indicates partial precursor decomposition, making it possible to increase the number density of metal atoms from the precursor reaction step. On the other hand, $\theta^{sat}$ for $Y(TMHD)_3$ increased fairly slowly with increasing temperature up to 563 K. This indicates that $Y(TMHD)_3$ remained relatively more stable against decomposition in the temperature range studied. The result can be further substantiated by considering the precursors' standard enthalpies of formation, $\Delta H_f$. Specifically, the reported $\Delta H_f$ for $Y(TMHD)_3$ is $-23.53 \pm 0.12$ eV, compared to that of $Er(TMHD)_3$, $\Delta H_f$-23.30±0.12 eV. [L. S. Santos, Jr., S. Roca, and C. Airoldi, J. Chem. Thermodynamics 29, 661 (1997).; L. S. Santos, G. P. Petrucelli, and C. Airoldi, Polyhedron 18, 969 (1999).] The slightly more negative $\Delta H_f$ of $Y(TMHD)_3$ indicates that is more stable than $Er(TMHD)_3$. Despite the partial precursor decomposition at temperatures above 573 K, the self-limiting deposition of metal oxides using these metal γ-diketonate precursors can still be achieved up to 723 K, a unique characteristic of this precursor family. [M. Putkonen, T. Sajavaara, L.-S. Johansson, and L. Niinistö, Chem. Vap. Deposition 7, 44 (2001).; H. Mölsä, L. Niinistö, and M. Utriainen, Adv. Mater. Opt. Electron. 4, 389 (1994).; M. Ritala and M. Leskelä, in Handbook of Thin Film Materials, edited by H. S Nalwa (Academic Press, 2002), Vol. 1, Chap. 2, p. 103.]

d. Reactions of O Radicals with Adsorbed Precursor

Subsequent to the precursor pulse time of $t_p$ is the O radical pulse time of $t_o$. The effect of O radicals was also investigated: it was found that O radicals create reactive sites for precursor adsorption and also effectively remove the β-diketonate ligands. [L. S. Santos, G. P. Petrucelli, and C. Airoldi, Polyhedron 18, 969 (1999).] Similar to the adsorption process, the ligand removal by O radicals was found to be a saturative process. Specifically, the QCM showed an initial abrupt surface mass decrease and then saturated after a critical O radical dose $t_o^c$ was applied. To substantiate the self-limiting mechanism of this ALD process, the precursor pulse time $t_p$ was varied and the corresponding $\theta$ and $t_o^c$ were determined and plotted in FIG. 10 (a) for $Y(TMHD)_3$ at 533 K. As $t_p$ increased, more precursors adsorbed on the surface ($\theta$ increased), and consequently, a longer critical O radical dose $t_o^c$ was needed to completely remove all the ligands. As $\theta$ approached its saturative value of $\theta^{sat}$ at $t_p>7$ minutes, $t_o^c$ also approached a constant of value of about 7 minutes. Further elongation of $t_p$ or $t_o^c$ had no effect on the precursor adsorption or ligand removal, confirming the self-limiting mechanism of this ALD process. Consistent with these observations, the critical O radical dose $t_o^c$ increased with increasing substrate temperature, as shown on the right axis of FIG. 10a.

The reactions of O radicals with organic materials have been studied extensively. [J. N. Ong, Jr., Carbon 2, 281 (1964).; E. B. D. Bourdon, A. Raveh, S.C. Gujrathi, and L. Martinu, J. Vac. Sci. Technol. A 11, 2530 (1993).; J. Torres, C. C. Perry, S. J. Bransfield, and D. H. Fairbrother, J. Phys. Chem. B 106, 6265 (2002).; R. J. Cvetanovic, J. Phys. Chem. Ref. Data 16, 261 (1987).; J. Zhang, D. Garton, and T. K. Minton, J. Chem. Phys. 117, 6239 (2002).] In this work, the flux of O radicals striking the adsorbed precursor molecules was kept constant by maintaining a constant oxygen flow rate, and a constant operating temperature and microwave source power. Hence, the reaction rate r" of O radicals with the precursor ligands can be reduced from the second-order to the pseudo first-order kinetics:

$$r'' = k_R P_O N_d = k_{eff} \left(\frac{m_d}{MW_d}\right)$$

where $k_R$ is the reaction rate constant, $P_O$ is the partial pressure of O radicals, $k_{eff}=k_R P_O$, $N_d$ is the number of moles of the ligand to be removed, which was determined from the ratio of its mass $m_d$ to its molecular weight $MW_d$. The mass balance of $N_d$ yields a rate of change as:

$$\frac{dN_d}{dt} = \frac{1}{MW_d}\frac{d}{dt}m_d = -r'' = -k_{eff}\left(\frac{m_d}{MW_d}\right)$$

which, after integration, is:

$$m_d = m_d^o \exp(-k_{eff}t)$$

where $m_d^o$ is the mass of the ligands on the surface before the O radical exposure. The shaded region in FIG. 10 (c) illustrates the model fit to the experimental data. The values of $k_{eff}$ extracted from the fits are plotted in FIG. 10 (d) as a function of substrate temperature from 473 to 573 K. No significant temperature dependence of $k_{eff}$ was observed within the temperature range studied. This lack of temperature dependence indicates a non-activated reaction between O radicals and the precursor ligands, enabling ALD of metal oxides at low temperatures (<573 K).

e. Impurity Level in ALD $Y_2O_3$ And $Er_2O_3$ Films

Even though the exact reaction pathway leading to the deposition of metal oxides still remains to be determined, the mechanism can be simplified as:

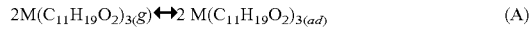

Figure 11:
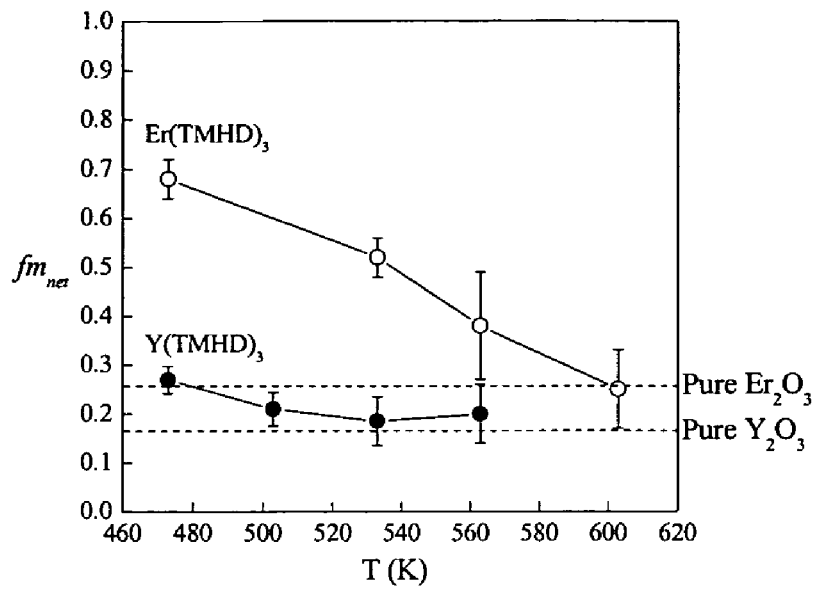
FIG. 11 shows the net mass change ratio, $$fm_{net} = \frac{\Delta m_{net}}{\Delta m_a},$$

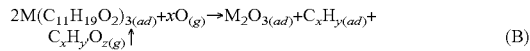

where M=Y or Er. In this mechanism, the incoming $M(TMHD)_3$ molecule during the precursor pulse ($t_p$) was assumed to adsorb non-dissociatively (reaction A). The maximum mass increase $\Delta m_a^{max}$ in this step is 1278 amu for $Y(TMHD)_3$ or 1434 amu for $Er(TMHD)_3$. Without wishing to be bound by theory, in a subsequent O radical pulse ($t_o$), the O radicals are believed to react with the organic β-diketonate ligands, leading to the formation of non-volatile metal oxides and carbon-containing species, such as $C_xH_y$, and volatile by-products $C_xH_yO$, that can desorb readily from the surface (reaction B). If all the carbon-containing reaction products desorb after the O radical exposure resulting in pure $Y_2O_3$ or $Er_2O_3$ deposition, the net mass deposited per cycle $\Delta m_{net}$ is the mass of $Y_2O_3$ (226 amu) or $Er_2O_3$ (382 amu). Therefore, the net mass change ratio per ALD cycle, defined as $$fm_{net} = \frac{\Delta m_{net}}{\Delta m_a^{max}},$$

for depositing pure $Y_2O_3$ or $Er_2O_3$ is 0.18 or 0.27, respectively. By analyzing the fm, ratio at various temperatures, as shown in FIG. 11, it is possible to determine the impurity level within these metal oxides. As the temperature increased from 473 to 533 K, $fm_{net}$ of $Y_2O_3$ decreased from 0.28, amounting to ~36% impurity incorporation, to 0.18, corresponding to the deposition of pure $Y_2O_3$. A similar trend is observed for ALD of $Er_2O_3$ in that fmn, decreased with increasing temperature and reached ~0.27 (pure $Er_2O_3$) at 603 K. These results indicate an incomplete removal of the reaction by-products at low temperatures and some organic residues from the precursor ligands become incorporated into the films. By increasing the substrate temperature, a more complete removal of these organic by-products was achieved and the deposition of pure metal oxide was realized.

f. Characterization of $Y_2O_3$ Thin Films Deposited on Si(100)

Effects of chemical pulse times and substrate temperature on deposition rate. Thin films of $Y_2O_3$ were deposited on Si(100) substrates to assess their material properties. First, the $Y_2O_3$ deposition was carried out with a short chemical pulse time of 30 seconds for both $Y(TMHD)_3$ and O radicals. The $Y_2O_3$ deposition rate expressed in terms of film thickness per cycle (Å/cycle) is relatively temperature-insensitive from 473 K to 573 K, yielding an ALD processing window of about 0.3 Å/cycle. This is comparable to those observed by Putkonen et al. where the same β-diketonate precursor was used with $O_3$, which is a strong oxidizer with a chemical reactivity similar to that of O radicals. Above 573 K, the $Y_2O_3$ deposition rate increased significantly and reached 4.0 Å/cycle at 673 K. Since only a sub-monolayer deposition rate of $Y_2O_3$ is possible per chemical cycle due to the steric hindrance effect of the ligands, the significant increase in the deposition rate above 573 K is due to partial precursor decomposition upon adsorption on a heated surface, consistent with the QCM results reported in section 1.1. A similar trend was observed for $Er_2O_3$ due to the similarity of the precursors. [D. Niu, R. W. Ashcraft, Z. Chen, S. Stemmer, and G. N. Parsons, Journal of The Electrochemical Society 150, F102 (2003); M. D. Ulrich, J. E. Rowe, D. Niu, and G. N. Parsons, J. Vac. Sci. Technol. B 21, 1792 (2003)]

Figure 10:
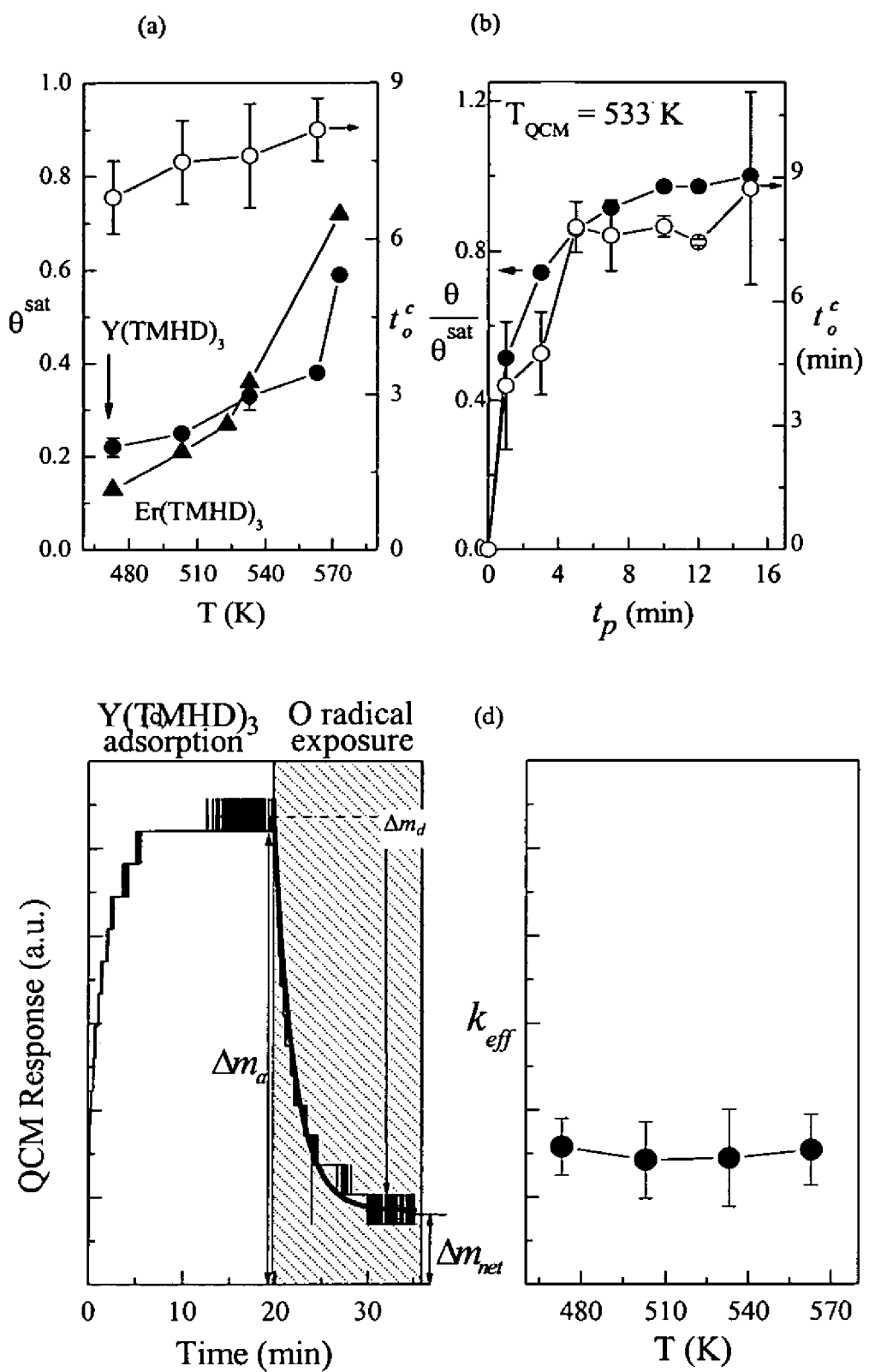
FIG. 10 shows (a) The saturative surface coverage of Y(TMHD)$_3$ and Er(TIMHD)$_3$ as a function of substrate temperature (left y-axis). The corresponding critical O radical dose $t_o^c$ required to completely remove all the organic ligands is shown on the right y-axis for Y(TIMHD)$_3$. (b) The self-limiting mechanism of the radical-enhanced ALD reaction is demonstrated. (c) The effective rate constant $k_{eff}$ for O radicals reacting with the organic ligands was determined by fitting the QCM response during the O radical exposure to the pseudo-first order reaction. (d) Extracted $k_{eff}$ as a function of substrate temperature.

To achieve the maximum deposition rate, the precursor and oxygen radical exposure times were increased to 7 minutes, the time required to achieve surface saturation, as shown in FIG. 10 (b). Within the ALD processing window of 473 to 573 K, a constant but slightly higher deposition rate of 0.5 Å/cycle was obtained for $Y_2O_3$. This indicates that short chemical pulses yielded a reasonable growth rate while significantly reduced the processing time.

Initial growth. Ultra-thin $Y_2O_3$ films with thicknesses less than 30 Å were analyzed by XPS to investigate the initial film growth. For comparison, the reported Y $3d_{5/2}$ and O 1s binding energies for fully oxidized $Y_2O_3$ are 156.6 eV and 529.3 eV, respectively. FIG. 13 (a) shows the detailed Y 3d and O 1s XPS spectra for $Y_2O_3$ films deposited at 673 K, with 20 to 90 deposition cycles. For $Y_2O_3$ deposited with 20 ALD cycles, the Y $3d_{5/2}$ peak centers at 158.0 eV, showing a 1.4 eV shift to the higher binding energy as compared to that observed for fully oxidized $Y_2O_3$. As the number of ALD cycles increased from 20 to 90, the Y 3d peak intensity increased with a corresponding decrease in the Si 2s peak intensity, indicative of a film thickness increase. More importantly, the Y $3d_{5/2}$ peak shifted towards the lower binding energy as the film thickness increased. For the thickest sample deposited 90 cycles, the Y $3d_{3/2}$ peak centers at 156.6 eV, matching that observed for fully oxidized $Y_2O_3$. The observed binding energy shift in the Y $3d_{5/2}$ peak is consistent with the transition of yttrium silicate at the interface to pure $Y_2O_3$ as the film grows, resulting in a change in Y chemical environment. [J. J. Chambers, B. W. Busch, W. H. Schulte, T. Gustafsson, E. Garfunkel, S. Wang, D. M. Maher, T. M. Klein, and G. N. Parsons, Appl. Surf. Sci. 181, 78 (2001)] Specifically, Y is likely to have Si as the second nearest neighbor (Y—O—Si bonding) near the interface, while can have Y as the second nearest neighbor in bulk $Y_2O_3$ (Y—O—Y bonding). The electronegativity difference in Si and Y causes the observed binding energy shift. The formation of an yttrium silicate interfacial layer is thermodynamically favorable and can have been confirmed by several groups. [C. D. Wagner, W. M. Riggs, L. E. Davis, J. F. Moulder, and G. E. Muilenberg, Handbook of X-ray Photoelectron Spectroscopy (Perkin-Elmer, Eden Prairie, Minn., 1979), p. 98.; J. J. Chambers, B.

W. Busch, W. H. Schulte, T. Gustafsson, E. Garfunkel, S. Wang, D. M. Maher, T. M. Klein, and G. N. Parsons, Appl. Surf. Sci. 181, 78 (2001); D. Niu, R. W. Ashcraft, Z. Chen, S. Stemmer, and G. N. Parsons, Journal of The Electrochemical Society 150, F102 (2003); M. D. Ulrich, J. E. Rowe, D. Niu, and G. N. Parsons, J. Vac. Sci. Technol. B 21, 1792 (2003)] Finally, the 0 1s spectra clearly shows the corresponding increase in the Y—O intensity at 539.3 eV as the number of ALD cycles increased. The broad O 1s feature at a higher binding energy of about 531.5 eV indicates multiple oxygen bonding environments, such as —O—Si in the substrate, Y—O—Si in interfacial layer, and —O—C and —O—H due to contamination during ambient exposure.

The formation of an interfacial layer is also confirmed by the chemical shift observed in the Si 2p XPS spectra. For reference, the Si 2p XPS spectra of a clean Si substrate taken before and after O radical exposure at 573 K to form a thin $SiO_2$ layer are shown in FIG. 13 (b). The Si 2p peak from the substrate is observed at 99.3 eV, while that from a thin layer of $SiO_2$ is ~4 eV higher in binding energy. The Si 2p XPS spectra taken after the $Y_2O_3$ deposition are also shown in FIG. 13 (b) at various deposition cycles. The observed binding energy difference between the oxidized Si and the Si substrate peaks is 3.4 eV after 20 ALD cycles and ~2.8 eV after 90 ALD cycles, consistent with an increase in the Y—O—Y bonding as the film thickness increased. The signal attenuation of the Si 2p photoemission line is due to the increase in the film thickness with increasing deposition cycles.

$Y_2O_3$ film composition. The atomic composition (at. %) of the $Y_2O_3$ thin films deposited using long precursor and O radical pulse times of 7 minutes was analyzed by XPS. It should be noted that ambient contamination due to the ex-situ measurement resulted in 15 at. % of O and 13 at. % of C, which are excluded from the discussions below. At 473 K, the at. % of Y, O, and C in the film was 19%, 29%, and 24%, respectively, yielding a Y:O stoichiometry of ~2:3. The overall carbon impurity level of 24% is slightly lower than the impurity level measured by the QCM (~30% shown in FIG. 11). Increasing the substrate temperature from 473 K to 623 K reduced the carbon impurity level significantly to 4%. The deconvolution of the C 1s spectra indicated an enhanced removal of the hydrocarbon content with increasing substrate temperature, while the oxidized carbon content, mostly from the ambient contamination, remained relatively constant. This indicates a more complete removal of the organic by-products as the temperature increased, consistent with the QCM results reported in section 1.3 (FIG. 11). At above 623 K, the carbon content in the film increased, likely due to the partial precursor decomposition causing more carbon incorporated into the films.

Surface morphology and conformality. The surface morphology of the $Y_2O_3$ films deposited at 573 K with different thicknesses was analyzed by AFM, as shown in FIG. 14 (a). For a very thin 20 Å film, the AFM image reveals a root mean square (RMS) surface roughness of about 2 Å. For a thicker 115 Å film, the RMS surface roughness is 5 Å. These small RMS roughness values indicate that smooth films were deposited by radical-enhanced ALD. The increase in the RMS surface roughness with increasing film thickness is inherent for sub-monolayer deposition.

Since conformal deposition of metal oxide thin films can be important for many microelectronic and optoelectronic applications, the deposition conformality was also investigated to further assess the feasibility of the radical-enhanced ALD technique. A 800 Å $Y_2O_3$ film was deposited onto a 0.5 μm TaN-coated Si trench at 673 K, using $Y(TMHD)_3$ and O radicals as the precursors. FIG. 14 (b) shows the cross-sectional SEM images of the patterned wafer taken before and after the $Y_2O_3$ deposition. Excellent conformal deposition was achieved over these features with an aspect ratio of 2. These results indicate that conformal deposition of smooth metal oxide thin films can be achieved with radical-enhanced ALD, using metal β-diketonate precursors and O radicals.

G. CONCLUSION

The radical-enhanced atomic layer deposition of $Y_2O_3$ thin films was investigated from 473 to 673 K, using $Y(TMHD)_3$ and O radicals. A saturative surface coverage of $Y(TMHD)_3$ was achieved with a precursor pulse time longer than 7 minutes. Due to the bulky β-diketonate ligands limiting the number density of Y atoms on the surface during the precursor adsorption, only a sub-monolayer of $Y_2O_3$ was achieved after the ligands were removed by reactions with O radicals. Adsorption of $Y(TMHD)_3$ was enhanced significantly at a substrate temperature above 573 K, due to the partial precursor decomposition. $Y(TMHD)_3$ adsorption exhibited a weaker temperature dependence, compared to $Er(TMHD)_3$, indicating that $Y(TMHD)_3$ was relatively more stable in the temperature range studied. A saturative $Y_2O_3$ deposition rate of 0.5 Å/cycle in the ALD temperature window from 473 to 573 K were achieved using long reactant pulse times of 7 minutes. By reducing each reactant pulse time to 30 seconds, a slightly lower deposition rate of 0.3 Å/cycle was obtained. The XPS analysis indicates the formation of a thin yttrium silicate layer at the $Y_2O_3$/Si interface, as it is thermodynamically favored. XPS compositional analysis indicates that the $Y_2O_3$ films were fully oxidized with a stoichiometric Y:O ratio of ~2:3. The carbon content decreased with increasing temperature to be ~4 at. %, at 623 K. This indicates an enhanced removal of the organic by-products at high substrate temperatures, consistent with the QCM results. Conformal deposition of fairly smooth $Y_2O_3$ films was achieved. These results demonstrate that conformal low-temperature deposition of stoichiometric and smooth metal oxide thin films with minimal carbon contamination can be achieved by radical-enhanced ALD via β-diketonate precursors and O radicals.

3. Surface Reaction Kinetics of Metal B-Diketonate Precursors with O Radicals in Radical-Enhanced Atomic Layer Deposition of Metal Oxides Since its initial introduction in 1959 by Sauerbrey, the utilization of the quartz crystal microbalance (QCM) has been very imaginative. It can have been applied to study many fundamentally and technologically important processes, varying from adsorption and desorption of surface species in thin film deposition and plasma etching, to the determination of air pollutants. [G. Sauerbrey, Z. Phys. 155, 206 (1959).; J. W. Elam, M. D. Groner, and S. M. George, Rev. Sci. Instrum. 73, 2981 (2002).; M. S. Applebee, A. P. Schellinger, R. J. Jaeger, and D. T. Pierce, Environ. Sci. Technol. 38, 234 (2004) .; M. Forslund and C. Leygraf, J. Electrochem. Soc. 144, 113 (1997).; B. Y. Wei, M. C. Hsu, Y. S. Yang, S. H. Chien, and H. M. Lin, Mater. Chem. Phys. 81, 126 (2003).] The QCM utilizes the piezoelectric property of the quartz crystal to measure small changes in mass due to simple adsorption or more complex surface reactions. Specifically, when an external electrical potential is applied to an AT-cut piezoelectric quartz crystal, it can be made to oscillate in its thickness shear mode with a resonance frequency given by:

$$f_o = \frac{1}{2 \cdot x_q} \cdot \sqrt{\frac{\mu_q}{\rho_q}}$$

where $x_q$ is the thickness of the quartz crystal, $\mu_q$ is the quartz shear modulus ($2.947 \times 10^{10}$ Pa), and $\rho_q$ is the quartz density (2.648 g cm$^{-3}$). As mass is added or removed from the QCM surface, the observed frequency shift $\Delta f$ is directly related to the surface mass change through the Sauerbrey equation [G. Sauerbrey, Z. Phys. 155, 206 (1959).]:

$$\Delta f = \frac{-2 \cdot f_o^2}{\sqrt{\mu_q \cdot \rho_q}} \cdot m_f = -C \cdot m_f$$

where $f_o$ is the initial resonance frequency with no mass deposited or removed, and $m_f$ is the mass per unit area of the deposited film. For an AT-cut 6 MHz quartz crystal, the proportionality constant C is $$8.15 \times 10^7 \frac{Hz \cdot cm^2}{g},$$

meaning a mass change of 12.3 ng/cm$^2$ will cause a frequency shift of 1 Hz. The Sauerbrey equation has been supported by experimental data for deposited mass of less than 2% of the quartz areal mass density. Even though many methodologies, such as the z-match technique, [A. Wajid, Sensor Actuat. A-Phys. 63, 41 (1997).; A. Wajid, Rev. Sci. Instrum. 62, 2026 (1991).] have been proposed to further increase the accuracy and mass load range of the QCM, the simple Sauerbrey method is adequate for many purposes. The rapid successful development of the QCM instrumentation can have resulted in a device that is attractively simple and can have an outstanding mass sensitivity down to 0.375 ng/cm$^2$ for systems with 0.03-Hz resolution.

Over the last decade, an intensive research effort has been directed towards understanding and engineering material properties of metal oxide thin films for next generation of microelectronic and optoelectronic devices. [R. Puthenkovilakam and J. P. Chang, Appl. Phys. Lett. 84, 1353 (2004).; B.—O Cho, S. Lao, and J. P. Chang, J. Appl. Phys. 93, 9345 (2003).; G. D. Wilk, R. M. Wallace, and J. M. Anthony, J. Appl. Phys. 89, 5243 (2001).] The surface reactions taking place during thin film deposition can play an important role in determining the properties of these materials. In this example, the QCM was used to study the surface reaction kinetics of metal β-diketonate precursors with O radicals in radical-enhanced atomic layer deposition (ALD) of metal oxide thin films. IN one aspect, radical-enhanced ALD is based on sequential, self-limiting surface reactions. The film growth results from repetition of the ALD cycle, which begins with adsorption of the metal precursor, followed by the O radical exposure, leading to the formation of metal oxide and desorption of volatile by-products. There are many advantages associated with ALD processes, including uniformity and conformality, and the film thickness can be precisely controlled down to an atomic level by simply varying the number of deposition cycles. A detailed review of ALD processing can be found elsewhere. [M. Ritala and M. Leskelä, in Handbook of Thin Film Materials, edited by H. S, Nalwa (Academic Press, 2002), Vol. 1, Chap. 2, p. 103.]

The binary system of metal β-diketonate precursors and O radicals is interesting to study from the point of view of both thin film deposition and coordination chemistry. For this example metal β-diketonate precursor family, the chelating ligand is acetylacetone. An important feature is the ability to undergo molecular rearrangement, called the keto-enol tautomerism, which allows it to coordinate with virtually all metals in the periodic table. [K. C. Joshi and V. N. Pathak, Coord. Chem. Rev. 22, 37 (1977); D. P. Graddon, Coord. Chem. Rev. 4, 1 (1969).; L. S. Santos, Jr., S. Roca, and C. Airoldi, J. Chem. Thermodynamics 29, 661 (1997).; L S. Santos Jr., G. P. Petrucelli, and C. Airoldi, Polydedron 18, 969 (1999).; E. Giera, J. Chem. Thermodynamics 32, 821 (2000).] By substituting the methyl substituents on the acetylacetone parent derivative with tert-butyl or fluorinated groups, for example, the precursor properties such as volatility and thermal stability can be greatly enhanced. [B. D. Fahlman, Adv. Mater. Opt. Electron. 10, 223 (2000).] Other attractive features of this precursor family include low cost, non-toxicity, and ease of handling and storage. Consequently, the metal β-diketonate precursors can be invaluable for ALD of many metal oxide thin films.

Since the oxide films generated from organometallic precursors are often contaminated with carbon, they are typically used in combination with an oxidizing or a reducing agent. Molecular oxygen ($O_2$), ozone ($O_3$), and simple hydrides, such as $H_2O$ and $H_2O_2$, are among the most frequently exploited. [T Hatanpää, J. Ihanus, J. Kansikas, I. Mutikainen, M. Ritala, and M. Leskelä, Chem. Mater. 11, 1846 (1999).; M. Putkonen, T. Sajavaara, L.-S. Johansson, and L. Niinistö, Chem. Vapor Deposition 7, 44 (2001).] However, most metal 61-diketonate precursors are stables and do not react with $O_2$ or $H_2O$ at deposition temperatures below 673 K. [M. Ritala and M. Leskelä, in Handbook of Thin Film Materials, edited by H. S, Nalwa (Academic Press, 2002), Vol. 1, Chap. 2, p. 103.] Above 673 K, the precursor decomposition can start and can cause significant carbon incorporation into the film. [A. F. Bykov, P. P. Semyannikov, and I. K. Igumenov, J. Thermal Anal. 38, 1477 (1992).] On the other hand, ozone has been demonstrated to effectively remove organics and surface hydrocarbons. [D. W. Moon, A. Kurokawa, S. Ichimura, H. W. Lee, and I. C. Jeon, J. Vac. Sci. Technol. A 17, 1999 (150).; J. R. Vig, J. Vac. Sci. Technol. A 3, 1027 (1985).; S. R. Kasi and M. Liehr, J. Vac. Sci. Technol. A 10, 795 (1992).] Particularly, it was found that the O radicals generated via the dissociation of $O_3$ are the primarily active species responsible for the removal of saturated hydrocarbons. [D. W. Moon, A. Kurokawa, S. Ichimura, H. W. Lee, and I. C. Jeon, J. Vac. Sci. Technol. A 17, 1999 (150).]

The metal oxide thin films chosen for this example are yttrium oxide ($Y_2O_3$) and erbium oxide ($Er_2O_3$). Both materials are of interest for the next generation of microelectronic and optoelectronic devices. For example, yttrium oxide can be used as a. high dielectric constant material (k=9-20) in complementary metal oxide semiconductor (CMOS) field effect transistors, or as a waveguide material due to its high refractive index (n=1.7-1.9). [V. M. Koleshko and N. V. Babushkina, Thin Solid Films 62, 1 (1979).; L. Manchanda and M. Gurvitch, IEEE Electron Device Lett. 9, 180 (1988).; G. Atanassov, R. Thielsch, and D. Popov, Thin Solid Films 223, 288 (1993).] When combining the deposition of $Y_2O_3$ and $Er_2O_3$, an Er-doped $Y_2O_3$ film can be synthesized for potential optoelectronic applications, such as a planar optical amplifier. [T. H. Hoekstra, P. V. Lambeck, H. Albers, and Th. J. A. Popma, Electronics Letters 29, 581 (1993).; T. H. Hoekstra, B. J. Offrein, P. V. Lambeck, and Th. J. A. Popma, Optics Letters 18, 1718 (1993).]

a. Experimental

FIG. 15a shows a top-down view schematic of the ultrahigh vacuum (UHV) multi-beam reaction chamber. The reaction chamber is an 8" diameter stainless steel vessel consisted of a coaxial waveguide cavity radical beam source for generating 0 radicals, two precursor dosers for precursor delivery, and a temperature-controlled QCM for in-situ surface reaction kinetic studies. The base pressure is typically maintained in the range of $8\times10^{-9}$ to $1\times10^{-8}$ Torr via a CTI 4000 LUs cryogenic pump and is measured by a hot filament ion gauge. The chamber wall is continuously baked at 323 K.

The design and operating principle of the coaxial microwave cavity radical beam source are described in detail elsewhere. [J. P. Chang and H. H. Sawin, J. Vac. Sci. Technol. A. 15, 610 (1997).] Plasma is generated inside a quartz ampoule located at the end of the radical source by using a 300-W 2.46-KHz Sairem microwave power supply. Molecular oxygen is fed into the quartz ampoule and O radicals generated from plasma are emitted into the chamber at pressure around $1\times10^{-5}$ Torr through a nozzle that is 1-mm in diameter by 1-mm in length. In this pressure region, the mean free path of the O radicals is on the order of meters and consequently, the quenching of O radicals by collisions with other gas molecules is insignificant. In this example, the radical source was operated at 15-W forward power with an $O_2$ feed gas flow rate of 0.6 SCCM.

The metal β-diketonate precursors used in this example are Tris(2,2,6,6-tetramethyl-3,5-heptanedionato)yttrium (IE), or Y(TMHD)$_3$, and Tris(2,2,6,6-tetramethyl-3,5-heptanedionato)erbium (III), or Er(TMHD)$_3$. In this example, the TMHD ligand was formed by substituting the methyl substituents on acetylacetone with the bulky tert-butyl moiety. The molecular structure of the M(TMHD)$_3$ precursor, with M=Y or Er, is shown in FIG. 15b. Both precursors are of 99.9% purity and supplied by Strem Chemicals, Inc. The Y(TMHD)$_3$ and Er(TMHD)$_3$ precursors are solid at room temperature with a vapor pressure (sublimation) of 0.05 Torr at 368 K and 0.1 Torr at 453 K, respectively. [MSDS provided by Strem Chemicals, Inc.] Each precursor is housed in a 1.5-in diameter by 4.93-in long electropolished conflat nipple that is connected directly to the precursor doser through a manual valve. The Y(TMHD)$_3$ precursor doser is a 15"-long by ⅜" O.D. stainless steel tube welded to a nozzle in the vacuum end. The nozzle can have a 0.080"-I.D. diameter by 0.200"-long aperture that allows collimation of the precursor beam before it is emitted into the chamber. Similar precursor doser with a smaller stainless steel tube of ¼" O.D. is used for Er(TMHD)$_3$ delivery. The in-vacuum heating of both dosers is accomplished by using the Kapton insulated flexible heaters (Omega KH-112) and the temperature is monitored by a k-type thermocouple connecting to a proportional, integral, differential (PID) temperature controller. In this example, the precursor vapor was delivered to the reaction chamber without a carrier gas by heating the precursor housing to 423 K. Both precursor dosers were maintained at a higher temperature of 473 K in order to minimize precursor condensation on the doser's wall.

The in-situ surface reaction kinetic studies were accomplished by utilizing the bakeable BSH-150 single sensorhead from Maxtek, Inc. The sensor head is designed with a water-cooled stainless steel housing enclosing a Drawer™ holding a Si-coated, AT-cut 6 MHz quartz crystal that serves as the sample substrate. A major challenge encountered when using the QCM for surface kinetic studies is signal instability at high temperatures. [M. N. Rocklein and S. M. George, Analytical Chemistry 75, 4975 (2003).] Since most commercial heaters do not provide stable and uniform heating of the sensor housing, especially at elevated temperatures above 373 K, a resistive heater was fabricated by using the Nickel-Chrome 60 resistance heating wire as the heating element and mica/ceramic paste as the insulating materials. The QCM temperature was monitored by a k-type thermocouple attached to the Drawer™ and regulated by a PID temperature controller. Changes in the oscillation frequency due to small surface mass changes during the precursor or O radical pulse were recorded with the sampling period of 1.0 second, using a Sycon STM-100/MF Multi-film Thickness/Rate Monitor (I-Hz resolution) interfaced with the computer using LabView.

Since Y(TMHD)$_3$ and Er(TMHD)$_3$ are structurally similar, the results of surface reaction kinetics presented in this example focus mainly on Er(TMHD)$_3$. The studies of adsorption and desorption kinetics were carried in an $O_2$ background of $\sim 1\times10^{-5}$ Torr by introducing $O_2$ continuously into the chamber through the radical source. This was to minimize any spurious QCM response caused by the sudden increase in the chamber pressure during the O radical pulse. To ensure that $O_2$ does not interfere with the measurements, the Er(TMHD)$_3$ precursor and $O_2$ were introduced simultaneously into the chamber at 573 K. The collected QCM signal shown in FIG. 15c fluctuated ±1 Hz around the zero base line due to noises, indicating that Er(TMHD)$_3$ is stable in $O_2$ background up to at least 573 K.

Prior to the data collection, a thin $Er_2O_3$ film of approximately 10 Å was first deposited onto the QCM surface by flowing both Er(TMHD)$_3$ and O radicals simultaneously into the chamber. The adsorption of Er(TMHD)$_3$ was collected immediately after the O plasma was turned off. The fractional surface coverage θ was calculated from the raw QCM frequency data by using the following the relation:

$$\theta = \frac{\Delta f}{\left(8.15 \times 10^7 \frac{Hz \cdot cm^2}{g}\right)} \cdot \frac{N_a}{MW} \cdot \frac{1}{N_{max}}$$

where $N_a$ is the Avogadro's number, MW is the molecular weight of the adsorbed surface species, and $N_{max}$ is the maximum surface sites available for one monolayer adsorption, which was estimated from the Er packing density in $Er_2O_3$ to be about $6.23\times10^{14}$ $cm^{-2}$. Without wishing to be bound by theory, it is believed that Er(TMHD)$_3$ undergoes intramolecular rearrangement upon adsorption on heated surface and the MW of the adsorbed surface species is that of Er(TMHD)$_3$, or 717 amu. [A. E. Turgambaeva, V. V. Krisyuk, A. F. Bykov, and I. K. Igumenov, Journal de Physique IV—Proceedings, Barcelone, Spain, Pr8-65, (1999), edited by A. Figueras EDP Sciences, France, (1999).]

The thickness and atomic composition of the $Er_2O_3$ films deposited on Si(100) substrate were determined by using the X-ray Photoelectron Spectroscopy (XPS) ex situ. The XPS spectra were obtained from a VG ESCALAB 5 electron spectrometer, using Al Kα radiation (1486.6 eV), and they were referenced to the C—C 1s binding energy at 285 eV. To identify the surface elements, a survey scan was first recorded with a step size of 1 eV and an electron analyzer pass energy of 50 eV. High-resolution spectra were recorded for detail analysis, using 0.1 eV step size with an electron analyzer pass energy of 20 eV. Since the XPS analysis was performed ex-situ, approximately 15 at. % of 0 and 13 at. % of C were always observed. The reported atomic composition for the deposited $Er_2O_3$ film was corrected accordingly.

b. Results and Discussion

Adsorption and desorption kinetics of Er(TMHD)$_3$ and Y(TMHD)$_3$. The adsorption isotherm of Er(TMHD)$_3$ on a 10A Er2O3 surface is shown at temperatures ranging from 473 to 573 K in FIG. 16a. The fractional surface coverage, 0 increased with time and an increase in temperature, and gradually saturated, likely due to the steric hindrance effect associated with the bulky precursor molecules. Assume that the adsorption of Er(TMHD)$_3$ follows the Langmuir-Hinshelwood model of a direct and non-dissociative reaction, $$2Er(C_{11}H_{19}O_2)_{3(g)} \leftrightarrow 2\, Er(C_{11}H_{19}O_2)_{3(ad)} \quad (A)$$

and there is no lateral interactions between the chemisorbed precursor molecules, the rate of adsorption $r_a$ can be written as:

$$r_a = A \cdot e^{\frac{E_a}{kT}} \cdot (1-\theta) \cdot F \quad (1)$$

where A is the pre-exponential factor, $E_a$ is the activation energy for adsorption, k is the Boltzmann constant, and F is the flux of the incident precursors. Similarly, the rate of desorption $r_d$ can be expressed as:

$$r_d = v_d e^{\frac{E_d}{kT}} \cdot \theta \quad (2)$$

where $v_d$ and $E_d$ are the pre-exponential factor and the activation energy for desorption, respectively. Using the initial condition of $\theta\,(t=0)=0$, the surface site balance yields a time-dependent Langmuir-Hinshelwood isotherm:

$$\theta = \frac{k_d}{k_a + k_d} \cdot [1 - e^{-(k_a + k_d)t}] \quad (3)$$

where $$k_a = A \cdot e^{-\frac{E_a}{kT}} \cdot F$$

and $$k_d = v_d e^{-\frac{E_d}{kT}}.$$

Fitting this equation to the experimental data, as shown by the solid smooth lines in FIG. 16a, good agreements were observed at both low and high coverages for all three temperatures. The natural logarithims of $k_a$ and $k_d$ are shown in an Arrhenius plot as a function of the inverse of temperature in FIG. 16b. The $k_a$ was found to decreased with increasing temperature, exhibiting a negative activation energy $E_a$ of 0.24±0.09 eV. The activation energy for desorption $E_d$ was determined to be 0.29+0.03 eV. Similar studies with Y(TMHD)$_3$ precursors yielded the corresponding activation energies of −0.14±0.05 eV and 0.16+0.03 eV for adsorption and desorption. Although Y(TMHD)$_3$ and Er(TMHD)3 are structurally similar, Although Y(TMHD)3 and Er(TMHD)3 are structurally similar, the adsorption routes are governed not only by the chelating metal-oxygen bond strength (Y—O: 2.85±0.1 eV and Er—O: 2.6±0.1 eV), but also by the strengths of the C=O and the center C—H bonds in each ligand. Therefore, direct comparison of the magnitudes of the observed activation energies can be difficult, and a thorough understanding of the individual reaction mechanisms is required for an accurate determination of the activation energies for each elementary reaction step.

Surface reaction kinetics of Er(TMHD)$_3$ precursors and O radicals. A typical QCM response at 533 K in one ALD cycle of alternating pulses of Er(TMHD)$_3$ precursor and O radicals is shown in FIG. 17a. To facilitate the discussion of our experimental results, some terminologies are defined and summarized here. In general, the ALD cycle is comprised of an Er(TMHD)$_3$ pulse with a time duration of $t_p$. During this time, the mass increase due to precursor adsorption, as measured by the QCM frequency change, is denoted as $\Delta m_a$. If the precursor pulse time is long enough to achieve the adsorption saturation, the maximum mass increase is denoted as $\Delta m_a^{max}$. The fractional adsorbed mass is defined as the ratio of the mass change during adsorption to $\Delta m_a^{max}$:

$$fm_a \equiv \frac{\Delta m_a}{\Delta m_a^{max}}.$$

Following the precursor pulse is an O radical pulse with the a time period of $t_o$. Exposing the surface to the O radicals results in an abrupt mass decrease, $\Delta m_d$, indicating the removal and desorption of the reaction by-products and/or precursors. If the O radical pulse time is long enough, the mass removal process also saturates and the QCM signal reaches a constant level with only very small fluctuations within the noise range (the shaded region in FIG. 17a). The shortest amount of time to reach this saturative state is defined as the critical oxygen radical exposure, $t_o^c$. Finally, the net mass deposited per cycle is: $\Delta m_{net} = \Delta m_a - \Delta m_d$. The net mass change ratio is defined as the ratio of the net mass deposited in one ALD cycle to $$\Delta m_a^{max}: fm_{net} \equiv \frac{\Delta m_{net}}{\Delta m_a^{max}}.$$

The effect of Er(TMHD)$_3$ pulse time. To investigate the effects of Er(TMHD)$_3$ pulse time on the required critical oxygen radical exposure, the Er(TMHD)$_3$ pulses were varied from 0-20 minutes at 533 K and the required $t_o^c$ to achieve no further mass decrease was determined from the inset shown in FIG. 17b. As precursor pulse time $t_p$ varied from 1 minute to 10 minutes (or beyond), the critical oxygen radical exposure $t_o^c$ increased from 1.2 minute to 2.2 minutes. This indicates that almost twice as many O radicals were needed to react with the chemisorbed precursors due to their prolonged exposure. In addition, the fractional adsorbed mass $$fm_a \equiv \frac{\Delta m_a}{\Delta m_a^{max}}$$

is also plotted as a function of $t_p$ on the right y-axis in FIG. 17b. Consistent with the dependence of $t_p$ on $t_o^c$, the fractional adsorbed mass, $fm_a$, increased as the precursor exposure time increased and consequently required longer critical oxygen exposure time. As the fractional adsorbed mass approached its saturation level of 1, $t_o^c$ reached a constant value of 2.2 minutes for this process, indicating that the required $t_o^c$ scaled with the fractional adsorbed mass.

Without wishing to be bound by theory, it is believed that, following the Langmuir-Hinshelwood adsorption, the O radicals react with the β-diketonate ligands leading to the formation of $Er_2O_3$ and carbon-containing species such as $C_xH_y$ and volatile by-products $C_xH_yO_z$ that can desorb readily from the surface:

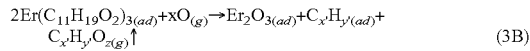
(3B)

Based on reactions (A) and (B), the adsorption of Er(TMHD)$_3$ during $t_p$ contributes to a maximum mass increase $\Delta m_a^{max}$ of 1434 amu. If all the carbon-containing reaction products desorbed after the oxygen exposure and left only pure $Er_2O_3$ on the surface, the net mass deposited, $\Delta m_{net}$, is 382 amu. This corresponds to a net mass change ratio $$fm_{net} \equiv \frac{\Delta m_a}{\Delta m_a^{max}}$$

of 0.27 for depositing pure $Er_2O_3$. At 533 K with $t_o > t_o^c$, the net mass change ratio $fm_{net}$ remained constant at 0.52, relatively independent of $t_p$ (FIG. 18a); i.e., approximately 52% of the adsorbed mass remained on the surface after the O radical pulse, irrespective of the precursor pulse time. This indicates an incomplete removal of the reaction by-products at 533 K and that some impurity incorporation leads to a higher net mass change ratio. To assess the effect of temperature on the impurity incorporation, net mass change ratio $fm_{net}$ was determined for temperatures from 473 to 603 K and the $t_p$=5 min and the $t_o$=2 min (>$t_o^c$). FIG. 18b shows that the net mass change ratio decreased with increasing temperatures and reached the value of 0.27 at 603 K for pure $Er_2O_3$ deposition. It is evident that a more complete removal of reaction by-products is achieved as the temperature increases and the deposition of pure $Er_2O_3$ is achieved at 603 K.

The effect of O radicals. Since O radicals play an important role in removing the organic ligands and contribute to the deposition of high purity $Er_2O_3$, the effect of O radical pulse time $t_o$ on the adsorption and desorption kinetics was investigated. An initial surface was prepared with alternating pulses of 7 minutes of Er(TMHD)$_3$ and 3 minutes of O radicals (>$t_o^c$~2.2 min). Note that the mass increase due a 7 minute-pulse of Er(TMHD)$_3$ is $\Delta m_a$, about 90% of $\Delta m_a^{max}$. FIG. 20 shows the subsequent QCM response with another 7 minute-pulse of Er(TMHD)$_3$ followed by a 1 minute pulse of O radicals (<$t_o^c$). With this 1 minute pulse of O radicals (about half of $t_o^c$), the net mass change ratio $fm_{net}$ is 0.62, much greater than 0.27, indicating an incomplete removal of the β-diketonate ligands. More interestingly, when another 7 minute-pulse of Er(TMHD)$_3$ pulse was introduced, the absorbed mass is only ~0.7 $\Delta m_a$. Keeping $t_o$ and $t_p$ constant at 1 and 7 minutes for the next two cycles, a decrease in the adsorbed masses was observed. When the surface was again pulsed with 3 minutes of O radicals, longer than $t_o^c$, the absorbed mass after a 7 minute-pulse of Er(TMHD)$_3$ increased back to $\Delta m_a$. These results indicate that O radicals not only remove the β-diketonate ligands but also create reactive sites for the subsequent adsorption of precursors.

To confirm that O radicals create reactive sites for the precursor adsorption, the above experiments were repeated with a fixed precursor exposure time of 7 minutes, but the O radical pulse times were varied to determine, in the next ALD cycle, the mass increase due to a 7 minute pulse of precursor and the required critical oxygen exposure. Starting with an initial surface prepared with alternating pulses of 7 minutes of Er(TMHD)$_3$ and 3 minutes of O radicals (>$t_o^c$~2.2 min), where the mass increase due a 7 minute-pulse of Er(TMHD)$_3$ is $\Delta m_a$ the O radical exposure time ($t_o$) was varied from 0.5 to 2 minutes. Following the various oxygen exposure time, another 7 minute-pulse of Er(TMHD)$_3$ was introduced. The corresponding mass increase due to the precursor exposure in this second cycle (denoted as $\Delta m_a'$) and the subsequent critical oxygen exposure ($t_o^{c'}$) was determined (FIG. 19a). It is clear from FIG. 19a that a short oxygen radical pulse (0.5 minute) led to less mass absorbed in the subsequent precursor pulse ($\Delta m_a'$~0.46 $\Delta m_a$) and required a much longer subsequent critical oxygen exposure (denoted as $t_o^{c'}$) to completely remove all the precursor ligands associated with both ALD cycles. To summarize the effect of $t_o$ ranging from 0.5 to 2 minutes, the ratio of $\Delta m_a'/\Delta m_a$ and $t_o^{c'}$ are plotted as a function of $t_o$, as shown in FIG. 19b. Consistent with the above discussion, a short oxygen radical pulse created less reactive sites thus led to smaller $\Delta m_a'$ in the next cycle. In addition, since the mass removal in the preceding cycle was incomplete, a longer $t_o^{c'}$ is required in the next cycle in order to completely remove all the precursor ligands associated with both ALD cycles. Finally, as the ratio the ratio of $\Delta m_a'/\Delta m_a$ approaches 1, the required $t_o^{c'}$ obtained from a linear regression equals 2.2 minutes, consistent with the $t_o^c$ value found in FIG. 17 where $t_p$ was varied.

The effect of deposition temperature. The effect of deposition temperature was assessed from 473 to 573 K with $t_p$ and $t_o$ varied from 0.5 to 20 min and 0.5 to 2 min, respectively. The reactions during the Er(TMHD)$_3$ precursor and O radical pulses proceeded in a self-limiting manner at all temperatures studied. For example, when the temperature was reduced from 533 K to 503 K, the required $t_o^c$ and the fractional absorbed mass (as a function of $fm_a$) as a function of $t_p$ behaves similarly to that observed in FIG. 17, and the saturation is achieved at ~1.6 minutes (<2.2 minutes observed at 533K). The smaller $t_o^c$ value at reduced temperatures is due to a decreased surface coverage θ with decreasing temperature (FIG. 16a). In addition, similar to that observed in FIG. 19, the adsorption during the subsequent precursor pulse also increased linearly with the preceding t., yielding a consistent $t_o^{c'}$ value of 1.7 minutes.

Radical-enhanced ALD of $Er_2O_3$. The cyclic ALD film growth of $Er_2O_3$ at 533 K, monitored in real-time by the QCM, is plotted in FIG. 21a for five deposition cycles, using alternating pulses of 5 minutes of Er(TMHD)$_3$ precursor and 2.5 minutes of O radical (>$t_o^c$). As shown in FIG. 17b, it is not necessary to obtain 1 $\Delta m_a^{max}$ in each precursor pulse, since this requires a significant elongation of the precursor pulse time (>10 minutes). With a 5 minute-pulse of Er(TMHD)$_3$, a mass increase during adsorption was ~0.83 $\Delta m_a^{max}$ and a net mass change $\Delta m_a^{net}$ remained approximately the same for all cycles. When the cumulative net mass change is plotted as a function of deposition cycles, as shown in FIG. 21b, it is clear that the deposition proceeded in a well-controlled linear fashion. Since the mass deposited can be converted into the film thickness if the film density is known, this result indicates that the film thickness can be precisely controlled by the number of deposition cycles.

Finally, an $Er_2O_3$ thin film deposited on Si substrate at 573 K, using 50 deposition cycles of 5 minute-pulses of Er(TMHD)$_3$ precursor and 2 minute-pulses of 0 radical (>$t_o^c$), was characterized by XPS. The estimated film thickness from XPS is 27 Å, yielding a deposition rate of ~0.5 Å/cycle. This sub-monolayer deposition rate per cycle is frequently observed with metal β-diketonate precursors and is contributed to the steric hindrances between the adsorbed precursor molecules. [M. Putkonen, T. Sajavaara, L.-S. Johansson, and L. Niinist6, Chem. Vapor Deposition 7, 44 (2001).; L. Niinistoj, J. Paiivdsaari, J. Niinist6, M. Putkonen, and M. Nieminen, Phys. Stat. Sol. (a) 201, 1443 (2004).] In this case, a saturative adsorption was achieved but did not yield a full monolayer coverage due to the size of the precursor molecules. XPS compositional analysis shows that the film is stoichiometric, confirmed by the erbium (30 at. %) to oxygen (44 at. %) atomic ratio. The carbon incorporation was determined to be about 26% after the subtraction of the ambient contamination. Note that hydrogen was excluded in these calculations, since XPS is incapable of detecting its presence. Based on the proposed mechanism described previously, the deposition of a stoichiometric $Er_2O_3$ film with approximately 26% carbon incorporation will contribute to a net mass deposited $\Delta m_{net}$ of about 516 amu (382 amu of $Er_2O_3$ and 134 amu of C). This corresponds to a net mass change ratio $fm_{net}$ of 0.36, fairly consistent with that obtained from the QCM measurements (FIG. 18b).

C. Conclusion

The quartz crystal microbalance was used to study the surface reaction kinetics of $Er(TMHD)_3$ and $Y(TMHD)_3$ with O radicals in radical-enhanced atomic layer deposition of $Er_2O_3$ and $Y_2O_3$. The Langmuir-Hinshelwood model was used to describe the adsorption of $Er(TMHD)_3$ and $Y(TMHD)_3$. From the Arrhenius temperature-dependent plot, the activation energies for adsorption and desorption were determined to be −0.24±0.09 eV and 0.29±0.03 eV for $Er(TMHD)_3$, and 0.14±0.05 eV and 0.16±0.03 eV for $Y(TMHD)_3$, respectively. The reactions of the adsorbed precursor with O radicals were found to be saturative. The required critical oxygen radical dose scaled with the fractional adsorbed mass, increasing initially and reaching a constant value as the adsorbed mass tends increased towards the saturation level. In addition to effectively removing the β-diketonate ligands, the O radicals were found to create reactive sites for precursor adsorption. Specifically, when the O radical pulse time was shorter than the critical oxygen radical dose, the removal of β-diketonate ligands by the O radicals was incomplete, and consequently, less reactive sites were created. This ultimately led to a decrease in adsorption during the subsequent precursor pulse. Finally, well-controlled deposition of $Er_2O_3$ was achieved by using alternating pulses of $Er(TMHD)_3$ and O radicals.

4. Controlled Erbium Incorporation and Photolumninescence of Er-Doped $Y_2O_3$

Materials doped with trivalent erbium ions have been extensively investigated for optical applications due to the $Er^{3+}$ intra-4-f optical emission at 1.54 µm, a standard telecommunication wavelength. [A. Polman and F. C. J. M van Veggel, J. Opt. Soc. Am. B 21, 871 (2004).] Specifically, Er-doped dielectric thin films have received considerable attention, since fabrication of miniature planar optical amplifiers and integration with other electronic and/or optical devices on a single chip can be realized. [F. Lu, A. Alam, M. Heuken, A. Rizzi, and Ch. Buchal, Thin Solid Films 425, 171 (2003).] Though $SiO_2$ has traditionally been used as the host material in fiber amplifiers (~20 meters long), it is an typically unsuitable host in small, compact amplifiers due to its low solubility for erbium ($<1\times10^{18}$ $cm^{-3}$). [D. J. Eaglesham, J. Michel, E. A. Fitzgerald, D.C. Jacobson, and J. M. Poate, Appl. Phys. Lett. 58, 2797 (1991).] One potential host candidate is yttrium oxide ($Y_2O_3$). Using $Y_2O_3$ as a waveguide core (n=1.7-1.9) and $SiO_2$ as a cladding material (n=1.45), the high refractive index contrast allows a large signal admittance angle and high signal confinement within the core, thus increasing the pumping and amplification efficiency. [G. Atanassov, R. Thielsch, and D. Popov, Thin Solid Films 223, 288 (1993).; T. H. Hoekstra, P. V. Lambeck, H. Albers, and Th. J. A. Popma, Electron. Lett. 29, 581 (1993).] In addition, the large difference in the refractive index allows for waveguide bending with tight curvature (radius <100 µm), thus enabling a compact geometry. [E. C. M. Pennings, G. H. Manhoudt, and M. K. Smit, Electron. Lett. 24, 998 (1988).] The wide bandgap of $Y_2O_3$ (~5.6 eV) also alleviates the thermal quenching of $Er^{3+}$ luminescence as the temperature rises from cryogenic to room temperature. [S. Zhang and R. Xiao, J. Appl. Phys. 83, 3842 (1998).] More importantly, the similarities in crystal structure and lattice constant between $Y_2O_3$ and $Er_2O_3$ allow a much higher concentration of $Er^{3+}$ ions to be incorporated in the $Y_2O_3$ host, compared to that in $SiO_2$ host.

In order to optimize the performance of an optical amplifier, it can be important to study the material properties as well as the method for synthesizing these materials. Ion implantation is a widely used technique for erbium incorporation. [A. Polman, Appl. Phys. Rev. 82, 1 (1997).] However, implantation defects can couple to the erbium ions, causing non-radiative decay and thereby lowering the erbium luminescence lifetime and pumping efficiency. Although high temperature annealing above 700° C. has been shown to significantly reduce defect concentration, the process also facilitates erbium segregation and precipitate formation, which deplete the concentration of optically active erbium ions and thus are detrimental to device performance. [D. J. Eaglesham, J. Michel, E. A. Fitzgerald, D.C. Jacobson, and J. M. Poate, Appl. Phys. Lett. 58, 2797 (1991).]Moreover, while incorporation of a high concentration of erbium is possible by ion implantation, the method does not allow for control of the spatial distribution of the ions. This can be an important distinction since detrimental processes such as cooperative upconversion and energy migration are significant at high erbium concentrations. [A. Polman, Appl. Phys. Rev. 82, 1 (1997).] Given the small area of a planar optical amplifier (~$mm^2$), it can be a challenge to incorporate high concentration of erbium ions to achieve reasonable values of optical gain.

Atomic layer deposition (ALD) is an advanced technique for depositing metal oxide thin films. [R. Puthenkovilakam and J. P. Chang, J. Appl. Phys. 96, 2701 (2004).; J. Päivasaari, M. Putkonen, and L. Niinistö, Thin Solid Films 472, 275 (2005).] In principle, ALD can be an ideal technique for synthesizing Er-doped materials. By choosing appropriate precursors, the deposition can be carried out at temperatures below 500° C. The self-limiting mechanism characteristic of ALD processes allows layer-by-layer doping of erbium. By repeating the ALD cycle, it is possible to incorporate a high concentration of erbium within a given film thickness. More importantly, by choosing an erbium precursor with bulky ligands, the steric hindrance effect of the ligands can be utilized to effectively increase the distance between the erbium ions, thus decrease the ion-ion interactions.

Er-doped $Y_2O_3$ thin films were deposited on p-type Si(100) substrates by a radical-enhanced ALD process, as previously reported elsewhere. [Riikka L. Puurunen, Chem. Vap. Deposition 9, 249 (2003).] In this study, Tris(2,2,6,6-tetramethyl-3,5-heptanedionato)yttrium (III), or $Y(TMHD)_3$, and Tris(2, 2,6,6-tetramethyl-3,5-heptanedionato)erbium (III), or $Er(TMHD)_3$, were chosen as the metal precursors and 0 radicals as the oxidizing agent. Incorporation of erbium was carried out by depositing $Y_2O_3$ and $Er_2O_3$ in an alternating fashion. Specifically, Er-doped $Y_2O_3$ films were synthesized by first depositing x cycles of $Y_2O_3$ alternating with y cycles of $Er_2O_3$ and the erbium doping level was controlled by varying the x:y ratio. X-ray photoelectron spectroscopy (XPS) with an Al Kα source at 1486.6 eV was performed ex-situ to determine the chemical composition of Er-doped $Y_2O_3$ films. The spectra were collected at a 90-degree take-off angle with an analyzer pass energy of 20 eV and a step size of 0.1 eV. To characterize the optical properties of erbium doped $Y_2O_3$ films, room-temperature photoluminescence (PL) measurements were conducted using an $Ar^+$ laser tuned to 488 mm as the pump source and a Princeton Instruments OMA V InGaAs liquid-nitrogen cooled CCD detector.

$Er(TMHD)_3$ is a fairly bulky precursor molecule with the center $Er^{3+}$ ion coordinated by three negatively-charged β-diketonate ligands, each of which is about 1 run in size. Because of the steric hindrance effect of the ligands, the distance between the erbium ions can be effectively increased and controlled, making this an appropriate erbium precursor for doping. Well-controlled deposition of pure $Y_2O_3$ and pure $Er_2O_3$ has been studied using $Y(TMHD)_3$ and $Er(TMHD)_3$, respectively, with O radicals. [Riikka L. Puurunen, Chem. Vap. Deposition 9, 249 (2003).] Specifically, O radicals were found to create reactive site for precursor adsorption and effectively remove the β-diketonate ligands, leading to the formation of pure metal oxides at low deposition temperatures ranging from 300-330° C.

For comparison, XPS analysis was first performed on pure $Y_2O_3$ and $Er_2O_3$ thin films deposited at 300° C. FIG. 22 shows the detailed XPS spectra for each sample. The corresponding surface composition was determined from the integrated photoemission intensities corrected with appropriate atomic sensitivity factors. Since XPS was performed ex-situ, ambient contamination of about 13 atomic percent (at. %) C and 15 at. % O was also observed. Shown in FIG. 23 is the at. % of Y and Er measured in each sample. For the pure $Y_2O_3$ film, the Y 3d photoemission line was observed as a spin-orbit split doublet, with the oxidized Y $3d_{5/2}$ and Y $3d_{3/2}$ peaks at 157.2 and 159.2 eV, respectively. From XPS compositional analysis, the film was stoichiometric and contained approximately 30 at. % Y. For the pure $Er_2O_3$ film, the Er 4d photoemission line peaks at a higher binding energy of 168 eV, corresponding to ~24 at. % Er.

Incorporation of erbium in $Y_2O_3$ film was carried out at 300° C. by depositing 10 cycles of $Y_2O_3$ alternating with 5 cycles of $Er_2O_3$. The XPS spectrum for this sample showed two distinct features of Y 3d and Er 4d at approximately the same binding energies observed in pure $Y_2O_3$ and $Er_2O_3$ films. From the surface compositional analysis, this sample contained about 9 at. % Er, while the amount of Y decreased from 30 at. % to 25 at. % (FIG. 23). To deposit an Er-doped $Y_2O_3$ film with a higher erbium concentration, deposition was carried out with one cycle of $Y_2O_3$ alternating with 5 cycles of $Er_2O_3$. A pronounced increase in the Er 4d peak intensity with the corresponding decrease in the Y 3d peak intensity was observed. Specifically, the amount of erbium was increased from 9 to 15 at. %, while that of yttrium was decreased from 25 to 18 at. %. These results indicate that incorporation of a high concentration of erbium can be achieved by radical-enhanced ALD and the erbium doping level can be effectively controlled by varying the ratio of $Y_2O_3$ to $Er_2O_3$ cycles during the deposition.

To determine if erbium incorporated in $Y_2O_3$ by radical-enhanced ALD is optically active, PL measurements were performed on a 320-Å Er-doped $Y_2O_3$ film containing 9 at. % Er. The sample was deposited at 350° C. by alternating 10 cycles of $Y_2O_3$ and 5 cycles of $Er_2O_3$. FIG. 24 shows the room-temperature PL spectra of the as-deposited sample. At a pump power of 2 W (~64 W/cm²), the characteristic transition of $Er^{3+}$ ions at 1.533 μm ($^4I_{13/2} \rightarrow {}^4I_{15/2}$) was clearly observed as the main peak, in addition to a broader shoulder with a maximum at around 1.56 μm. These two resolved features resulted from the Stark splitting of the erbium $^4I_{15/2}$ and $^4I_{13/2}$ electronic states in the $Y_2O_3$ host electric field. When the pump power was reduced to 200 mW, the sample still showed a measurable PL intensity at room temperature. This indicates that a sufficient fraction of excitable $Er^{3+}$ ions can still be excited at this lower pump power. Considering the low deposition temperature, these results can be significant since no annealing at high temperature was needed to activate the erbium ions. A high temperature annealing at above 700° C. is typically required to oxidize the implanted erbium into the optically active $Er^{3+}$ state. [A. Polman, Appl. Phys. Rev. 82, 1 (1997).] In this example, high temperature annealing is not necessary, because radical-enhanced ALD was able to retain the trivalent state of erbium from its precursor state. Thus, by choosing a precursor with the erbium metal having the correct valency, it is possible to incorporate high concentration of optically active $Er^{3+}$ at low temperatures by radical-enhanced ALD. Finally, it is exciting to observe room-temperature PL for such a thin sample, since much thicker films of at least a few tenths of a micron are usually required to obtain a room-temperature PL spectrum with measurable intensity.

From the pump power dependence of the measured PL intensity, the absorption cross section (σ at a pump wavelength of 488 nm for $Er^{3+}$ ions in $Y_2O_3$ was deduced. It should be noted that this σ is only an effective parameter, since it was determined indirectly from the measured PL intensity, which is influenced by the host material and method of preparation. Assuming the electronic state of Er-doped $Y_2O_3$ to be a three-level laser system, balancing the rates of excitation and de-excitation of the $^4I_{13/2}$ level yields the fraction of excited $Er^{3+}$ ions on this level [S. W. Roberts, G. J. Parker, and M. Hempstead, Optical Materials 6, 99 (1996).]:

$$\frac{N_2}{N} = \frac{I}{\frac{hc}{\tau \lambda_{pump} \sigma} + I}$$

where $N_2$ is the population of $Er^{3+}$ ions the $^4I_{13/2}$ level, N is the concentration of excitable $Er^{3+}$ ions, I is the pump intensity, h is the Planck's constant, c is the speed of light, τ is the average lifetime of $Er^{3+}$ ions on the $^4I_{13/2}$ level, and $\lambda_{pump}$ is the wavelength of the pump laser. Taking the average lifetime τ for $Er^{3+}$ in $Y_2O_3$ to be 6 ms, [8] σ was estimated to be on the order of $10^{-18}$ cm², about three orders of magnitude larger than those reported in literature for direct optical transition of $Er^{3+}$ in a stoichiometric $SiO_2$ host (~$10^{-21}$ cm²). [L. Pavesi, J. Phys.: Condens. Matter 15, R1169 (2003).] This large cross section indicates that population inversion of $Er^{3+}$ in $Y_2O_3$ can be achieved at lower pump power, which implies higher pumping efficiency and gain values in comparison to the $SiO_2$ host. Finally, it is worth mentioning that other approaches are currently underway to enhance the effective absorption cross section of $Er^{3+}$ ions. One approach is to indirectly excite the $Er^{3+}$ ions. [P. G. Kik and A. Polman, J. Appl. Phys. 88, 1992 (2000).] The effective $Er^{3+}$ absorption cross section in the $SiO_2$ host can be enhanced by four orders of magnitude (~$10^{-17}$ cm² at $\lambda_{pump}$=488 nm) by incorporating Si nanocrystals, [A. J. Kenyon, C. E. Chryssou, C. W. Pitt, T. Shimizu-Iwayama, D. E. Hole, N. Sharma, and C. J. Humphreys, J. Appl. Phys. 91, 367 (2002).] in which case the indirect excitation of $Er^{3+}$ ions was accomplished by energy transferring from Si nanocrystals.

Erbium incorporation in $Y_2O_3$ film with high concentrations was demonstrated using radical-enhanced ALD. The erbium doping level was effectively controlled by varying the ratio of $Y_2O_3$ to $Er_2O_3$ deposition cycles. Specifically, erbium incorporation in $Y_2O_3$ with a concentration as high as 9 at. % was achieved by depositing 10 cycles of $Y_2O_3$ alternating with 5 cycles of $Er_2O_3$. Room-temperature photoluminescence (PL) measurements were performed on a 320-Å Er-doped $Y_2O_3$ film containing 9 at. % Er, deposited at 350° C. Without high temperature annealing, room-temperature PL at 1.53 μm was observed at a pump power of 200 mW. The effective absorption cross section of $Er^{3+}$ in $Y_2O_3$ was estimated to be ~$10^{-18}$ $cm^2$, about three orders of magnitude higher than those reported for $Er^{3+}$ in stoichiometric $SiO_2$. This indicates that population inversion of $Er^{3+}$ in $Y_2O_3$ can be achieved at a lower pump power, further validating $Y_2O_3$ as a suitable host for $Er^{3+}$. Finally, radical-enhanced ALD was demonstrated to be a viable technique for incorporating a high concentration of optically active erbium ions at low deposition temperatures.

It will be apparent to those skilled in the art that various modifications and variations can be made in the present invention without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method comprising the steps of:
   a. depositing a dopant precursor comprising $M^DL$ on a substrate via an atomic layer deposition technique; and
   b. exposing the deposited dopant precursor to reductive radicals, thereby providing a dopant metal by removing substantially all L and reducing substantially all $M^D$ to $M^D(0)$,
   wherein $M^D$ is a dopant metal ion, and
   wherein L comprises at least one anionic ligand with a total valence sufficient to render $M^DL$ neutral.

2. The method of claim 1, wherein $M^D$ is a divalent metal ion and L comprises two anionic ligands, $L^A$ and $L^B$, which can be the same or different.

3. The method of claim 2, wherein $M^DL^AL^B$ comprises the structure:

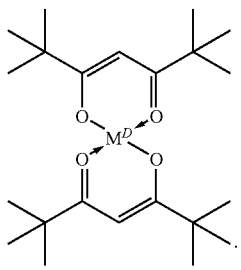

4. The method of claim 1, wherein $M^D$ is $Mg^{2+}$, $Mn^{2+}$, $Ca^{2+}$, $Cd^{2+}$, $Hg^{2+}$, $Ni^{2+}$, $Sr^{2+}$, or $Zn^{2+}$.

5. The method of claim 1, further comprising the steps of:
   c. depositing a compound comprising ML via an atomic layer deposition technique; and
   d. exposing the deposited compound to reductive radicals, thereby providing a host metal by removing substantially all L and reducing substantially all M to M(0),
   wherein M is a host metal ion, and
   wherein L comprises one or more anionic ligands with a total valence sufficient to render ML neutral.

6. The method of claim 5, wherein M is a divalent metal ion and L comprises two anionic ligands, $L^A$ and $L^B$, which can be the same or different.

7. The method of claim 6, wherein M is $Mg^{2+}$, $Mn^{2+}$, $Ca^{2+}$, $Cd^{2+}$, $Hg^{2+}$, $Ni^{2+}$, $Sr^{2+}$, $W^{2+}$, $Ti^{2+}$, $Ta^{2+}$, or $Zn^{2+}$.

8. The method of claim 6, wherein M is $Cu^{2+}$.

9. The method of claim 6, wherein $ML^AL^B$ comprises the structure:

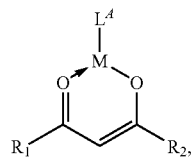

wherein $R_1$ and $R_2$ independently comprise alkyl moieties.

10. A method comprising the steps of:
    a. depositing a dopant precursor comprising the structure:

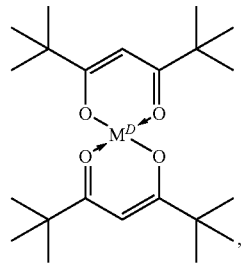

wherein $M^D$ is $Mg^{2+}$, $Ca^{2+}$, $Cd^{2+}$, or $Zn^{2+}$,
    on a substrate via an atomic layer deposition technique; and
    b. exposing the deposited dopant precursor to hydrogen radicals produced by plasma ionization and dissociation of hydrogen gas, thereby providing a dopant metal by removing substantially all ligands and reducing substantially all $M^D$ to $M^D(0)$;
    c. depositing a compound comprising CuL via an atomic layer deposition technique, wherein L comprises two anionic ligands, which can be the same or different; and
    d. exposing the deposited compound to hydrogen radicals produced by plasma ionization and dissociation of hydrogen gas, thereby providing copper metal by removing substantially all L and reducing substantially all Cu to Cu(0).

11. The method of claim 10, wherein CuL comprises the structure:

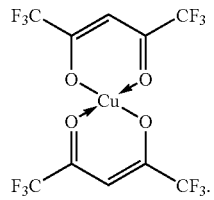

12. A method comprising the steps of:
    a. depositing a compound comprising ML onto a substrate via an atomic layer deposition technique, wherein L comprises at least one anionic ligand;

b. exposing the deposited compound to reductive radicals, thereby providing reduced metal by removing substantially all L and reducing substantially all M to M(0); and c. electrodepositing M(0) onto the deposited reduced metal.

13. The method of claim 12, wherein M is copper.

14. A method comprising the steps of:
a. depositing a dopant precursor comprising $M^DL$ on a substrate via an atomic layer deposition technique; and
b. exposing the deposited dopant precursor to oxidative radicals, thereby providing a dopant metal oxide by removing substantially all L and producing an oxide of $M^D$, wherein MD is a dopant metal ion, and
wherein L comprises at least one anionic ligand with a total valence sufficient to render $M^DL$ neutral.

15. The method of claim 14, wherein $M^D$ is a trivalent metal and L comprises three anionic ligands, $L^A$, $L^B$, and $L^C$, which can be the same or different.

16. The method of claim 15, wherein $M^D$ is $Er^{3+}$, $Pr^{3+}$, $Sm^{3+}$, $Eu^{3+}$, $Tb^{3+}$, or $Dy^{3+}$.

17. The method of claim 15, wherein the oxide of $M^D$ is $Er_2O_3$.

18. The method of claim 15, wherein the dopant precursor comprises at least one of tris(2,2,6,6-tetramethyl-3,5-heptanedionato)erbium, erbium tris(acetylacetonate), or erbium tris(hexafluoroacetylacetonate) or a mixture thereof.

19. The method of claim 15, wherein $M^DL^AL^BL^C$ comprises the structure:

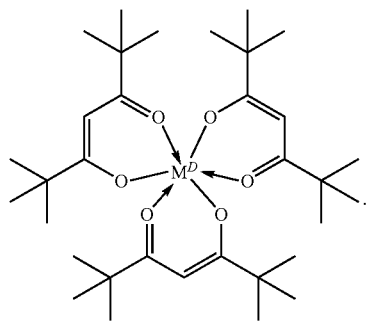

20. The method of claim 14, further comprising the steps of:
c. depositing a compound comprising ML via an atomic layer deposition technique; and
d. exposing the deposited compound to oxidative radicals, thereby providing a host metal oxide by removing substantially all L and producing an oxide of M, wherein L comprises at least one anionic organic ligand with a total valence sufficient to render ML neutral.

21. The method of claim 20, wherein M is a trivalent metal and L comprises three anionic ligands, $L^A$, $L^B$, and $L^C$, which can be the same or different.

22. The method of claim 20, wherein M comprises at least one of Y, Si, or Al.

23. The method of claim 20, wherein the oxide of M is at least one of $Y_2O_3$, $Al_2O_3$, or $SiO_2$.

24. A method comprising the steps of:
a. depositing a dopant precursor comprising the structure:

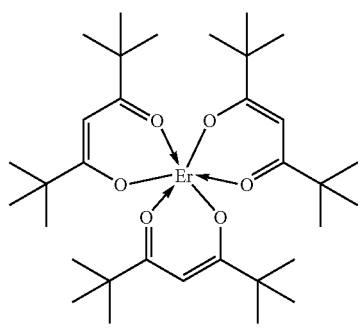

on a substrate via an atomic layer deposition technique; and b. exposing the deposited dopant precursor to oxygen radicals or $NH_3$ radicals produced by plasma ionization and dissociation of oxygen gas or ammonia gas, thereby providing a dopant metal oxide by removing substantially all ligand from the Er and producing $Er_2O_3$;

c. depositing a compound comprising the structure $YL^AL^BL^C$ via an atomic layer deposition technique, wherein $L^A$, $L^B$, and $L^C$ independently comprise anionic ligands with a total valence sufficient to render the compound neutral; and d. exposing the deposited compound to oxygen or $NH_3$ radicals produced by plasma ionization and dissociation of oxygen or ammonia gas, thereby providing a host metal oxide by removing substantially all ligand from the Y and producing $Y_2O_3$.

25. The method of claim 24, wherein $YL^AL^BL^C$ comprises the structure:

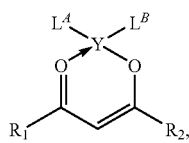

wherein $R_1$ and $R_2$ independently comprise alkyl moieties.

* * * * *

UNITED STATES PATENT AND TRADEMARK OFFICE
CERTIFICATE OF CORRECTION

PATENT NO. : 7,544,398 B1
APPLICATION NO. : 11/411425
DATED : June 9, 2009
INVENTOR(S) : Chang et al.

It is certified that error appears in the above-identified patent and that said Letters Patent is hereby corrected as shown below:

Title page, Item (75) Inventors, please change "Karl Lesser, San Jose, CA (US)"

to read

--Karl Leeser, San Jose, CA (US)--.

Signed and Sealed this

Third Day of August, 2010

David J. Kappos
*Director of the United States Patent and Trademark Office*